(12) United States Patent
Yamazaki et al.

(10) Patent No.: US 7,816,721 B2
(45) Date of Patent: Oct. 19, 2010

(54) TRANSMISSION/RECEPTION SEMICONDUCTOR DEVICE WITH MEMORY ELEMENT AND ANTENNA ON SAME SIDE OF CONDUCTIVE ADHESIVE

(75) Inventors: Shunpei Yamazaki, Setagaya (JP); Hiroko Abe, Setagaya (JP); Yukie Nemoto, Isehara (JP); Ryoji Nomura, Yamato (JP); Mikio Yukawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 504 days.

(21) Appl. No.: 11/632,049

(22) PCT Filed: Nov. 9, 2005

(86) PCT No.: PCT/JP2005/002983

§ 371 (c)(1),
(2), (4) Date: Jan. 10, 2007

(87) PCT Pub. No.: WO2006/051996

PCT Pub. Date: May 18, 2006

(65) Prior Publication Data

US 2008/0042180 A1 Feb. 21, 2008

(30) Foreign Application Priority Data

Nov. 11, 2004 (JP) ............................. 2004-328295
Nov. 11, 2004 (JP) ............................. 2004-328298

(51) Int. Cl.
*H01L 21/3205* (2006.01)

(52) U.S. Cl. ..................... 257/306; 257/40; 257/72; 257/88; 257/679; 257/E51.003; 257/E27.084; 257/E21.294; 257/E33.053; 365/174; 365/187; 349/151; 349/153; 438/149; 438/153; 438/155; 438/210; 438/238; 438/623

(58) Field of Classification Search .................. 257/306, 257/40, 72, 88, 679, E51.003, E27.084, E33.053, 257/E21.294; 438/257, 149, 153, 155, 210, 438/238, 623; 365/174, 187; 349/151, 153
See application file for complete search history.

(56) References Cited

U.S. PATENT DOCUMENTS 5,296,716 A * 3/1994 Ovshinsky et al. ............. 257/3

(Continued)

FOREIGN PATENT DOCUMENTS

EP 1 437 683 7/2004

(Continued)

OTHER PUBLICATIONS

De Leeuw, Dagobert M.; Hart, Cornelius M.; Gelinck, Gerwin H.; WIPO 01/73845 A1; Integrated Circuit with Programmable memory element; Oct. 1, 2001; whole document.*

(Continued)

*Primary Examiner*—Fernando L Toledo
*Assistant Examiner*—John P Dulka
(74) *Attorney, Agent, or Firm*—Eric J. Robinson; Robinson Intellectual Property Law Office, P.C.

(57) ABSTRACT

The invention provides a semiconductor device which is non-volatile, easily manufactured, and can be additionally written. A semiconductor device of the invention includes a plurality of transistors, a conductive layer which functions as a source wiring or a drain wiring of the transistors, and a memory element which overlaps one of the plurality of transistors, and a conductive layer which functions as an antenna. The memory element includes a first conductive layer, an organic compound layer and a phase change layer, and a second conductive layer stacked in this order. The conductive layer which functions as an antenna and a conductive layer which functions as a source wiring or a drain wiring of the plurality of transistors are provided on the same layer.

16 Claims, 37 Drawing Sheets

U.S. PATENT DOCUMENTS

| | | | |
|---|---|---|---|
| 5,536,947 A * | 7/1996 | Klersy et al. | 257/3 |
| 6,097,622 A * | 8/2000 | Shimizu et al. | 365/145 |
| 6,818,920 B2 | 11/2004 | De Leeuw et al. | |
| 7,202,495 B2 | 4/2007 | Unno | |
| 7,499,305 B2 | 3/2009 | Nomura et al. | |
| 2002/0094639 A1* | 7/2002 | Reddy | 438/257 |
| 2003/0156449 A1* | 8/2003 | Ooishi | 365/171 |
| 2004/0129450 A1 | 7/2004 | Yamazaki et al. | |
| 2004/0164302 A1* | 8/2004 | Arai et al. | 257/72 |
| 2004/0217387 A1 | 11/2004 | Takizawa | |
| 2005/0247928 A1 | 11/2005 | Unno | |
| 2007/0153565 A1 | 7/2007 | Nomura et al. | |
| 2009/0121874 A1 | 5/2009 | Nomura et al. | |

FOREIGN PATENT DOCUMENTS

| | | | |
|---|---|---|---|
| EP | 1 453 088 | | 9/2004 |
| JP | 2003-163331 A | | 6/2003 |
| JP | 2003/229538 | | 8/2003 |
| JP | 2003229538 A | * | 8/2003 |
| WO | WO 01/73845 | | 10/2001 |
| WO | WO 0173845 A1 | * | 10/2001 |
| WO | WO2004/001855 A | | 12/2003 |
| WO | WO 2004001855 A1 | * | 12/2003 |
| WO | WO-2006/043573 A | | 4/2006 |

OTHER PUBLICATIONS

International Search Report (Application. No. PCT/JP2005/020983) dated Feb. 28, 2006.

Written Opinion (Application No. PCT/JP2005/020983) dated Feb. 28, 2006.

Bez.R et al., "Non-Volatile Memory Technologies: Emerging Concepts and New Materials,", Materials Science in Semiconductor Processing, 2004, vol. 7, No. 4-6, pp. 349-355, Elsevier science direct.

Hwang.Y et al., "Writing Current Reduction for High-Density Phase-Change RAM,", IEDM 2003: Technical Digest of International Electron Devices Meeting, 2003, pp. 893-896.

"Differentiation Features of RFID Systems, 2.1 Fundamental Differentiation Features", RFID Handbook, 2003, pp. 11-28, John Wiley & Sons.

"Search Report (Application No. 05806734.9) Dated May 13, 2009,".

* cited by examiner

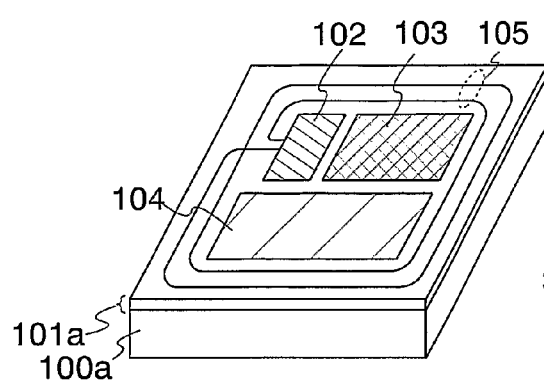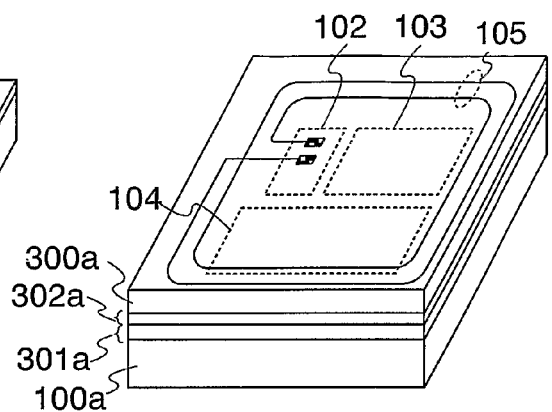
FIG. 7A   FIG. 7B
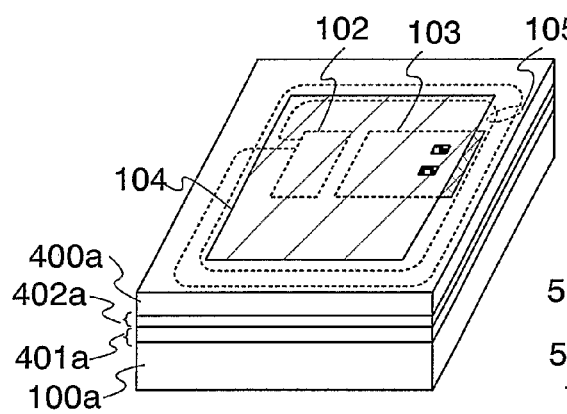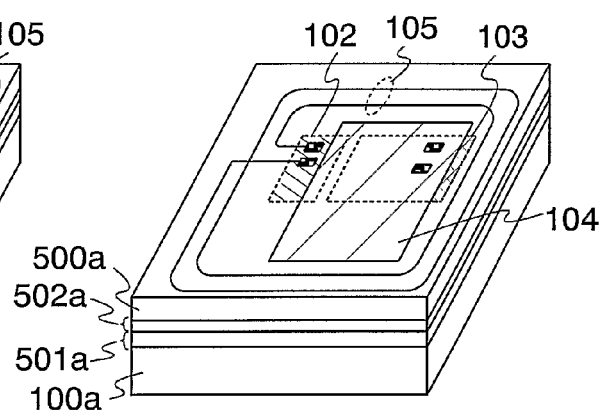
FIG. 7C   FIG. 7D
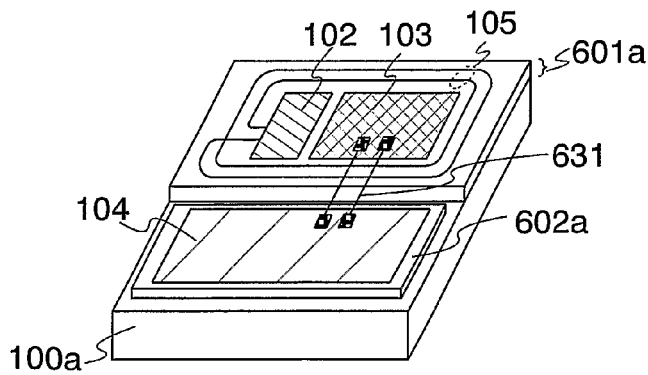
FIG. 7E

TRANSMISSION/RECEPTION SEMICONDUCTOR DEVICE WITH MEMORY ELEMENT AND ANTENNA ON SAME SIDE OF CONDUCTIVE ADHESIVE

TECHNICAL FIELD

The invention relates to a semiconductor device capable of data transmission/reception and a manufacturing method thereof.

BACKGROUND ART

In recent years, a semiconductor device having various functions and a plurality of circuits over an insulating surface has been developed. Further, development of a semiconductor device capable of wireless data transmission/reception by a provided antenna has been advanced. Such a semiconductor device, which is referred to as a wireless chip (referred to as ID tag, IC tag, IC chip, RF (Radio Frequency) tag, wireless tag, and electronic tag, and RFID (Radio Frequency Identification)), is already introduced to a part of the market.

DISCLOSURE OF INVENTION

By providing a memory circuit (also simply referred to as a memory) which stores data as various circuits integrated over a substrate, a semiconductor device having higher function and added value can be provided. As a memory circuit, a DRAM (Dynamic Random Access Memory), an SRAM (Static Random Access Memory), an FeRAM (Ferroelectric Random Access Memory), a mask ROM (Mask Read Only Memory), an EPROM (Electrically Programmable Read Only Memory), an EEPROM (Electrically Erasable and Programmable Read Only Memory), a flash memory and the like can be used. Among them, a DRAM and an SRAM as volatile memory circuits of which data is erased when the power is turned off require to be written data every time the power is turned on. An FeRAM is a nonvolatile memory circuit which uses a capacitor including a ferroelectric layer and requires a large number of manufacturing steps. A mask ROM has a simple structure, however, data is required to be written during the manufacturing steps, and thus data cannot be additionally written. An EPROM, an EEPROM, and a flash memory are non-volatile memory circuits using an element having two gate electrodes, thus the manufacturing steps are increased.

In view of the aforementioned, the invention provides a semiconductor device including a memory circuit which is non-volatile, easily manufactured, and can be additionally written, and a manufacturing method thereof.

According to the invention, a semiconductor device includes a transistor provided over an insulating layer, a conductive layer which functions as a source wiring or a drain wiring of the transistor, a memory element which overlaps the transistor, and a conductive layer which functions as an antenna. The memory element includes a first conductive layer, an organic compound layer or a phase change layer, and a second conductive layer stacked in this order. The conductive layer which functions as the antenna and the conductive layer which functions as the source wiring or the drain wiring of the plurality of transistors are provided on the same layer.

According to the invention, a semiconductor device includes a transistor provided over an insulating layer, a memory element which overlaps the transistor, and a conductive layer which functions as an antenna. The memory element includes a first conductive layer, an organic compound layer or a phase change layer, and a second conductive layer stacked in this order. The conductive layer which functions as the antenna and the first conductive layer are provided on the same layer.

According to the invention, a semiconductor device includes a transistor provided over an insulating layer, a memory element which overlaps the transistor, and a conductive layer which functions as an antenna. The memory element includes a first conductive layer, an organic compound layer or a phase change layer, and a second conductive layer stacked in this order. The conductive layer which functions as the antenna and the second conductive layer are provided on the same layer.

According to the invention, a semiconductor device includes a first element forming layer, a second element forming layer, and an adhesive layer which adheres the first element forming layer and the second element forming layer and contains conductive particles. The first element forming layer includes a transistor provided over an insulating layer, a conductive layer which functions as a source wiring or a drain wiring of the transistor, and a conductive layer which functions as an antenna provided over the transistor. The second element forming layer includes a memory element in which a first conductive layer, an organic compound layer or a phase change layer, and a second conductive layer are stacked. The first conductive layer or the second conductive layer and the conductive layer which functions as the source wiring or the drain wiring of the transistor are connected through at least one of the conductive particles.

According to the invention, a semiconductor device includes an element forming layer, a substrate provided with a conductive layer which functions as an antenna, and an adhesive layer which adheres the element forming layer and the substrate and contains conductive particles. The element forming layer includes first and second transistors provided over an insulating layer, a conductive layer which functions as a source wiring or a drain wiring of the first transistor, and a memory element which overlaps the second transistor and in which a first conductive layer, an organic compound layer or a phase change layer, and a second conductive layer are stacked. The conductive layer which functions as the antenna and the conductive layer which functions as the source wiring or the drain wiring of the first transistor are connected through at least one of the conductive particles.

According to the invention, a semiconductor device includes a first element forming layer, a second element forming layer, and an adhesive layer which adheres the first element forming layer and the second element forming layer and contains conductive particles. The first element forming layer includes first and second transistors provided over an insulating layer, a first conductive layer which functions as a source wiring or a drain wiring of the first transistor, a second conductive layer which functions as a source wiring or a drain wiring of the second transistor. The second element forming layer includes a memory element in which a first conductive layer, an organic compound layer or a phase change layer, and a second conductive layer are stacked, and a conductive layer which functions as an antenna. The conductive layer which functions as an antenna and the first conductive layer which functions as a source wiring or a drain wiring of the first transistor are connected through the conductive particles. The first conductive layer or the second conductive layer of the memory element and a second conductive layer which functions as a source wiring or a drain wiring of the second transistor are connected through at least one of the conductive particles.

According to the invention, a semiconductor device includes a transistor provided over a substrate, a conductive layer which functions as a source wiring or a drain wiring of the transistor, a first element forming layer including a conductive layer which functions as an antenna provided over the plurality of transistors, and a second element forming layer provided over the substrate or the first element forming layer with an adhesive layer interposed therebetween and which includes a memory element in which a first conductive layer, an organic compound layer or a phase change layer, and a second conductive layer are stacked. The first conductive layer or the second conductive layer of the memory element and the conductive layer which functions as the source wiring or the drain wiring of the transistor are connected through the conductive layer.

According to the invention, a semiconductor device includes an element forming layer, a substrate provided with a conductive layer which functions as an antenna, and an adhesive layer which adheres the element forming layer and the substrate and contains conductive particles. The element forming layer includes first and second transistors provided over an insulating layer, an interlayer insulating layer which covers the first and second transistors, a conductive layer which is connected to a source region or a drain region of the first transistor through an opening portion provided in the interlayer insulating layer and functions as a source wiring or a drain wiring of the first transistor which is exposed on a back surface of the element forming layer through the opening portion provided in the insulating layer and the interlayer insulating layer, the second transistor, and a memory element which overlaps the second transistor and in which a first conductive layer, an organic compound layer or a phase change layer, and a second conductive layer are stacked. The conductive layer which functions as the antenna and an exposed portion of the conductive layer which functions as the source wiring or the drain wiring of the first transistor are connected through the conductive particle of the adhesive layer.

According to the invention, a semiconductor device includes a first element forming layer, a second element forming layer, and an adhesive layer which adheres the first element forming layer and the second element forming layer and contains conductive particles. The first element forming layer includes a transistor provided over an insulating layer, an interlayer insulating layer which covers the transistor, a conductive layer which is connected to a source region or a drain region of the transistor through an opening portion provided in the interlayer insulating layer and functions as a source wiring or a drain wiring of the transistor which is exposed on a back surface of the first element forming layer through an opening portion provided in the insulating layer and the interlayer insulating layer, and a conductive layer which functions as an antenna. The second element forming layer includes a memory element in which a first conductive layer, an organic compound layer or a phase change layer, and a second conductive layer are stacked. The first or second conductive layer of the memory element and the exposed portion of the conductive layer which functions as the source wiring or the drain wiring of the transistor are electrically connected through at least one of the conductive particles of the adhesive layer.

According to the invention, a semiconductor device includes a first element forming layer, a second element forming layer, and an adhesive layer which adheres the first element forming layer and the second element forming layer and contains conductive particles. The first element forming layer includes first and second transistors provided over an insulating layer, an interlayer insulating layer which covers the first and second transistors, and first and second conductive layers each of which is connected to a source region or a drain region of the first and second transistors through an opening portion provided in the interlayer insulating layer and functions as a source wiring or a drain wiring of the first and second transistors, one of which is exposed on the back surface of the first element forming layer through an opening portion provided in the insulating layer and the interlayer insulating layer. The second element forming layer includes a conductive layer which functions as an antenna, and a memory element in which a first conductive layer, an organic compound layer or a phase change layer, and a second conductive layer are stacked. The first or second conductive layer of the memory element and an exposed portion of the first conductive layer which functions as the source wiring or the drain wiring of the first transistor are electrically connected through at least one the conductive particles of the adhesive layer. The conductive layer which functions as the antenna and an exposed portion of the second conductive layer which functions as a source wiring or a drain wiring of the second transistor are connected through at least one of the conductive particles of the adhesive layer.

According to the invention, a semiconductor device includes a first element forming layer, a second element forming layer, a first adhesive layer which adheres the first element forming layer and the second element forming layer and contains conductive particles, a substrate being provided with a conductive layer which functions as an antenna, and a second adhesive layer which adheres the second element forming layer and the substrate and contains conductive particles. The first element forming layer includes a memory element in which a first conductive layer, an organic compound layer or a phase change layer, and a second conductive layer are stacked. The second element forming layer includes first and second transistors provided over an insulating layer, an interlayer insulating layer which covers the first and second transistors, a first conductive layer which is connected to a source region or a drain region of the first transistor through an opening portion provided in the interlayer insulating layer and functions as a source wiring or a drain wiring of the first transistor, and a second conductive layer which is connected to a source region or a drain region of the second transistor through an opening portion provided in the interlayer insulating layer and functions as a source wiring or a drain wiring of a transistor which is exposed on the back surface of the second element forming layer through an opening portion provided in the insulating layer and the interlayer insulating layer. The first or second conductive layer of the memory element and the first conductive layer which functions as the source wiring or the drain wiring of the first transistor are electrically connected through at least one of the conductive particles of the first adhesive layer. The conductive layer which functions as the antenna and the exposed portion of the second conductive layer which functions as the source wiring or the drain wiring of the second transistor are connected through at least one of the conductive particles of the second adhesive layer.

In the semiconductor device of the invention with the aforementioned structure, the memory element is connected to a transistor. The transistor connected to the memory element is a MOS transistor, a thin film transistor, or an organic semiconductor transistor.

Further, the memory element overlaps a portion or all of the aforementioned transistors, the first transistor, or the second transistor.

Further, the insulating layer is a silicon oxide layer.

Further, in the case where the organic compound layer of the memory element is formed of a conjugated polymer material doped with a photoacid generator, an electron transportation material, or a hole transportation material, electric resistance of the memory element changes irreversibly by an optical effect or an electrical effect, thus a distance between electrodes of the memory element changes. The organic compound layer before changing the distance has a thickness of 5 to 60 nm, and more preferably 10 to 20 nm.

The phase change layer of the memory element is formed of a material which changes reversibly between a crystalline state and an amorphous state, a material which changes reversibly between a first crystalline state and a second crystalline state, or a material which changes only from the amorphous state to the crystalline state.

Further, the semiconductor device of the invention with the aforementioned structure includes one or a plurality selected from a power source circuit, a clock generating circuit, a data demodulation/modulation circuit, a control circuit, and an interface circuit.

A semiconductor device of the invention includes a memory element which overlaps a plurality of transistors. Accordingly, a compact and highly integrated semiconductor device can be provided.

A semiconductor device of the invention has a structure in which a substrate being provided with a memory element or a substrate being provided with a conductive layer which functions as an antenna is attached to an element forming layer having a plurality of transistors. Accordingly, a compact semiconductor device can be provided.

Further, the invention includes a memory element with a simple structure in which an organic compound layer or a phase change layer is sandwiched between a pair of conductive layers. Accordingly, an inexpensive semiconductor device which can be easily manufactured and a manufacturing method thereof can be provided. Further, as high integration can be easily realized, a semiconductor device having a large capacitance memory circuit and a manufacturing method thereof can be provided.

Further, in the case where a memory circuit of the semiconductor device of the invention includes a memory element in which an organic compound layer is sandwiched between a pair of conductive layers, data is written by an optical effect or an electrical effect. That is, the memory element is a nonvolatile memory element to which data can be additionally written. Accordingly, forgery by rewriting data can be prevented and new data can be additionally written. That is, a semiconductor device having a memory circuit which is non-rewritable can be provided.

In the case where a memory circuit of the semiconductor device of the invention includes a memory element in which a phase change layer is sandwiched between a pair of conductive layers, a battery for holding data is not required to be provided as the memory element is a nonvolatile memory element. Thus, a compact, thin, and lightweight semiconductor device can be provided. By using an irreversible material for the phase change layer, data cannot be rewritten. Therefore, a high-security semiconductor device of which forgery is prevented can be provided.

Therefore, a semiconductor device in which high function and high added value are realized and a manufacturing method thereof can be provided.

BRIEF DESCRIPTION OF DRAWINGS

FIGS. 7A to 7E are views each of which shows a semiconductor device of the invention.

BEST MODE FOR CARRYING OUT THE INVENTION

Figure 1A:
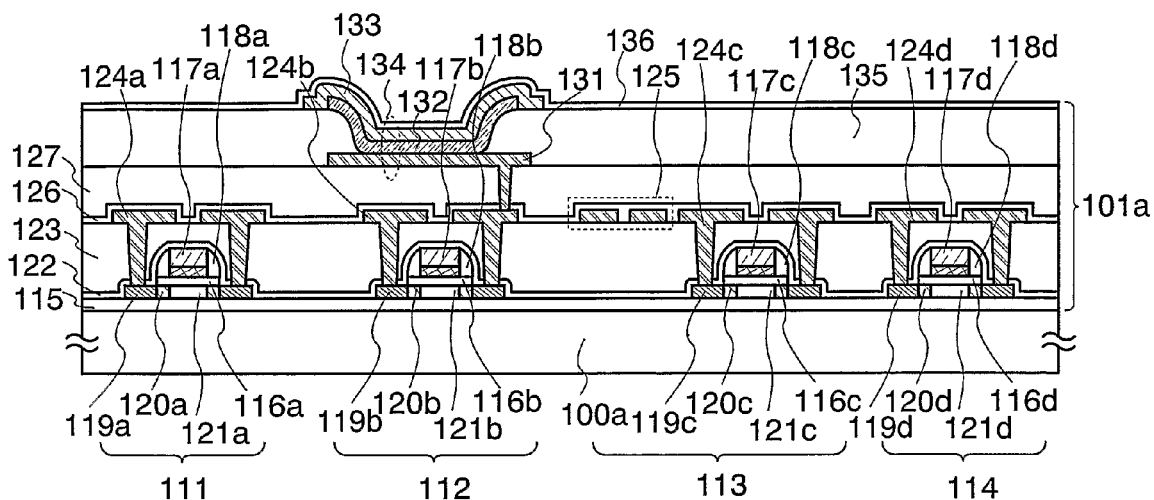
FIGS. 1A and 1B are views each of which shows a semiconductor device of the invention.

Although the invention will be fully described in following embodiment modes and embodiments with reference to the accompanying drawings, it is to be understood that various changes and modifications will be apparent to those skilled in the art. Therefore, unless otherwise such changes and modifications depart from the scope of the invention, they should be construed as being included therein. Note that identical portions in different drawings are denoted by the same reference numerals.

Embodiment Mode 1

Figure 15:
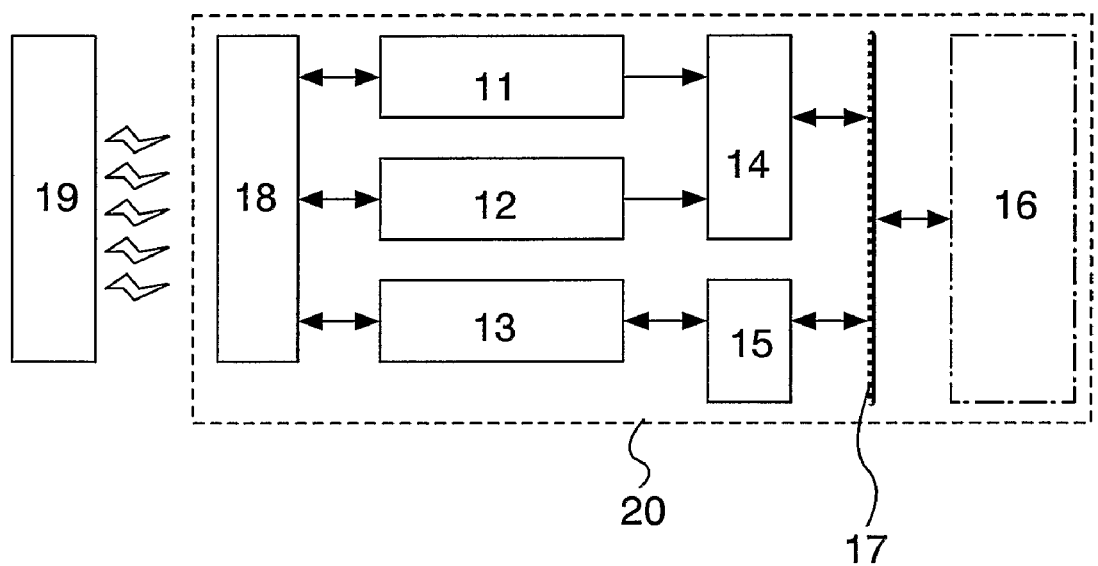
FIG. 15 is a diagram showing a semiconductor device of the invention.

Description is made with reference to FIGS. 1A and 1B, 2A-2C, and 7A, and 15 on structures of semiconductor devices of this embodiment mode. As shown in FIG. 15, a semiconductor device 20 of the invention has a function to communicate data without contact and includes a power source circuit 11, a clock generating circuit 12, a data demodulation/modulation circuit 13, a control circuit 14 which controls other circuits, an interface circuit 15, a memory circuit 16, a data bus 17, and an antenna (antenna coil) 18.

The power source circuit 11 generates various power sources to be supplied to each circuit of the semiconductor device 20 based on an AC signal input from the antenna 18. The clock generating circuit 12 generates various clock signals to be supplied to each circuit of the semiconductor device 20 based on an AC signal input from the antenna 18. The data demodulation/modulation circuit 13 has a function to demodulate/modulate data to communicate with a reader/writer 19. The control circuit 14 has a function to control the memory circuit 16. The antenna 18 has a function to transmit/receive an electromagnetic field or radio waves. The reader/writer 19 controls process of communication, control, and data of the semiconductor device. It is to be noted that the semiconductor device is not limited to have the aforementioned structure. For example, other elements such as a limiter circuit of a power source voltage and cryptograph processing hardware may be additionally provided.

The memory circuit 16 includes a memory element in which an organic compound layer or a phase change layer is sandwiched between a pair of conductive layers. It is to be noted that the memory circuit 16 may include only a memory element in which an organic compound layer or a phase change layer is sandwiched between a pair of conductive layers or a memory circuit with another structure. The memory circuit with another structure corresponds to one or a plurality selected from a DRAM, an SRAM, an FeRAM, a mask ROM, a PROM, an EPROM, an EEPROM, and a flash memory.

Description is made with reference to FIG. 7A on a perpendicular view of the semiconductor device 20 of this embodiment mode. The semiconductor device of this embodiment mode has a structure in which a plurality of circuits are integrated over a substrate as shown in FIG. 7A. Here, an element forming layer 101a including a plurality of transistors is formed over a substrate 100a. The element forming layer 101a including a plurality of transistors is formed of regions 102 and 103 each having a plurality of TFTs, a region 104 having a memory element, and a conductive layer 105 which functions as an antenna provided in the periphery of the regions 102 and 103 each having the plurality of TFTs and the region 104 having the memory element.

It is to be noted in the following embodiment mode that an element forming layer including a plurality of transistors is formed of the regions 102 and 103 each having a TFT and so on, however, an element forming layer including a plurality of transistors can be formed by using transistors formed over a single crystalline substrate such as a MOS transistor as well as a TFT. In this case, the substrate 100a is a semiconductor single crystalline substrate. Further, an SOI (Silicon On Insulator) substrate in which an insulating layer and a single crystalline semiconductor layer are stacked can be used. Furthermore, an element forming layer including a plurality of transistors can be formed by using an organic semiconductor transistor.

The regions 102 and 103 having the plurality of TFTs form various circuits. As a typical example of the region 102 including the plurality of TFTs, a communication circuit which processes radio waves received by the antenna, such as a power source circuit, a clock generating circuit, and a data demodulation/modulation circuit is provided. Further, as a typical example of the region 103 including the plurality of TFTs, a control circuit which controls other circuits such as an interface circuit is provided.

The conductive layer 105 which functions as the antenna is connected to the region 102 including the plurality of TFTs which form the communication circuit.

The region 104 including the memory element forms a memory circuit which stores data and includes a memory element and a circuit to operate the memory element and the like. The region 104 including the memory element is connected to the region 103 including the plurality of TFTs which form the control circuit, the interface circuit and the like.

Next, description is made with reference to FIG. 1A on a sectional structure of a semiconductor device with the structure shown in FIG. 7A. The element forming layer 101a including the plurality of transistors is formed over the substrate 100a. Here, a TFT 111 (a component of the region 104 including the memory element of FIG. 7A) which forms a circuit to operate a memory element, a switching TFT 112 (a component of the region 104 including the memory element of FIG. 7A) of the memory element, a TFT 113 (a component of the region 102 including a plurality of TFTs of FIG. 7A) which forms a circuit which processes a signal received by an antenna, such as a power source circuit, a clock generating circuit, and a data demodulation/modulation circuit, and a TFT 114 (a component of the region 103 including a plurality of TFTs of FIG. 7A) which forms a control circuit, an interface circuit and the like.

These TFTs can be formed by appropriately using a p-channel TFT and an n-channel TFT in combination. Here, a TFT which forms each circuit is an n-channel TFT.

The TFTs 111 to 114 are provided over the substrate 100a with an insulating layer 115 interposed therebetween. The TFTs are formed of semiconductor regions, gate insulating films 116a to 116d, gate electrodes 117a to 117d, and sidewalls 118a to 118d provided on sides of gate electrodes. Semiconductor layers are formed of source regions and drain regions 119a to 119d, low concentration impurity regions 120a to 120d, and channel forming regions 121a to 121d. Further, the low concentration impurity regions 120a to 120d are covered with the sidewalls 118a to 118d. An insulating layer 122 which covers the TFTs 111 to 114 is formed. The insulating layer 122 functions as a passivation film and blocks an external impurity, typically a contaminant substance such as an alkaline gold, thereby the TFTs 111 to 114 without contamination and of which reliability is improved can be provided. It is to be noted that a silicon nitride film, a silicon nitride oxide film, a silicon oxynitride film and the like can be used as the passivation film.

It is to be noted that each of semiconductor layers of the TFTs 111 to 114 may have as an active layer any of an amorphous semiconductor, a microcrystalline semiconductor, a polycrystalline semiconductor, an organic semiconductor and the like. It is preferable to use a semiconductor layer crystallized by using a metal element as a catalyst or a semiconductor layer crystallized by laser irradiation to obtain a transistor with favorable characteristics. Further, a semiconductor layer formed by using a $SiH_4/F_2$ gas, a $SiH_4/H_2$ gas (Ar gas) by a plasma CVD method or a semiconductor layer irradiated with laser may be used as the semiconductor layer.

Further, each of the TFTs 111 to 114 may be formed of a crystalline semiconductor layer (low temperature polysilicon layer) formed at a temperature of 200 to 600° C. (preferably 350 to 550° C.) or a crystalline semiconductor layer (high temperature polysilicon layer) formed at a temperature of 600° C. or higher. In the case of forming a high temperature polysilicon layer over a substrate, a quartz substrate may be used instead of a glass substrate which is sensitive to heat. Hydrogen or halogen elements may be added to each of the semiconductor layers (in particular, channel forming regions) of the TFTs 111 to 114 at a concentration of $1 \times 10^{19}$ to $1 \times 10^{22}$ atoms/cm$^3$ and preferably at a concentration of $1 \times 10^{19}$ to $5 \times 10^{20}$ atoms/cm$^3$. Accordingly, an active layer which has few defects and in which a crack does not easily occur can be obtained.

It is preferable that each of the TFTs 111 to 114 has a semiconductor layer with a thickness of 20 to 200 nm, preferably 40 to 170 nm, and more preferably 45 to 55 nm, and further preferably 50 nm. Accordingly, the element forming layer 101a in which a crack in the semiconductor layer does not easily occur even when bent can be provided.

Further, the crystals which form the semiconductor layer of each of the TFTs 111 to 114 are preferably formed so as to have crystal boundaries extending in parallel with a direction of carrier flow (a channel length direction). Further, each of the TFTs 111 to 114 preferably has characteristics with an S value (sub-threshold value) of 0.35 V/sec or lower (preferably 0.09 to 0.25 V/sec) and mobility of 10 cm$^2$/Vs or higher. Such a semiconductor layer can be formed of a semiconductor layer irradiated with continuous oscillation laser or pulsed laser with a frequency of 10 MHz or higher, and more preferably 60 to 100 MHz.

Elements which impart p-type or n-type conductivity are added to the low concentration impurity region, the source region and the drain region. Here, impurity elements which impart n-type conductivity can be added to the source regions and the drain regions 119a to 119d and the low concentration impurity regions 120a to 120d in a self-aligned manner by an ion implanting method or an ion doping method.

It is to be noted that the TFTs 111 to 114 have the low concentration impurity regions 120a to 120d and the sidewalls 118a to 118d here, however, the invention is not limited to this. The low concentration impurity region and the sidewall are not required to be provided if they are not necessary.

As the semiconductor layer, a known organic semiconductor material can be appropriately used. Typically, a π-conjugated high polymer material having a skeleton of a conjugated double bond is preferable. For example, a soluble high polymer material such as polythiophene, poly(3-alkylthiophene), polythiophene derivative, and pentacene can be used.

Besides, a semiconductor layer can be formed by processing a soluble precursor formed in advance. As an organic semiconductor material which can be obtained via a precursor, polythienylene vinylene, poly(2,5-thienylene vinylene), polyacetylene, polyacetylene derivative, polyallylene vinylene, or the like can be used.

When forming a precursor into an organic semiconductor, a reactive catalyst such as a hydrochloric gas is added in addition to heat treatment. As representative solvents for dissolving these soluble organic semiconductor materials, toluene, xylene, chlorobenzene, dichlorobenzene, anisole, chloroform, dichloromethane, γ butyl lactone, butyl cellsolve, cyclohexane, NMP (N-methyl-2-pyrolidone), cyclohexanone, 2-butanone, dioxane, dimethyl formamide (DMF), THF (tetrahydro furan), or the like can be used.

An insulating layer 123 is provided so as to cover the TFTs 111 to 114 and the insulating layer 122 which functions as a passivation film. The insulating layer 123 is provided to achieve a planarized surface. Conductive layers 124a to 124d which function as a source wiring or a drain wiring are in contact with source regions and drain regions 119a to 119d and fill contact holes formed in the insulating layers 122 and 123. Further, a conductive layer 125a which functions as an antenna is formed on the same layer as the conductive layers 124a to 124d which function as the source wiring or the drain wiring. The conductive layer 125 is connected to the conductive layer 124a which functions as the source wiring or the drain wiring of the TFT 113. Insulating layers 126 and 127 are provided so as to cover the conductive layers 124a to 124d and 125. These insulating layers 126 and 127 are provided to achieve a planarized surface and to protect the TFTs 111 to 114 and the conductive layers 124a to 124d and 125.

Among the TFTs 111 to 114, at least the TFTs 113 and 114 have characteristics of 1 MHz or higher, or more preferably 10 MHz or higher (at 3 to 5 V) when forming a ring oscillator with nine inverters. Alternatively, frequency characteristics per gate are preferably 100 kHz or higher, and more preferably 1 MHz or higher (at 3 to 5 V).

Although described later, data is written to a memory element 134 stacked over the TFTs 111 to 114 by an optical effect using laser light depending on the structure thereof. In that case, in order to protect the TFTs 111 to 114 from the damage caused by the laser light, the insulating layer 127 and an insulating layer 135 to be formed later are formed of an insulating material which has a light blocking property. An insulating material which has a light blocking property is, for example, a material obtained by adding a carbon particle, a metal particle, a dye, a pigment and the like to a known insulating material and agitating it, and then filtering it as required, a material obtained by adding a surfactant or dispersant so that a carbon particle and the like are evenly mixed, and the like. Such an insulating material may be formed by a spin coating method.

Further, the memory element 134 is provided over the insulating layer 127. The memory element overlaps a portion or all of the TFT 112. With the aforementioned structure, the memory element can be highly integrated in a semiconductor device with a small space.

A first conductive layer 131, an organic compound layer or a phase change layer 132, and a second conductive layer 133 are stacked over the insulating layer 127. This stack corresponds to the memory element 134. The insulating layer 135 is provided between the adjacent organic compound layers or the phase change layers 132. The first conductive layer 131 is connected to a conductive layer 124b which functions as the source wiring or the drain wiring of the TFT 112. An insulating layer 136 is provided over the second conductive layer 133. The TFT 112 functions as a switching TFT of the memory element.

Figure 1B:
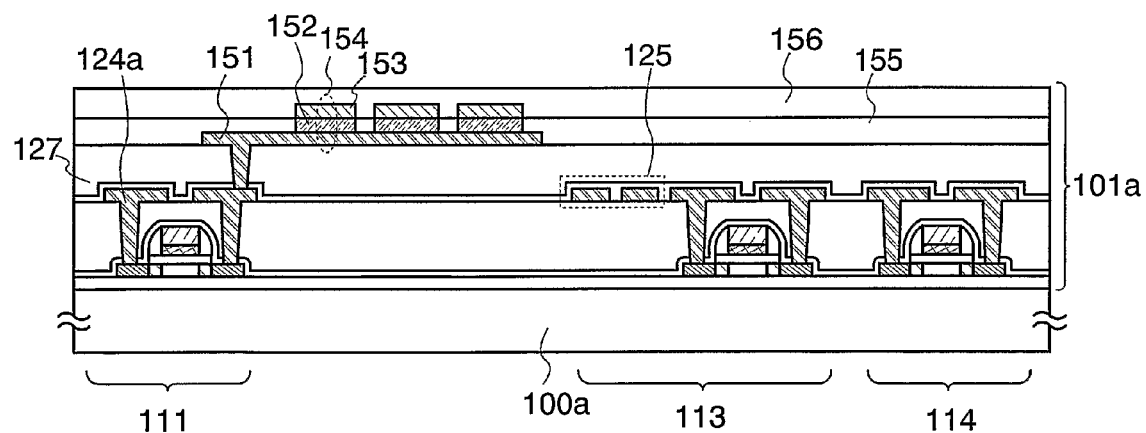

Next, description is made with reference to FIG. 1B on a sectional structure of a semiconductor device including a passive memory circuit instead of a semiconductor device including a memory circuit having a memory element provided with a switching TFT, that is an active matrix memory circuit. More specifically, description is made on a sectional structure of a semiconductor device having the memory element 134 with a different structure and a different TFT connected thereto as compared to the semiconductor device shown in FIG. 1A.

Over the insulating layer 127, a first conductive layer 151 is provided so as to be connected to a conductive layer 124a which functions as the source wiring or the drain wiring of the TFT 111, an organic compound layer or a phase change layer 152 is provided so as to be in contact with the first conductive layer 151, and a second conductive layer 153 is provided so as to be in contact with the organic compound layer or the phase change layer 152. A stack of the first conductive layer 151, the organic compound layer or the phase change layer 152, and the second conductive layer 153 corresponds to a memory element 154. An insulating layer 155 is provided between the adjacent organic compound layers or the phase change layers 152. An insulating layer 156 is provided over the memory element 154.

The first conductive layer 151 functions as a common electrode. A plurality of memory elements 154 are formed using the first conductive layer 151.

The memory element 154 shown in FIG. 1B is not connected to a switching TFT, thus directly connected to the TFT 111 which forms a circuit to operate the memory element.

Figure 2A:
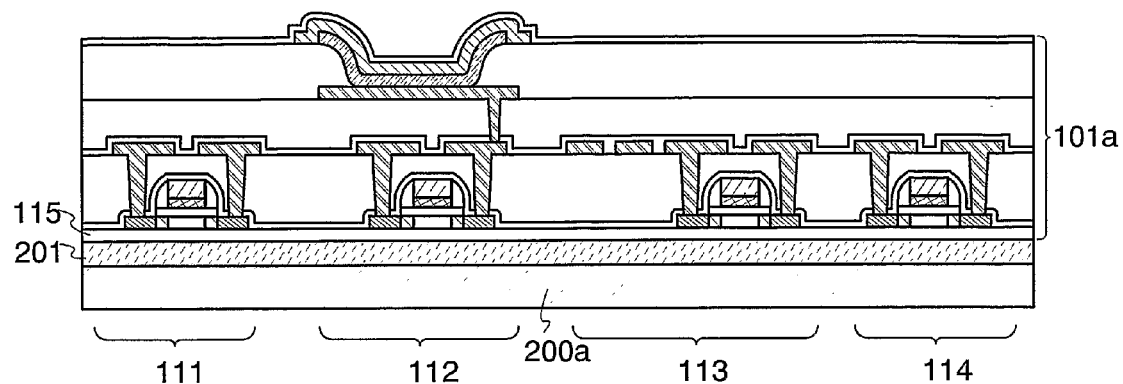
FIGS. 2A to 2C are views each of which shows a semiconductor device of the invention.

In FIGS. 1A and 1B, description is made on the sectional view of the semiconductor device in which the element forming layer 101a having the plurality of transistors over a substrate, however, the invention is not limited to this. For example, after providing a peeling layer over the substrate and forming the element forming layer 101a having the plurality of transistors over the peeling layer, the element forming layer 101a having the plurality of transistors may be peeled off the peeling layer and attached to a substrate 200a with an adhesive layer 201 interposed therebetween as shown in FIG. 2A. As a peeling method, (1) a method for peeling the element forming layer including the plurality of transistors by providing a metal oxide film between a substrate and the element forming layer including the plurality of transistors and weakening the metal oxide film by crystallization, (2) a method for peeling the element forming layer including the plurality of transistors by providing an amorphous silicon film containing hydrogen between the substrate and the element forming layer including the plurality of transistors and removing the amorphous silicon film by laser light irradiation or etching, (3) a method for mechanically removing the substrate over which the element forming layer including the plurality of transistors is formed or removing the substrate by etching using a solution or a gas such as $CF_3$, (4) a method for peeling the element forming layer physically at a weakened metal oxide film by providing a peeling layer and a metal oxide film between the substrate and the element forming layer including the plurality of transistors, weakening the metal oxide film by crystallization, and removing a portion of the peeling layer by etching using a solution or a gas such as $CF_3$, and the like can be employed.

It is preferable to use a flexible, thin, and light weight plastic substrate as the substrate 200a. In specific, a substrate formed of PET (polyethylene terephthalate), PEN (polyethylene naphthalate), PES (polyether sulfone), polypropylene, polypropylene sulfide, polycarbonate, polyether imide, polyphenylene sulfide, polyphenylene oxide, polysulfone, polyphtal amide, and the like can be used. Further, a laminate film (formed of polypropylene, polyester, vinyl, poly vinyl fluoride, polyvinyl chloride and the like), a paper formed of a fiber material, a stacked-layer film of a substrate film (polyester, polyamide, an inorganic vapor deposition film, papers, and the like) and an adhesive synthetic resin film (an acrylic synthetic resin, an epoxy synthetic resin and the like) and the like can be used as well.

A laminate film is laminated over a subject by thermocompression bonding. In performing laminate treatment, an adhesive layer provided on the uppermost surface of the laminate film or a layer provided as the outermost layer (not an adhesive layer) is melted by heat treatment and applied pressure so that it adheres. An adhesive layer may be provided over the surface of the substrate 200a, but not necessarily provided.

The adhesive layer 201 is a layer containing an adhesive such as a heat curable resin, an ultraviolet curable resin, an epoxy resin-based adhesive, and a resin additive.

As described above, by attaching the peeled element forming layer 101a including the plurality of transistors to a flexible, thin, and lightweight plastic substrate, a semiconductor device which is thin, lightweight, and not easily broken when dropped can be provided. Further, the flexibility enables the semiconductor device to be attached to a curved surface or an irregular shaped surface, leading to various applications. For example, a semiconductor device of the invention can be attached closely to a curved surface such as a medicine bottle. If the substrate is reused, cost for the semiconductor device can be reduced.

Figure 2B:
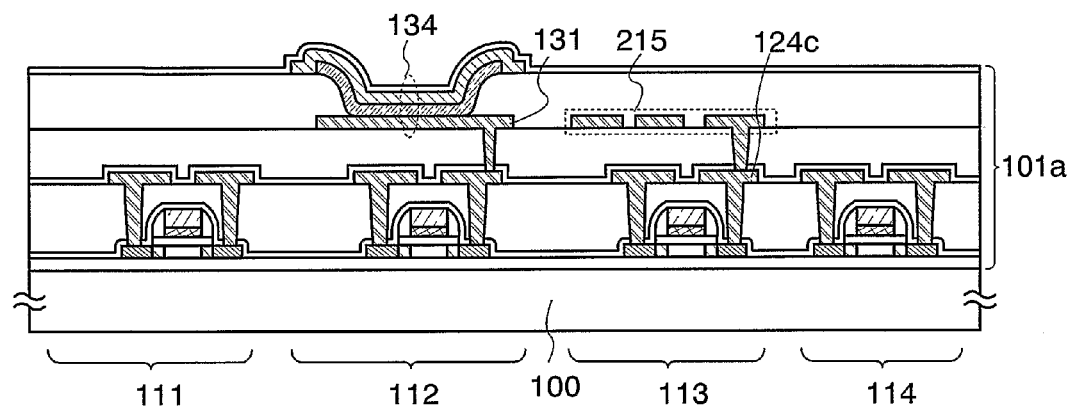

As shown in FIG. 2B, a conductive layer 215 which functions as an antenna may be formed using the same conductive layer as the first conductive layer 131 of the memory element 134. At this time, the conductive layer 215 which functions as an antenna is connected to the conductive layer 124c which functions as a source wiring or a drain wiring.

Figure 2C:
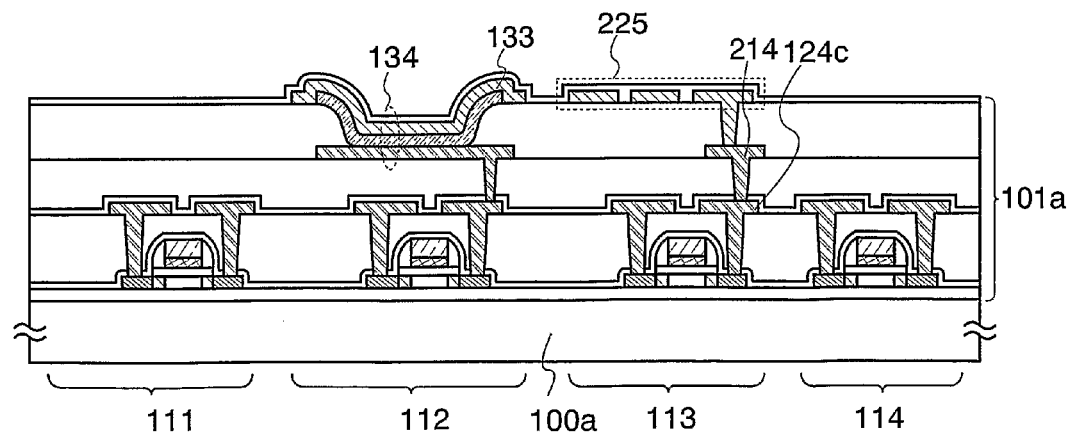

Further, as shown in FIG. 2C, a conductive layer 225 which functions as an antenna may be formed using the same conductive layer as the second conductive layer 133 of the memory element 134. At this time, the conductive layer 225 which functions as an antenna is connected to the conductive layer 124c which functions as a source wiring or a drain wiring through a conductive layer 214.

It is to be noted that the semiconductor devices shown in FIGS. 2A to 2C can be applied to a semiconductor device having a passive matrix memory circuit including memory elements each of which is not provided with a switching TFT as shown in FIG. 1B.

A semiconductor device of the invention has a structure in which a memory element is stacked over an element forming layer including a plurality of TFTs. Accordingly, a compact semiconductor device can be provided. Further, the conductive layer which functions as an antenna is formed at the same time as one of the source wiring or the drain wiring of the TFT and the conductive layer of the memory element, thereby the number of manufacturing steps can be reduced and throughput can be improved.

In the semiconductor device with the aforementioned structure, the memory element has a simple structure in which an organic compound layer or a phase change layer is sandwiched between a pair of conductive layers (a first conductive layer and a second conductive layer). Accordingly, an inexpensive semiconductor device which can easily be manufactured and a manufacturing method thereof can be provided. Further, as high integration can easily be realized, a semiconductor device having a large capacitance memory circuit and a manufacturing method thereof can be provided.

A memory circuit included in the semiconductor device of the invention is written data by an optical effect or an electrical effect. That is, the memory element is a nonvolatile memory element which can be additionally written data. Accordingly, forgery by rewriting data can be prevented and new data can be additionally written. That is, a semiconductor device in which high function and high added value are realized and a manufacturing method thereof can be provided.

Embodiment Mode 2

In this embodiment mode, description is made with reference to FIGS. 3A, 3B, 7B, and 37 on structures of semiconductor devices of the invention, which are different than in the aforementioned embodiment mode.

As shown in FIG. 7B, a semiconductor device of this embodiment mode has a structure in which an element forming layer 301a including a plurality of transistors formed over the first substrate 100a and an element forming layer 302a including the conductive layer 105 which functions as an antenna formed over a second substrate 300a are attached by an adhesive layer.

Here, the element forming layer 301a including the plurality of transistors is typically formed of the regions 102 and 103 each of which includes a plurality of TFTs and the region 104 including a memory element. Further, the conductive layer 105 which functions as an antenna formed in the element forming layer 302a is connected to the region 102 including a plurality of TFTs which form a communication circuit formed in the element forming layer 301a through conductive particles although not shown.

Figure 3A:
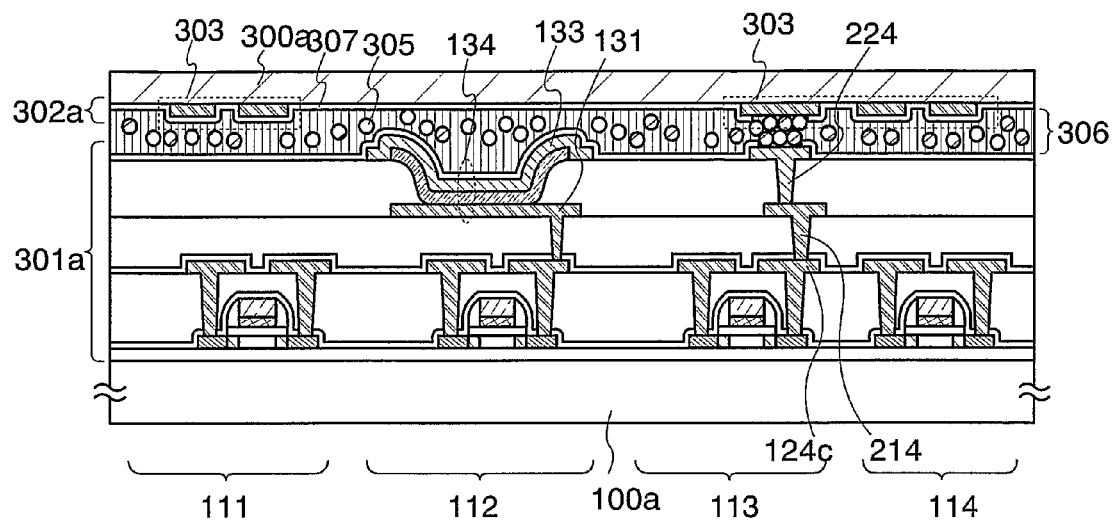
FIGS. 3A and 3B are views each of which shows a semiconductor device of the invention.
Figure 3B:
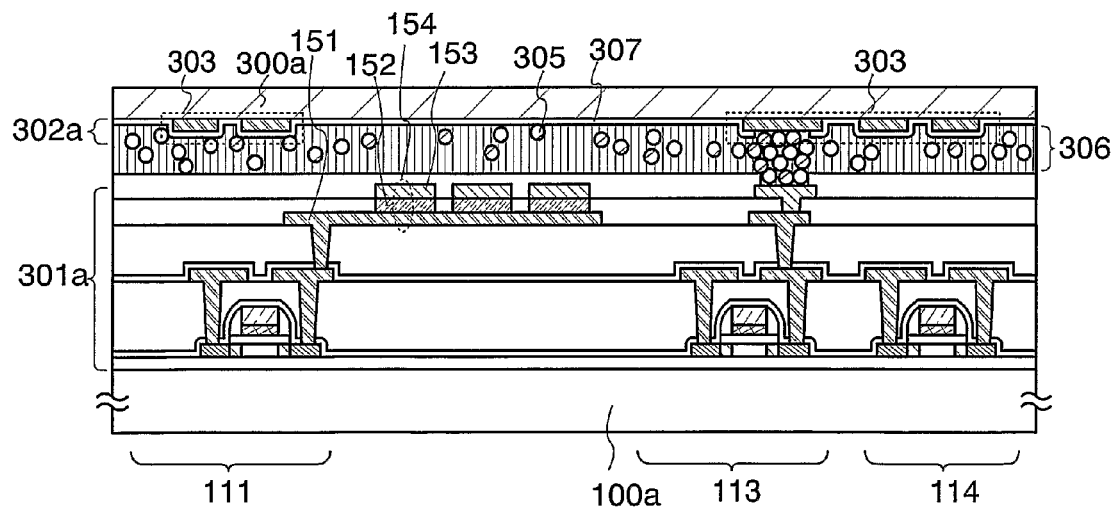

Description is made with reference to FIGS. 3A and 3B on sectional structures of semiconductor devices of the invention with the structure shown in FIG. 7B.

As shown in FIG. 3A, the semiconductor device of this embodiment mode has a structure in which the element forming layer 301a including a plurality of transistors and a memory element formed over the first substrate 100a and the element forming layer 302a including a conductive layer 303 which functions as an antenna formed over the second substrate 300a are attached by an adhesive layer 306.

The element forming layer 301a including the plurality of TFTs and the memory element includes the TFTs 111 to 114. The structures of these TFTs 111 to 114 are as described above, and the memory element 134 can be formed with the same structure as the memory element 134 shown in FIG. 1A. When the memory element overlaps a portion or all of the TFT 112, the memory element can be integrated in a semiconductor device with a small space at high density.

The element forming layer 301a including the plurality of TFTs 111 to 114 and the memory element 134 formed over the substrate 100a and the element forming layer 302a including the conductive layer 303 formed over the substrate 300a are attached by the adhesive layer 306 containing a conductive particle 305. Further, the conductive layer 124c which functions as the source wiring or the drain wiring of the TFT 113 is connected to a conductive layer 224 through the conductive layer 214. The conductive layer 224 functions as a connecting terminal. Further, the conductive layer 214 is formed at the same time as the first conductive layer 131 of the memory element 134. The conductive layer 224 is formed at the same time as the second conductive layer 133 of the memory element 134. Further, the conductive layer 224 which functions as a connecting terminal and the conductive layer 303 which functions as the antenna are electrically connected through the conductive particle 305.

The second substrate 300a provided with the conductive layer 303 which functions as the antenna may be a similar substrate to the substrate 200a. Further, an insulating layer 307 may be formed over the surface of the substrate 300a and the conductive layer 303. However, the conductive layer 303 is exposed in a region connected to the conductive layer 224 which functions as a connecting terminal of the TFT 113.

The adhesive layer 306 is a layer containing an adhesive such as a heat curable resin, an ultraviolet curable resin, an epoxy resin-based adhesive, and a resin additive, and dispersed with the conductive particle 305. Such an adhesive is called an anisotropic conductive adhesive. The conductive particle 305 is formed of one or a plurality of elements selected from gold, silver, copper, palladium, or platinum. A particle having a multi-layer structure of these elements may be employed as well. One or a plurality of the conductive particles 305 and the conductive layers 303 and 224 are connected in the case where the conductive particle 305 has a diameter of 1 to 100 nm, or preferably 5 to 50 nm. In this case, a distance between the conductive layer 303 and the conductive layer 224 is held by one or a plurality of the conductive particles 305.

Figure 37:
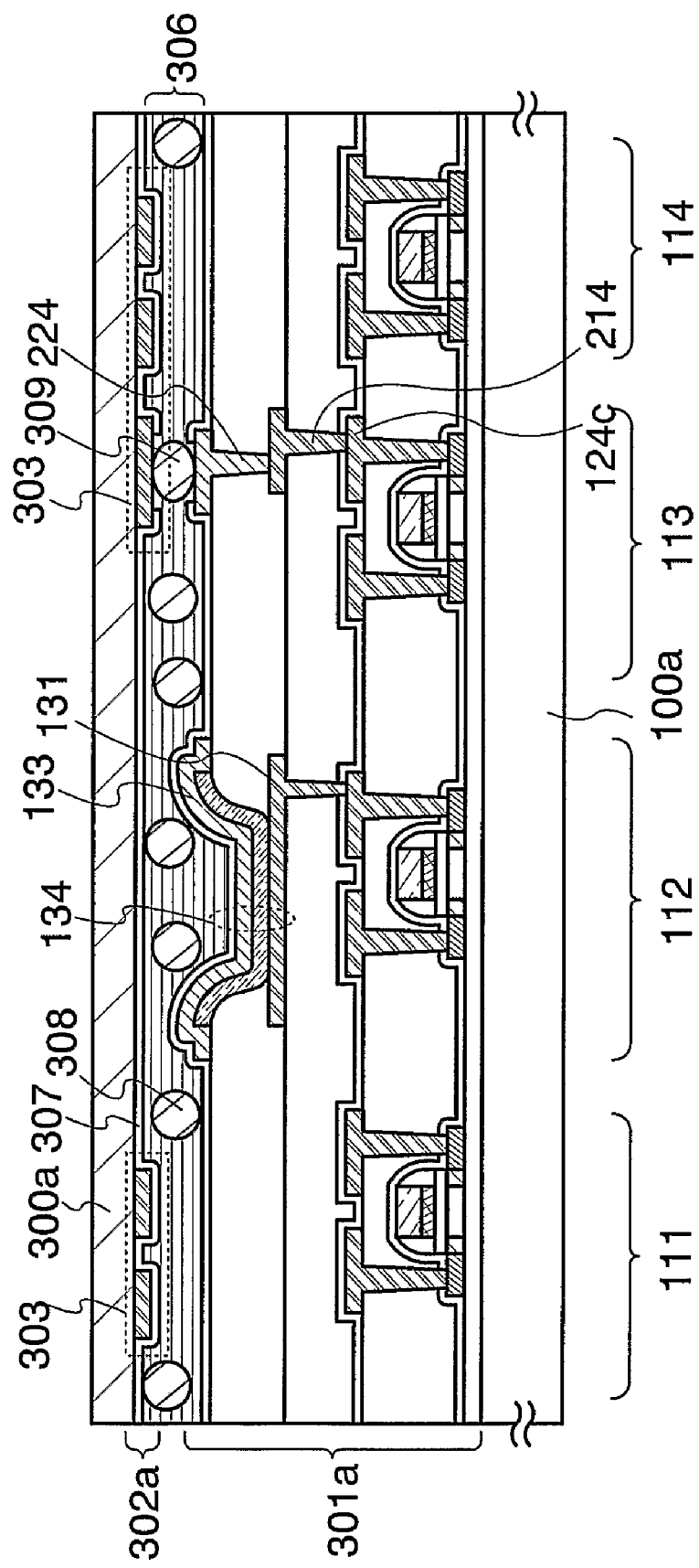
FIG. 37 is a view showing a semiconductor device of the invention.

Further, as shown in FIG. 37, the adhesive layer 306 containing a conductive particle 308 having a diameter of 0.5 to 10 μm or more preferably 1 to 5 μm may be used. In this case, the conductive layer 303 and the conductive layer 224 are connected through a conductive particle 309 having a perpendicularly squashed shape. At this time, a distance between the conductive layer 303 and the conductive layer 224 is held by the conductive particle 309.

Further, a conductive particle obtained by forming a thin film formed of one or a plurality of elements selected from gold, silver, copper, palladium, or platinum over the surface of the particle formed of a resin may be used as well. Furthermore, an anisotropic conductive film formed in a film shape and transferred to a base film may be used instead of the anisotropic conductive adhesive. The anisotropic conductive film is dispersed with conductive particles similarly to the anisotropic conductive adhesive.

Each of the memory element 134 shown in FIG. 3A has the switching TFT 112. That is, a semiconductor device including an active matrix memory circuit is provided. As shown in FIG. 3B, the memory element 154 formed of the first conductive layer 151, the organic compound layer or the phase change layer 152, and the second conductive layer 153 may be provided as well. With this structure, the memory element 154 is not connected to each of switching TFTs but directly connected to the TFT 111 similarly to FIG. 1B. A semiconductor device including a passive matrix memory circuit in which the first conductive layer 151 functions as a common electrode and a plurality of the memory elements 154 are formed using the first conductive layer 151 is provided.

Furthermore, in this embodiment mode as well, the element forming layer 301a including a plurality of transistors over the substrate 200a with the adhesive layer 201 interposed therebetween may be provided as shown in FIG. 2A.

A semiconductor device of the invention has a structure in which a layer including a memory element is stacked over an element forming layer including a plurality of TFTs. Accordingly, a compact semiconductor device can be provided. Further, a step of forming an element forming layer including a plurality of transistors and a memory element and a step of forming a conductive layer which functions as an antenna can be independently performed in parallel. Therefore, a semiconductor device can be manufactured efficiently in a short time. When an element forming layer including a plurality of transistors and an antenna are formed, a performance of each circuit is checked and sorted, thereby the element forming layer including the plurality of transistors and the antenna can be electrically connected to complete the semiconductor device. Therefore, a ratio that a defective is manufactured can be suppressed, leading to improve the yield.

Embodiment Mode 3

In this embodiment mode, description is made with reference to FIGS. 4A, 4B, and 7C, 8A, and 8B on a sectional structure of a semiconductor device of the invention with a different structure than in the aforementioned embodiment modes. More specifically, description is made on a sectional structure of a semiconductor device with a structure in which a substrate over which an element forming layer 402a including a memory element is formed instead of a conductive layer which functions as an antenna in FIGS. 3A and 3B is attached.

A semiconductor device of this embodiment mode has a structure in which an element forming layer 401a including a plurality of transistors formed over the first substrate 100a, and an element forming layer 402a including a memory element formed over the second substrate 400a are attached by an adhesive layer.

Here, the element forming layer 401a including a plurality of transistors typically includes the regions 102 and 103 each of which includes a plurality of TFTs and the conductive layer 105 which functions as an antenna. The element forming layer 402a including a memory element is formed of the region 104 including a memory element. The region 104 including a memory element is connected to the region 103 including a plurality of TFTs which form a control circuit, an interface and the like through conductive particles although not shown.

Figure 4A:
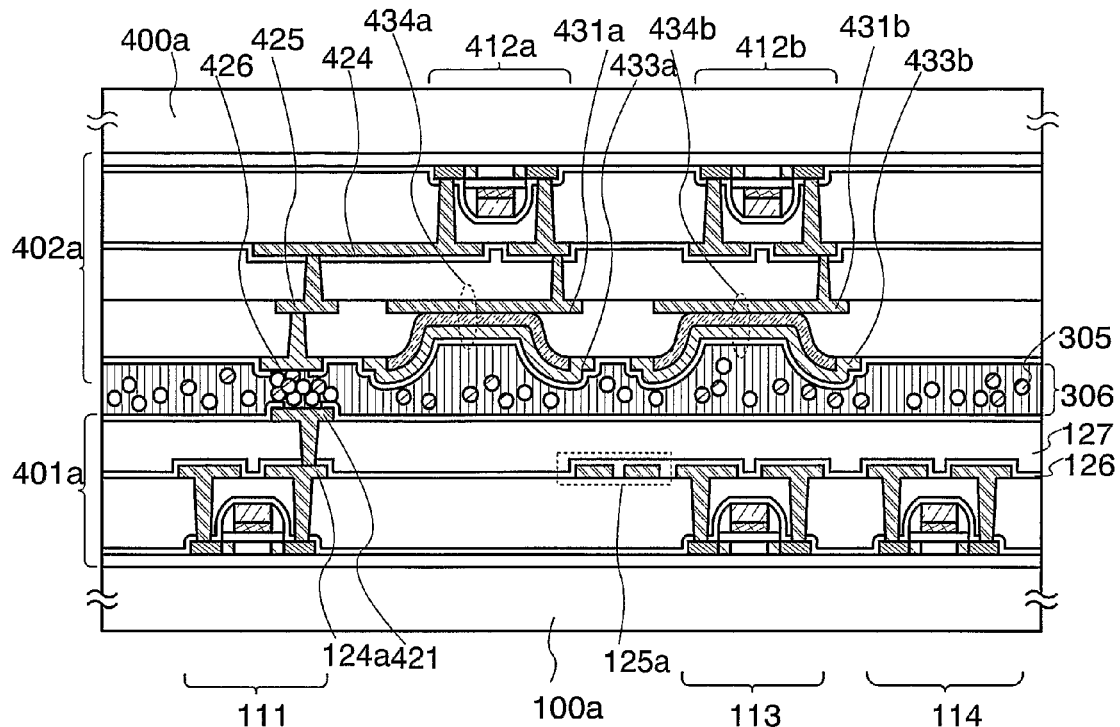
FIGS. 4A and 4B are views each of which shows a semiconductor device of the invention.
Figure 4B:
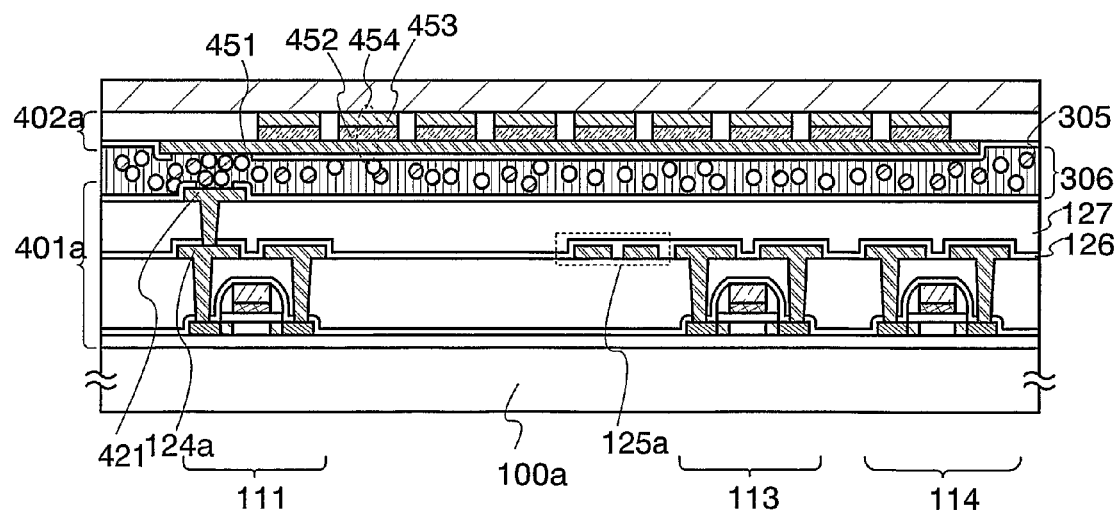

Description is made with reference to FIGS. 4A and 4B on a sectional structure of a semiconductor device of the invention with a structure shown in FIG. 7C.

As shown in FIG. 4A, the element forming layer 401a including a plurality of transistors and a conductive layer which functions as an antenna is formed over the substrate 100a. The element forming layer 401a including a plurality of transistors includes the TFTs 111, 113, and 114 of which structures are described above. The element forming layer 402a including a memory element is formed over the substrate 400a. In FIG. 4A, switching TFTs 412a and 412b are connected to the memory elements 434a and 434b respectively. That is, each of first conductive layers 431a and 431b of a memory element is connected to one of a source wiring or a drain wiring of the switching TFT 412a or 412b. Further, the other of the source wiring and drain wiring of the switching TFTs 412a or 412b is connected to a conductive layer formed at the same time as the first conductive layer or the second conductive layer of the memory element. Here, the other of a conductive layer 424 which functions as a source wiring or a drain wiring is connected to a conductive layer 426 through a conductive layer 425. It is to be noted that the conductive layer 425 is at the same time as the first conductive layers 431a and 431b of the memory element. The conductive layer 426 is at the same time as second conductive layers 433a and 433b of the memory elements.

The element forming layer 401a including a plurality of transistors and the element forming layer 402a including a memory element are adhered by the adhesive 306. The conductive layer 424 which functions as the source wiring or the drain wiring of the switching TFT 412a of the memory element and the conductive layer 124a which functions as the source wiring or the drain wiring of the TFT 111 which forms a circuit to operate the memory element are electrically connected through the conductive particle 305, the conductive layers 421, 425, and 426.

There is a case where data is written to the element forming layer 402a including a memory element by an optical effect using laser light. In such a case, it is required to layout the switching TFTs 412a, 412b, the memory elements 434a, and 434b so as not to overlap each other over the element forming layer 402a including a memory element.

The memory elements 434a and 434b shown in FIG. 4A are connected to the switching TFTs 412a and 412b respectively. That is, an active matrix semiconductor device is provided. As shown in FIG. 4B, a substrate being provided with a memory element 454 formed of a first conductive layer 451, an organic compound layer or a phase change layer 452, and a second conductive layer 453 may be attached alternatively. Each of the first conductive layer 451, the organic compound layer or the phase change layer 452, and the second conductive layer 453 may have a similar structure to that of the first conductive layer 151, the organic compound layer or the phase change layer 152, and the second conductive layer 153 described in Embodiment Mode 1 respectively. In this structure, the memory element 454 is not connected to a switching TFT, but directly connected to the TFT 111 which forms a circuit to operate the memory element similarly to FIG. 1B. A semiconductor device having a passive matrix memory circuit is provided in which the first conductive layer 151 functions as a common electrode using which a plurality of memory elements 154 are formed.

Figure 8A:
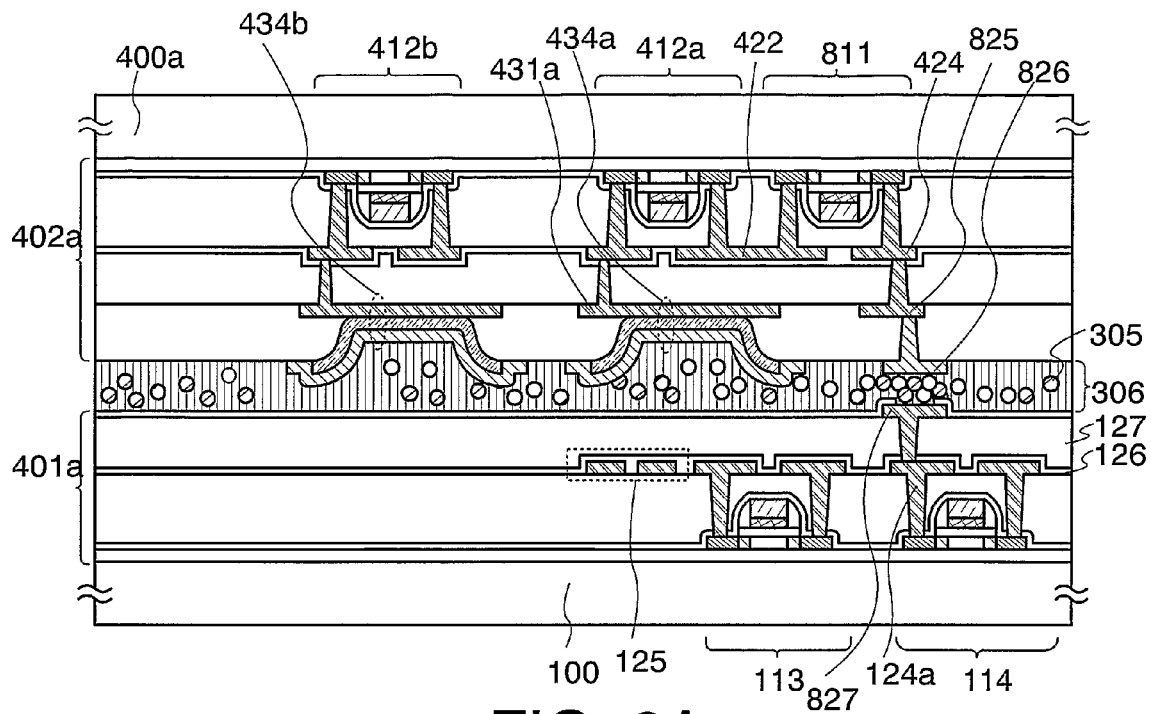
FIGS. 8A and 8B are views each of which shows a semiconductor device of the invention.

In the aforementioned embodiment mode, a circuit which operates a memory element is formed over the element forming layer 401a including a plurality of transistors, however, the invention is not limited to this. For example, a circuit which operates the memory element may be formed over the element forming layer 401a including the memory element. In specific, as shown in FIG. 8A, a TFT 811 which forms the circuit which operates the memory element is formed over the substrate 400a with memory elements 434a and 434b, and then the element forming layer 402a including a memory element, and the element forming layer 401a including a plurality of transistors may be attached thereto by the adhesive layer 306 including the conductive particle 305. At this time, one of the conductive layers 424 which functions as a source wiring or a drain wiring of the TFT 811 which forms a circuit to operate the memory element and one of a source wiring or a drain wiring 124a of the TFT 114 are electrically connected through the conductive particle 305, the conductive layers 825, 826, and 827. It is to be noted that the conductive layer 826 is connected to one of the conductive layers 424 which functions as the source wiring or the drain wiring of the TFT 811. The conductive layer 826 is at the same time as the second conductive layer of the memory element. The conductive layer 825 is at the same time as the first conductive layer of the memory element.

Figure 8B:
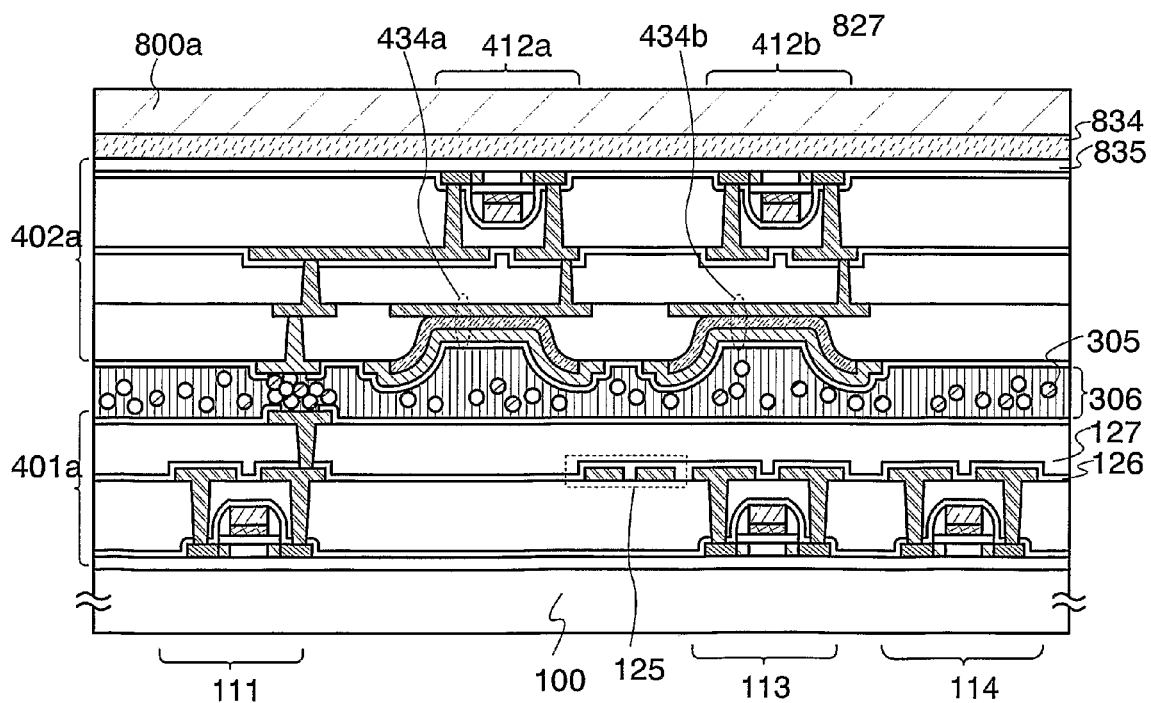

In FIG. 4A, the element forming layer 402a including a memory element is formed over the substrate 400a, however, as shown in FIG. 8B, the element forming layer 402a including a memory element may be attached to a substrate 800a with an adhesive layer 834 interposed therebetween.

A semiconductor device of the invention has a structure in which a layer including a memory element is attached to an element forming layer including a plurality of transistors and a conductive layer which functions as an antenna. Accordingly, a compact semiconductor device can be provided. Further, a step of forming an element forming layer including a plurality of transistors and a conductive layer which functions as an antenna and a step of forming an element forming layer including a memory element can be independently performed in parallel. Therefore, a semiconductor device can be manufactured efficiently in a short time. When an element forming layer including a plurality of transistors and a memory element are formed, a performance of each circuit is checked and sorted, thereby the element forming layer including the plurality of transistors and the memory element can be electrically connected to complete the semiconductor device. Therefore, a ratio that a defective is manufactured can be suppressed, leading to improve the yield.

Embodiment Mode 4

In this embodiment mode, description is made on sectional structures of semiconductor devices of the invention with different structures than in the aforementioned embodiment mode. More specifically, description is made with reference to FIGS. 5A, 5B, and 7D on sectional structures of semiconductor devices in which a substrate being provided with a layer over which a memory element and an antenna are formed is attached to an element forming layer including a plurality of transistors.

A semiconductor device of this embodiment mode has a structure in which an element forming layer 501a including a plurality of transistors formed over the first substrate 100a and an element forming layer 502a including a memory element and an antenna formed over a second substrate 500a are attached by an adhesive layer.

Here, the element forming layer 501a including a plurality of transistors typically includes the regions 102 and 103 each of which includes a plurality of TFTs. Further, the element forming layer 502a including a memory element and an antenna is formed of the region 104 including the memory element and the conductive layer 105 which functions as an antenna. The region 104 including the memory element is connected to the region 103 including a plurality of TFTs which form a control circuit, an interface and the like through conductive particles although not shown. Further, the conductive layer 105 which functions as the antenna is connected to the region 102 including a plurality of TFTs which form a communication circuit through conductive particles although not shown.

Figure 5A:
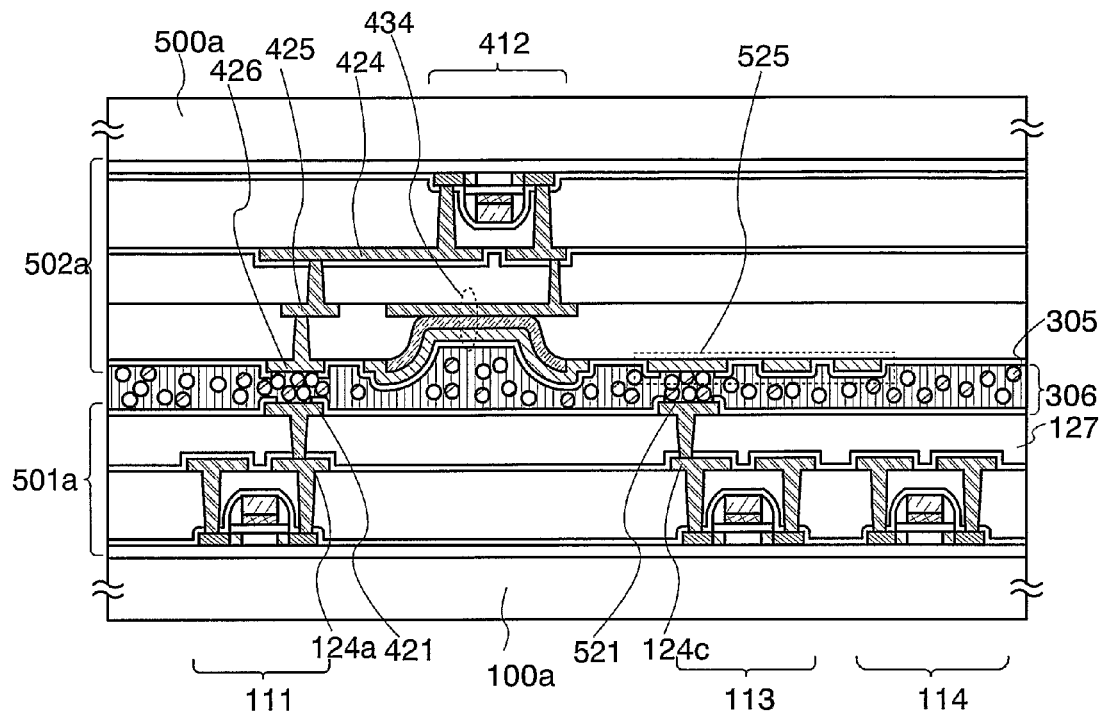
FIGS. 5A and 5B are views each of which shows a semiconductor device of the invention.
Figure 5B:
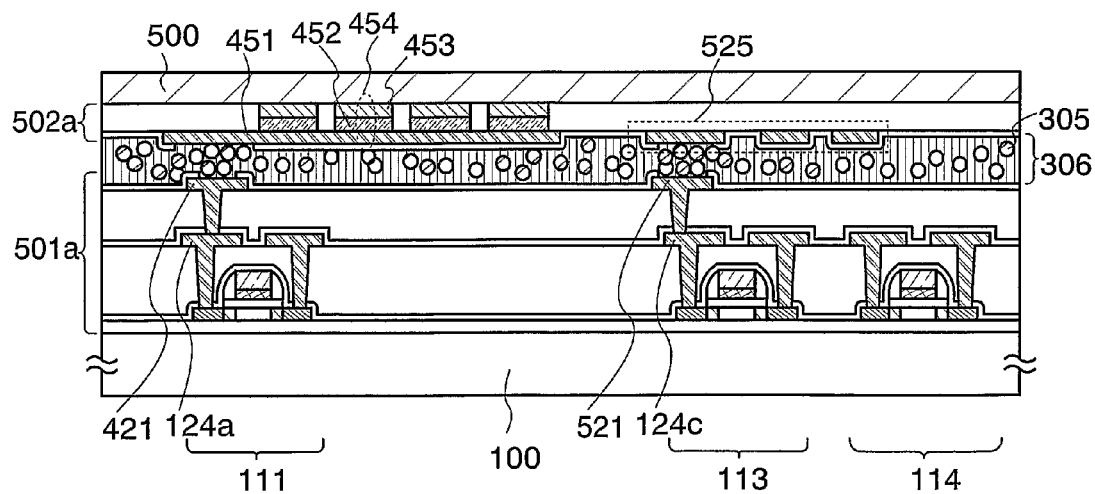

Description is made with reference to FIGS. 5A and 5B on a sectional structure of a semiconductor device of the invention with a structure shown in FIG. 7D.

As shown in FIG. 5A, the element forming layer 501a including a plurality of TFTs includes the TFTs 111, 113, and 114 of which structures are as described above. Further, the element forming layer 502a including a conductive layer 525 which functions as an antenna and a memory element 434 are formed over a substrate 500a. In FIG. 5A, the memory element 434 is connected to the switching TFT 412. That is, one of a source wiring or a drain wiring of the switching TFT 412 is connected to the first conductive layer of the memory element 434.

The other of the source wiring or the drain wiring of the switching TFT 412 is connected to the conductive layer 425 formed at the same time as the first conductive layer or the second conducive layer of the memory element. Here, the other of the conductive layers 424 which functions as a source wiring or a drain wiring is connected to the conductive layer 426 through the conductive layer 425. The conductive layer 426 is a conductive layer at the same time as the second conductive layer of the memory element 434 and functions as a connecting terminal.

The conductive layer 424 which functions as the source wiring or the drain wiring of the TFT 412 and the conductive layer 124a which functions as the source wiring or the drain wiring of the TFT 111 are electrically connected through the conductive layers 421, 425, 426, and the conductive particle 305.

Further, the conductive layer 525 which functions as an antenna is formed at the same time as the first or second conductive layer of the memory element 434. The conductive layer 525 is electrically connected to the conductive layer 124c which functions as the source wiring or the drain wiring of the TFT 113 through the conductive particle 305 and the conductive layer 521. The conductive layer 521 functions as a connecting terminal to be connected to a conductive layer which functions as an antenna.

There is a case where data is written to the memory element 434 by an optical effect using laser light, depending on a structure of the memory element. In such a case, it is required to layout the switching TFT 412, the conductive layer 424 and the memory element 434 so as not to block a light to the memory element 434 at least from one side in the element forming layer 502a including a memory element and an antenna.

The memory elements 434 shown in FIG. 5A is connected to the switching TFT 412. That is, an active matrix semiconductor device is provided. As shown in FIG. 5B, a substrate 500 including the memory element 454 formed of the first conductive layer 451, the organic compound layer or the phase change layer 452, and the second conductive layer 453 may be attached. Each of the first conductive layer 451, the organic compound layer or the phase change layer 452, and the second conductive layer 453 may have a similar structure to that of the first conductive layer 151, the organic compound layer or the phase change layer 152, and the second conductive layer 153 described in Embodiment Mode 1 respectively. In this structure, a semiconductor device having a passive matrix memory circuit is provided similarly to FIG. 1B.

The TFT 111 which forms a circuit to operate the memory element is formed over the element forming layer 501a including a plurality of transistors, however, the invention is not limited to this. A circuit to operate the memory element may be formed in the element forming layer including the memory element and an antenna. In FIG. 5A, the element forming layer 502a including a memory element and an antenna is formed over the substrate 500a, however, the element forming layer 502a including a memory element and an antenna may be attached to the substrate with an adhesive layer interposed therebetween. Furthermore, although the element forming layer 501a including a plurality of transistors is formed over the substrate 100a, the element forming layer 501a including a plurality of transistors may be attached to the substrate 200a with an adhesive layer interposed therebetween as shown in FIG. 2A.

A semiconductor device of the invention has a structure in which an element forming layer including a memory element and an antenna is stacked over an element forming layer including a plurality of TFTs. Accordingly, a compact semiconductor device can be provided. Further, a step of forming an element forming layer including a plurality of transistors and a step of forming an element forming layer including a memory element and an antenna can be independently performed in parallel. Therefore, a semiconductor device can be manufactured efficiently in a short time. When an element forming layer including a plurality of transistors, a memory element, and an antenna are formed, a performance of each is checked and sorted, thereby the element forming layer including the plurality of transistors, the element forming layer including the memory element, and the antenna can be electrically connected to complete the semiconductor device. Therefore, a ratio that a defective is manufactured can be suppressed, leading to improve the yield.

Embodiment Mode 5

In this embodiment mode, description is made on sectional structures of semiconductor devices of the invention with different structures than in the aforementioned embodiment mode. More specifically, description is made with reference to FIGS. 6A, 6B and 7E on sectional structures of semiconductor devices in which an element forming layer 602a including a memory element is formed over the substrate 100a having an element forming layer 601a including a plurality of transistors thereover is formed.

As shown in FIG. 7E, the semiconductor device of the invention has a structure in which the element forming layer 602a including a memory element is attached to the element forming layer 601a including a plurality of transistors formed over the substrate 100a or to the substrate 100a by an adhesive layer.

Here, the element forming layer 601a including a plurality of transistors is typically formed of the regions 102 and 103 each of which includes a plurality of TFTs, and the conductive layer 105 which functions as an antenna. Further, the element forming layer 602a including a memory element is formed of the region 104 including a memory element. The region 104 including a memory element is electrically connected to the region 103 including a plurality of TFTs which form a control circuit, an interface and the like through a conductive material 631.

Figure 6A:
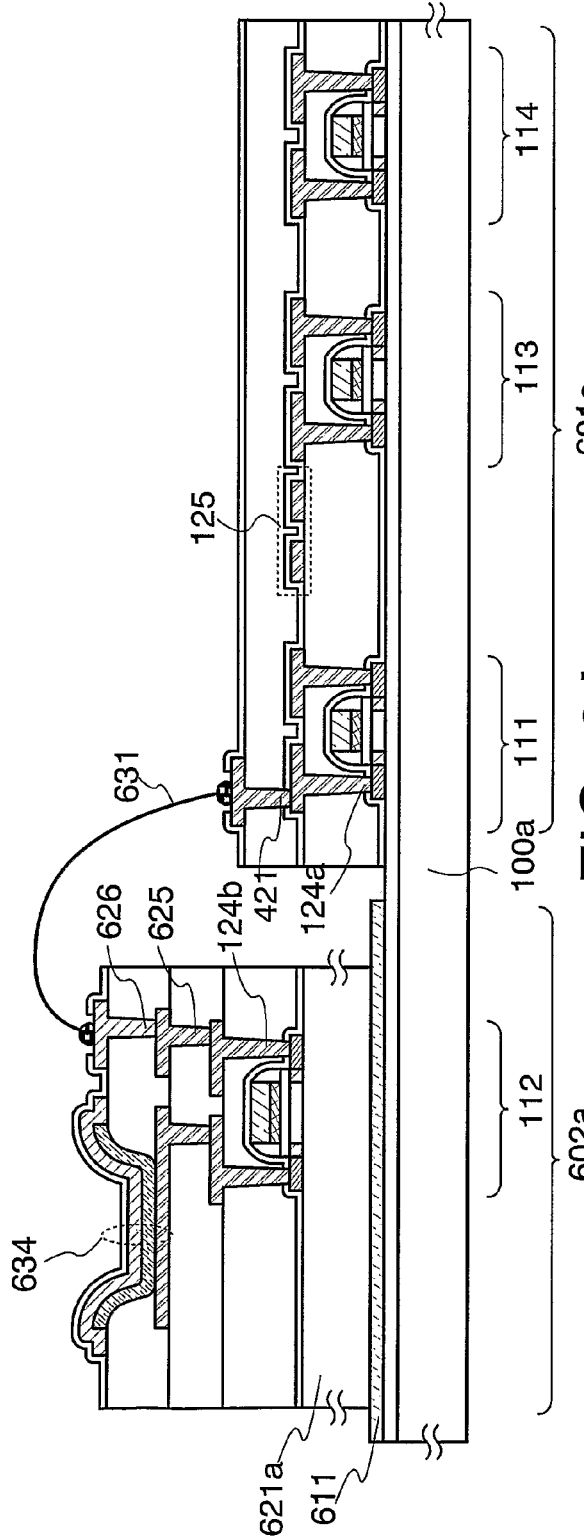
FIGS. 6A and 6B are views each of which shows a semiconductor device of the invention.
Figure 6B:
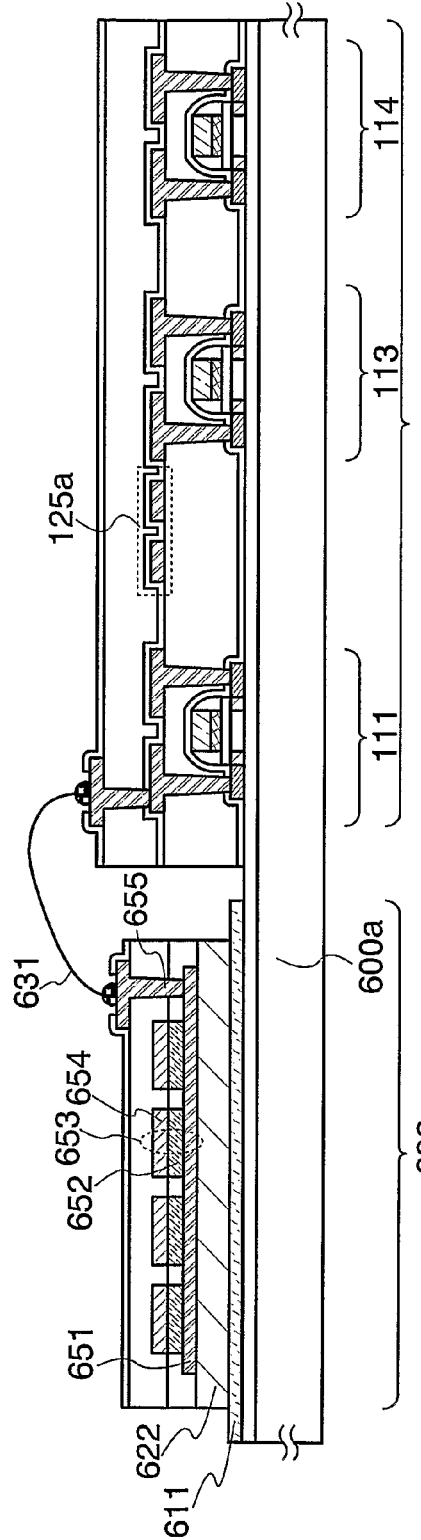

Description is made with reference to FIGS. 6A and 6B on a sectional structure of a semiconductor device of the invention with the structure shown in FIG. 7E.

As shown in FIG. 6A, the element forming layer 601a including a plurality of TFTs includes the TFTs 111, 113, and 114 of which structures are as described above. Further, a substrate 621a over which the element forming layer 602a including a memory element is formed is mounted on the substrate 100a using the adhesive layer 611. In FIG. 6A, a memory element 634 is connected to the switching TFT 112. That is, one of the source wiring or the drain wiring of the switching TFT 112 is connected to the first conductive layer of the memory element. The other of the source wiring or drain wiring of the switching TFT 112 is connected to a conductive layer formed at the same time as the first conductive layer or the second conductive layer of the memory element. Here, the other of the conductive layer 124b which functions as a source wiring or a drain wiring is connected to a conductive layer 626 through a conductive layer 625. The conductive layer 625 is at the same time as the first conductive layer of the memory element. The conductive layer 626 is at the same time as the second conductive layer of the memory element and functions as a connecting terminal.

The switching TFT 112 of the memory element 634 formed in the element forming layer 602a including a memory element and the TFT 111 which forms a circuit to operate the memory element formed in the element forming layer 601a including a plurality of TFTs are electrically connected through the conductive material 631. Here, the conductive material 631 as a wire is used to connect the TFTs 111 and 112 by a wire bonding method, however, the conductive material 631 may be formed by forming a conductive film and etching it into a desired shape. Further, a connecting method such as a printing method may be employed as well.

The memory element 634 in FIG. 6A is connected to the switching TFT 112. That is, an active matrix semiconductor device is provided. As shown in FIG. 6B, a substrate 622 over which a memory element 654 formed of a first conductive layer 651, an organic compound layer or a phase change layer 652, and a second conductive layer 654 is formed may be mounted over the substrate 100a using the adhesive layer 611. With this structure, a semiconductor device having a passive matrix memory circuit is provided.

In this embodiment mode, the element forming layer 602a including a memory element is mounted over the substrate 100a, however, the invention is not limited to this. An element forming layer including a memory element and an antenna and an element forming layer including an antenna may be mounted over the substrate 100a.

A semiconductor device of the invention has a structure in which a layer including a memory element is provided on a substrate being provided with an element forming layer including a plurality of TFTs. Accordingly, a compact semiconductor device can be provided. Further, a step of forming an element forming layer including a plurality of transistors and a step of forming an element forming layer including a memory element can be independently performed in parallel. Therefore, a semiconductor device can be manufactured efficiently in a short time. When an element forming layer including a plurality of transistors and a memory element are formed, a performance of each is checked and sorted, thereby the element forming layer including the plurality of transistors and the memory element can be electrically connected to complete the semiconductor device. Therefore, a ratio that a defective is manufactured can be suppressed, leading to improve the yield.

Embodiment Mode 6

In this embodiment mode, description is made with reference to the drawings on a manufacturing method of a semiconductor device. Here, a manufacturing method of a semiconductor device shown in FIG. 2A of Embodiment Mode 1 is shown, however, this embodiment mode can be applied to a semiconductor device shown in each embodiment mode.

Figure 9A:
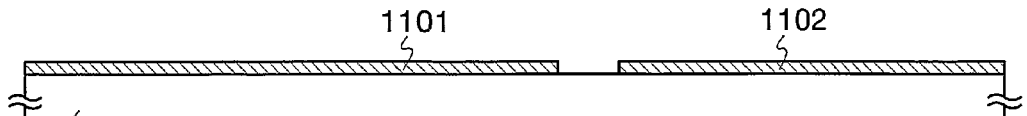
FIGS. 9A to 9E are views showing a manufacturing method of a semiconductor device of the invention.

As shown in FIG. 9A, peeling layers 1101 and 1102 are formed over one surface of a substrate 1100.

The substrate 1100 is formed of a glass substrate, a quartz substrate, a metal substrate, and a stainless substrate each of which has an insulating layer over one surface thereof, a plastic substrate which can resist a processing temperature of this step, and the like. The substrate 1100 described above is not limited in size and shape. Therefore, by using the substrate 1100 having a side of 1 meter or longer in a rectangular shape, productivity can be drastically improved. This advantage is a great superiority as compared to the case of using a circular silicon substrate.

An element forming layer including a plurality of transistors provided over the substrate 1100 is peeled off the substrate 1100 later. Therefore, the substrate 1100 may be reused to form an element forming layer including a plurality of transistors over the substrate 1100 additionally. As a result, cost reduction can be realized. The substrate 1100 to be reused can be formed of a quartz substrate.

The peeling layers 1101 and 1102 are formed by forming a thin film over one surface of the substrate 1100 and selectively etching using a resist mask formed by a photolithography method. Each of the peeling layers 1101 and 1102 is formed of a single layer or stacked layers of a layer formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), and silicon (Si), an alloy material containing the aforementioned element as a main component, or a compound material containing the aforementioned element as a main component by a plasma CVD method, a sputtering method, and the like. A layer containing silicon may have any of amorphous, microcrystalline, and polycrystalline structures.

In the case where each of the peeling layers 1101 and 1102 have a single layer structure, a tungsten layer, a molybdenum layer, or a layer containing a mixture of tungsten and molybdenum is formed. Alternatively, a layer containing oxide or nitride oxide of tungsten, a layer containing oxide or nitride oxide of molybdenum, or a layer containing an oxide or nitride oxide of mixture of tungsten and molybdenum may be formed. The mixture of tungsten and molybdenum is, for example, an alloy of tungsten and molybdenum.

In the case where each of the peeling layers 1101 and 1102 has a stacked-layer structure, it is preferable to form a tungsten layer, a molybdenum layer, or a layer containing a mixture of tungsten and molybdenum as a first layer and tungsten, molybdenum, or an oxide, nitride, oxynitride or nitride oxide of a mixture of tungsten and molybdenum as a second layer.

In the case of forming a stacked-layer structure of a layer containing tungsten and a layer containing oxide of tungsten as the peeling layers 1101 and 1102, a layer containing tungsten is formed and a layer containing silicon oxide is formed thereover, thereby a layer containing oxide of tungsten is formed at an interface between the tungsten layer and the silicon oxide layer. Further, thermal oxidization treatment, oxygen plasma treatment, treatment using highly oxidative solution such as ozone water and the like may be applied to a surface of the layer containing tungsten to form a layer containing oxide of tungsten. The layer containing nitride, oxynitride, and nitride oxide of tungsten may be formed similarly. After forming a layer containing tungsten, a silicon nitride layer, a silicon oxynitride layer, and a silicon nitride oxide layer may be formed thereover.

Oxide of tungsten is expressed as $WO_x$. X is within the range $2 \leq x \leq 3$. When x is 2, oxide of tungsten is ($WO_2$), when x is 2.5, oxide of tungsten is ($W_2O_5$), when x is 2.75, oxide of tungsten is ($W_4O_{11}$), and when x is 3, oxide of tungsten is ($WO_3$). In forming tungsten oxide, a value of x described above is not particularly limited and may be determined based on an etching rate and the like. The layer containing oxide of tungsten formed by the sputtering method in an oxygen atmosphere has the best etching rate ($WO_x$, $0 \leq x \leq 3$). Therefore, it is preferable to form the layer containing oxide of tungsten by the sputtering method in an oxygen atmosphere to reduce manufacturing time.

In the aforementioned step, the peeling layers 1101 and 1102 are formed in contact with the substrate 1100, however, the invention is not limited to this. An insulating layer as a base layer may be formed in contact with the substrate 1100 and the peeling layers 1101 and 1102 may be provided in contact with the insulating layer.

Figure 9B:
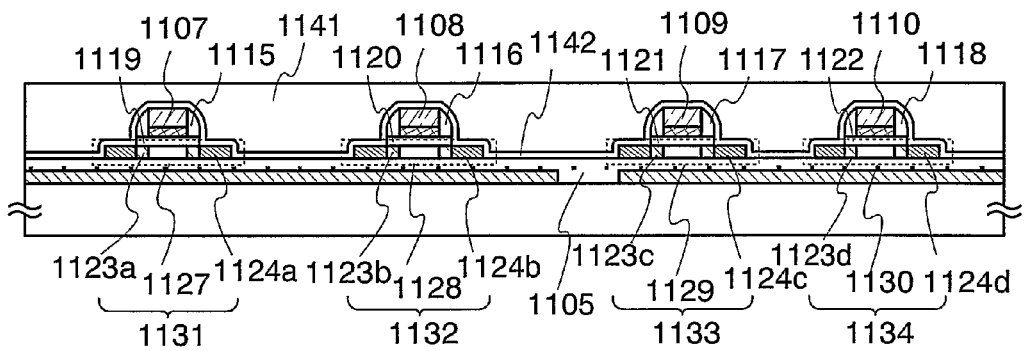

Next, an insulating layer 1105 as a base layer is formed so as to cover the peeling layers 1101 and 1102 as shown in FIG. 9B. The insulating layer 1105 is formed of a single layer or stacked layers of a layer containing oxide of silicon or nitride of silicon by a known method (the sputtering method, the plasma CVD method and the like). The oxide material of silicon is a substance containing silicon (Si) and oxygen (O), such as silicon oxide, silicon oxynitride, and silicon nitride oxide. The nitride material of silicon is a substance containing silicon and nitride (N), such as silicon nitride, silicon oxynitride, and silicon nitride oxide. The insulating layer as a base layer functions as a blocking film to prevent impurities entering from the substrate 1100.

Next, an amorphous semiconductor layer (for example, a layer containing amorphous silicon) is formed over the insulating layer 1105. This amorphous semiconductor layer is formed by a known method (the sputtering method, an LPCVD method, the plasma CVD method and the like) with a thickness of 25 to 200 nm (preferably 30 to 150 nm). Next, an amorphous semiconductor layer (for example, a layer containing amorphous silicon) is formed over the insulating layer 1105. This amorphous semiconductor layer is formed by a known method (the sputtering method, the LPCVD method, the plasma CVD method and the like) with a thickness of 25 to 200 nm (preferably 30 to 150 nm). Subsequently, the amorphous semiconductor layer is crystallized by a known crystallization method (a laser crystallization method, a thermal crystallization method using RTA or an annealing furnace, a thermal crystallization method using a metal element which promotes crystallization, a method in which the thermal crystallization method using a metal element which promotes crystallization and the laser crystallization method are combined, and the like) to obtain a crystalline semiconductor layer. After that, the crystalline semiconductor layer is etched into a desired shape to form crystalline semiconductor layers 1127 to 1130. In the case where the peeling layers 1101 and 1102 are formed of tungsten, it is possible to form an oxide of tungsten at an interface of the peeling layers 1101 and 1102, and the insulating layer 1105 by the aforementioned thermal process.

To form the crystalline semiconductor layers 1127 to 1130, first, an amorphous semiconductor layer is formed with a thickness of 66 m by the plasma CVD method. Subsequently, a solution containing nickel as a metal element which promotes crystallization is held over the amorphous semiconductor layer and a dehydrogenation process (500° C. for one hour) and a thermal crystallization process (550° C. for four hours) are applied to the amorphous semiconductor layer to form a crystalline semiconductor layer. After that, crystallinity is improved by laser light irradiation as required, and then the crystalline semiconductor layer is etched using a resist mask formed by the photolithography method to form the crystalline semiconductor layers 1127 to 1130.

In the case of forming the crystalline semiconductor layers 1127 to 1130 by the laser crystallization method, a continuous oscillation or pulsed oscillation gas laser or solid laser is used. As the gas laser, excimer laser, YAG laser, $YVO_4$ laser, YLF laser, $YAlO_3$ laser, glass laser, ruby laser, Ti sapphire laser and the like are used. As the solid laser, laser using a crystal such as YAG, $YVO_4$, YLF, and $YAlO_3$ doped with Cr, Nd, Er, Ho, Ce, Co, Ti, or Tm is used.

The crystallization of the amorphous semiconductor layer using a metal element which promotes crystallization is advantageous in that crystallization can be done at a low temperature in a short time and directions of crystals are aligned, however, disadvantageous in that an off current is increased as the metal element remains in the crystalline semiconductor layer, thus characteristics thereof are not stabilized. In view of this, it is preferable to form an amorphous semiconductor layer which functions as a gettering site over the crystalline semiconductor layer. The amorphous semiconductor layer as a gettering site is required to contain impurity elements such as phosphorus and argon. Therefore, it is preferable to form the amorphous semiconductor layer by the sputtering method so that argon can be contained at a high concentration. After that, the metal element is dispersed in the amorphous semiconductor layer by a thermal process (thermal annealing using the RTA method or the annealing furnace, and the like). Subsequently, the amorphous semiconductor layer containing the metal element is removed. Then, the content of the metal element in the crystalline semiconductor layer can be reduced or removed.

Subsequently, an insulating layer covering the crystalline semiconductor layers 1127 to 1130 is formed. The insulating layer is formed of a single layer or stacked layers of a layer containing oxide of silicon or nitride of silicon by the plasma CVD method, the sputtering method, and the like. In specific, a single layer or stacked layers of a layer containing silicon oxide, a layer containing silicon oxynitride, and a layer containing silicon nitride oxide is formed.

Subsequently, a first conductive layer and a second conductive layer are stacked over the insulating layer. The first conductive layer is formed with a thickness of 20 to 100 nm by the plasma CVD method and the sputtering method. The second conductive layer is formed with a thickness of 100 to 400 nm by a known method. The first conductive layer and the second conductive layer are formed of an element selected from tantalum (Ta), tungsten (W), titanium (Ti), molybdenum (Mo), aluminum (Al), copper (Cu), chromium (Cr), niobium (Nd) and the like or an alloy material or a compound material containing the aforementioned elements as a main component. Alternatively, a semiconductor material typified by polycrystalline silicon doped with impurity elements such as phosphorus is used.

The combinations of the first conductive layer and the second conductive layer are, a tantalum nitride (TaN) layer and a tungsten (W) layer, a tungsten nitride (WN) layer and a tungsten layer, a molybdenum nitride (MoN) layer and a molybdenum (Mo) layer, and the like. As tungsten and tantalum nitride have high heat resistance, thermal process for thermal activation can be performed after forming the first conductive layer and the second conductive layer.

Subsequently, a mask of resist is formed by the photolithography method which is then used to form a gate electrode by etching. Accordingly, conductive layers (sometimes referred to as gate electrode layers) 1107 to 1110 which function as gate electrodes are formed.

Subsequently, an n-type impurity region is formed by adding an impurity element imparting n-type conductivity to the crystalline semiconductor layers 1127 to 1130 at a low concentration by the ion doping method or the ion implanting method. The impurity element imparting n-type conductivity may be an element belonging to a group 15 of Periodic Table of Elements such as phosphorus (P) and arsenic (As). Further, a p-type impurity region may be formed by adding an impurity element imparting p-type conductivity. The impurity element imparting p-type conductivity is, for example, boron (B).

Subsequently, an insulating layer is formed so as to cover the insulating layer and the conductive layers 1107 to 1110. The insulating layer is formed of a single layer or stacked layers of a layer (sometimes also referred to as an inorganic layer) containing an inorganic material such as silicon, oxide of silicon, or nitride of silicon and a layer (sometimes also referred to as an organic layer) containing an organic material such as an organic resin. It is preferable to form the insulating layer of oxide of silicon.

Subsequently, insulating layers 1115 to 1118 (hereinafter referred to as sidewall insulating layers) in contact with sides of the conductive layers 1107 to 1110 are formed (see FIG. 9B). The sidewall insulating layers 1115 to 1117 are used as masks for doping to form a source region and a drain region later.

The insulating layer is also etched by the etching step for forming the sidewall insulating layers 1115 to 1118, thereby gate insulating layers 1119 to 1122 are formed. The gate insulating layers 1119 to 1122 overlap the conductive layers 1107 to 1110 and the sidewall insulating layers 1115 to 1118. In this manner, the gate insulating layers are etched because materials of the gate insulating layer and the sidewall insulating layers 1115 to 1118 have the same etching rate as shown in FIG. 9B. Therefore, in the case where the materials of the gate insulating layer and the sidewall insulating layers 1115 to 1118 have different etching rates, an insulating layer may remain after the etching step for forming the sidewall insulating layers 1115 to 1118.

Subsequently, an impurity element imparting n-type conductivity is added to the crystalline semiconductor layers 1127 to 1130 with the sidewall insulating layers 1115 to 1118 as masks, thereby first n-type impurity regions (also referred to as LDD regions) 1123a to 1123d and second n-type impurity regions (also referred to as source and drain regions) 1124a to 1124d are formed. The first n-type impurity regions 1123a to 1123d have lower concentration of impurity elements than the second n-type impurity regions 1124a to 1124d.

The first n-type impurity regions 1123a to 1123d may be formed by two methods. In one method, a gate electrode has a stacked layer structure of two layers or more, where taper etching or anisotropic etching is performed to the gate electrode and a conductive layer of the lower layer that forms the gate electrode is used as a mask. A sidewall insulating layer is used as a mask in the other method. A thin film transistor having a GOLD (Gate Overlapped Lightly Doped drain) structure. The invention may employ either of the former and latter methods. However, when the latter method in which a sidewall insulating layer is used as a mask is used, the width of the LDD regions is controlled easily and the LDD regions can be formed accurately.

Through the above steps, n-type TFTs 1131 to 1134 are formed.

Each of the n-type TFTs 1131 to 1134 has an LDD structure and includes an active layer including a first n-type impurity region (also referred to as an LDD region), a second n-type impurity region (also referred to as a source region and a drain region) and an active layer including a channel forming region, a gate insulating layer, and a conductive layer which functions as a gate electrode.

Subsequently, an insulating layer is formed of a single layer or stacked layers so as to cover the TFTs 1131 to 1134. The insulating layer to cover the TFTs 1131 to 1134 is formed of a single layer or stacked layers of an inorganic material such as oxide of silicon and nitride of silicon, an organic material such as polyimide, polyamide, benzocyclobutene, acryl, epoxy, and siloxane and the like by a known method (an SOG method, a droplet discharge method and the like). A siloxane-based material is, for example, a substance having a skeleton of a bond of silicon and oxygen and at least hydrogen as a substituent, or a substance having a skeleton of a bond of silicon and oxygen and at least one of fluoride, an alkyl group, aromatic carbon hydride as a substituent.

In the shown sectional structure, two insulating layers are stacked to cover the TFTs 1131 to 1134. A layer containing silicon nitride is formed as a first insulating layer 1142, and a layer containing silicon oxide is formed as a second insulating layer 1141. Further, a layer containing silicon oxide may be formed as a third insulating layer over the second insulating layer 1141.

Before forming the insulating layers 1141 and 1142 or after forming one or a plurality of thin films of the insulating layers 1141 and 1142, thermal process may be performed for recovering the crystallinity of the semiconductor layer, activating the impurity element added to the semiconductor layer, and hydrogenating the semiconductor layer. The thermal process may be a thermal annealing method, a laser annealing method, an RTA method, and the like.

Figure 9C:
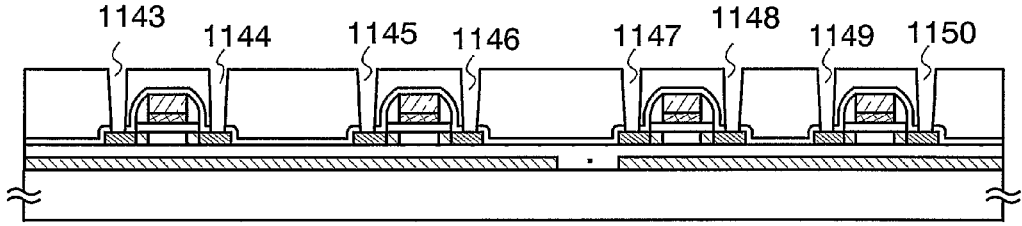

Subsequently, the insulating layers 1141 and 1142 are etched by using the photolithography method to form contact holes 1143 to 1150 to expose the second n-type impurity regions 1124a to 1124d as shown in FIG. 9C.

Figure 9D:
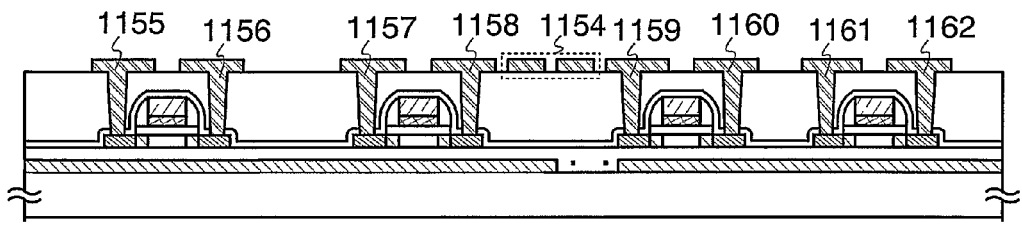

Subsequently, a conductive layer is formed to fill the contact holes 1143 to 1150. The conductive layer is then patterned to form conductive layers 1154 to 1162 as shown in FIG. 9D. The conductive layers 1155 to 1162 function as a source wiring or a drain wiring of TFTs and the conductive layer 1154 functions as an antenna.

The conductive layers 1154 to 1162 are formed of a single layer or stacked layers of an element selected from titanium (Ti), aluminum (Al), and neodymium (Nd), an alloy material or a compound material containing these elements as a main component. The alloy material containing aluminum as a main component is, for example, a material containing aluminum as a main component and nickel, or an alloy material containing aluminum as a main component, nickel and one or both of carbon and silicon.

Each of the conductive layers 1154 to 1162 is, for example, formed of a stacked-layer structure of a barrier layer, an aluminum silicon (Al—Si) layer, and a barrier layer, or a stacked-layer structure of a barrier layer, an aluminum silicon (Al—Si) layer, a titanium nitride (TiN) layer, and a barrier layer. The barrier layer is formed of titanium, nitride of titanium, molybdenum, or nitride of molybdenum. Aluminum and aluminum silicon which are low resistant and inexpensive are favorable materials for forming the conductive layers 1154 to 1162. By providing the barrier layers as upper and lower layers, hillock of aluminum and aluminum silicon can be prevented. By providing a barrier layer of lower layer, a favorable contact can be obtained between the crystalline semiconductor layer and aluminum and aluminum silicon. By forming a barrier layer of titanium which is a highly reducing element, a natural oxide film formed over the crystalline semiconductor layer can be reduced, thereby a favorable contact with the crystalline semiconductor layer can be obtained.

Figure 9E:
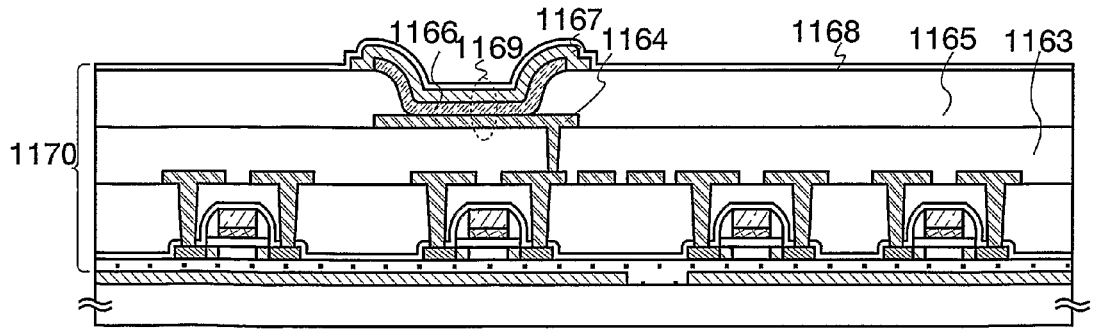

Subsequently, as shown in FIG. 9E, an insulating layer 1163 is formed of a single layer or stacked layers so as to cover the conductive layers 1154 to 1162. The insulating layer 1163 to cover the conductive layers 1154 to 1162 can be formed by similar method and material to those of the insulating layer 1142 covering a thin film transistor. Next, contact holes are formed in the insulating layer 1163 covering the conductive layers 1154 to 1162, thereby a first conductive layer 1164 is formed. The conductive layer 1164 functions as a first conductive layer of a memory element which is formed later. The first conductive layer is formed so as to cover a thin film transistor 1132.

Subsequently, after forming an insulating layer 1165 so as to cover an edge portion of the first conductive layer 1164, an organic compound layer or a phase change layer 1166 and a second conductive layer 1167 are formed. The first conductive layer 1164, the organic compound layer or the phase change layer 1166, and the second conductive layer 1167 form a memory element 1169. After that, an insulating layer 1168 may be formed. The insulating layer 1168 may be a layer containing carbon such as DLC (Diamond-Like Carbon), a layer containing silicon nitride, a layer containing silicon nitride oxide, and a layer containing an organic material (preferably an epoxy resin). The insulating layer functions as a protective layer and is not necessarily provided. By forming as the insulating layer 1168 a thick layer formed of an organic compound (typically with a thickness of 50 to 100 μm, preferably 5 to 50 μm, and more preferably 5 to 10 μm), the plurality of elements over the substrate 1100 are heavy enough to prevent scattering of the elements from the substrate 1100 and twisting of the elements, thereby the elements can be prevented from being broken and damaged. Hereinafter the layer comprising the TFTs 1131 to 1134 and the memory element 1169 is referred to as an element forming layer 1170 including a plurality of transistors.

An organic compound layer of the memory element may be formed by the droplet discharge method typified by an ink-jet method. By using the droplet discharge method, an utilization efficiency of the material can be improved and thus a manufacturing method of a semiconductor device with simplified manufacturing steps can be provided. Further, a manufacturing method of a semiconductor device in which manufacturing time and cost are reduced can be provided.

Subsequently, the insulating layers 1105, 1141, 1142, 1163, 1165, and 1168 are etched by the photolithography method to expose the peeling layers 1101 and 1102, thereby opening portions 1171 and 1172 are formed.

Figure 10A:
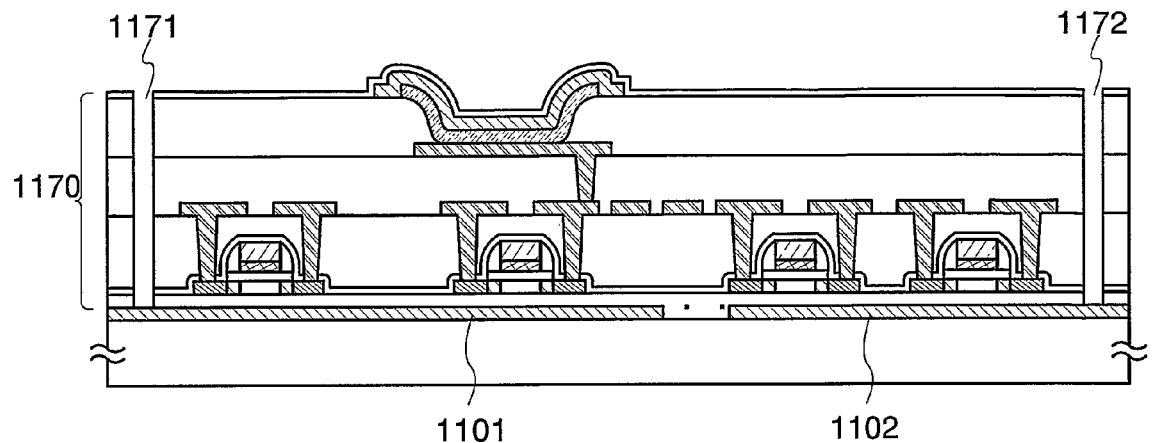
FIGS. 10A to 10C are views showing a manufacturing method of the semiconductor device of the invention.
Figure 10B:
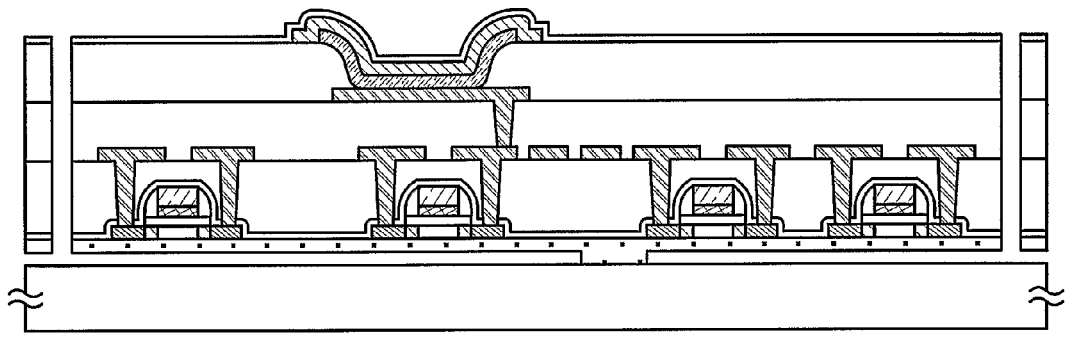

Subsequently, an etchant is put in the opening portions 1171 and 1172, thereby the peeling layers 1101 and 1102 are removed as shown in FIG. 10B. The etchant for wet etching may be a mixture obtained by diluting hydrofluoric acid with water and ammonium fluoride, a mixture of hydrofluoric acid and nitric acid, a mixture of hydrofluoric acid, nitric acid, and acetic acid, a mixture of hydrogen peroxide and sulfuric acid, a mixture of hydrogen peroxide, aqueous ammonium solution, and water, a mixture of hydrogen peroxide, hydrochloric acid, and water, and the like. The etchant for dry etching may be a gas containing a halogen-based atom or molecule such as fluoride or a gas containing oxygen. It is preferable to use a gas or liquid containing halogen fluoride or an inter-halogen compound as the etchant. For example, chlorine trifluoride ($ClF_3$) is used as a gas containing halogen fluoride.

Figure 10C:
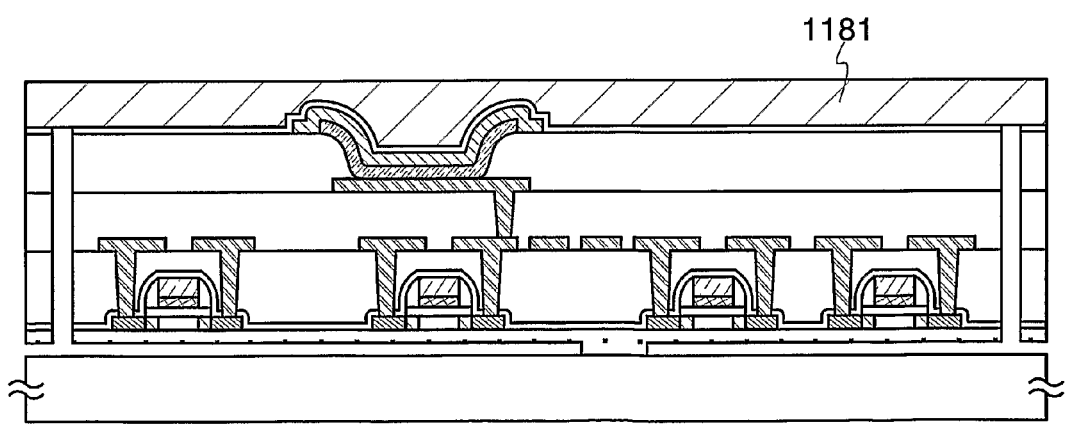
Figure 11A:
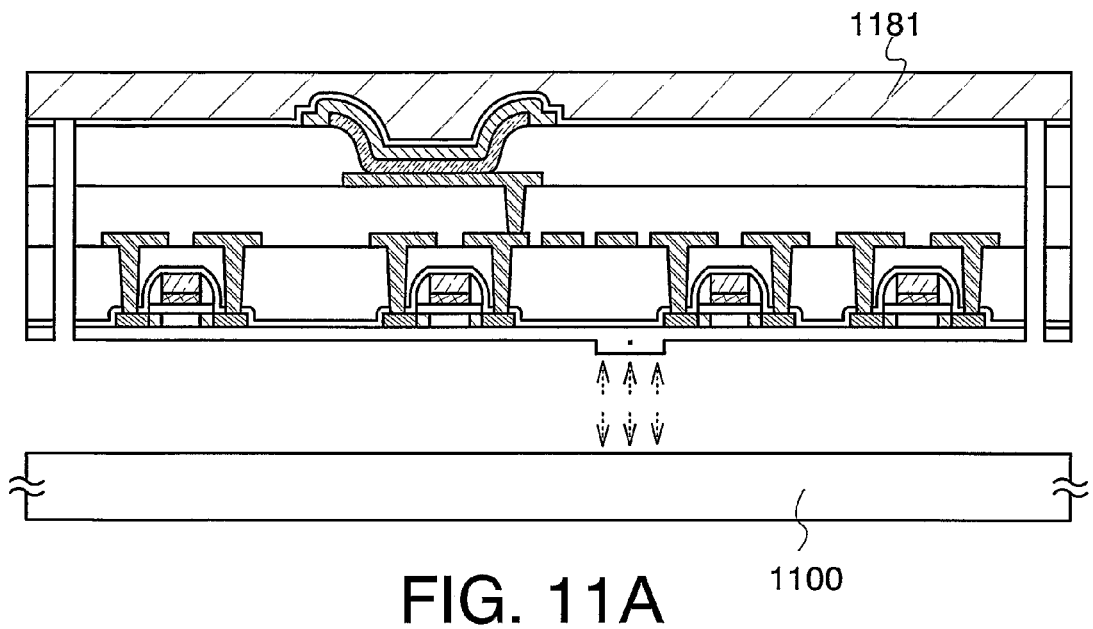
FIGS. 11A and 11B are views showing a manufacturing method of the semiconductor device of the invention.

Subsequently, as shown in FIG. 10C, a surface provided with a memory element of the element forming layer 1170 including a plurality of transistors is adhered to a substrate 1181, and then the element forming layer 1170 including the plurality of transistors is completely peeled off from the substrate 1100 (see a sectional view of FIG. 11A).

The substrate 1181 may of a similar material to the substrate 200a shown in Embodiment Mode 1.

Figure 11B:
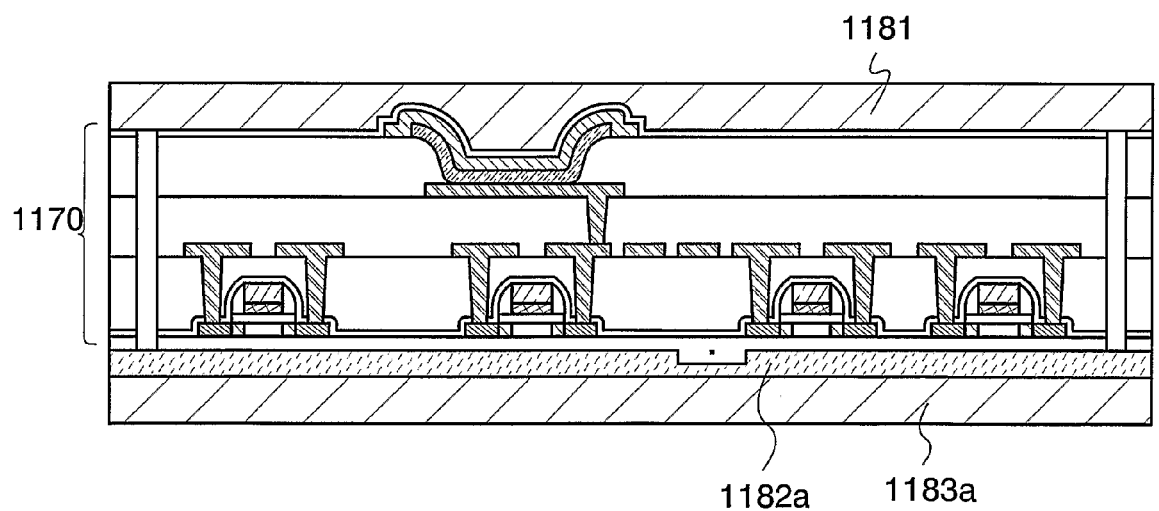

Subsequently, as shown in FIG. 11B, the other surface of the element forming layer 1170 including a plurality of transistor is adhered to a substrate 1183a using an adhesive 1182a.

The substrate 1183a may be formed of a similar material to the substrate 200a shown in Embodiment Mode 1.

Subsequently, the element forming layer 1170 including the plurality of transistors and the substrate 1181 adhered to each other are cut by a slicing device, a laser irradiation apparatus or the like.

Through the aforementioned steps, a semiconductor device having a function to communicate data without contact can be provided.

Further, the element forming layer 1170 including a plurality of transistors and the substrate 1183 are cut after being adhered to complete a semiconductor device, however, the invention is not limited to this. The element forming layer 1170 and the substrate 1181 may be adhered and then cut out, thereby the substrate 1183 may be adhered to the element forming layer 1170.

In this manner, a semiconductor device of the invention being compact, thin, lightweight, and flexible can realize various applications and does not disturb the design of the object even when attached thereto.

Embodiment Mode 7

Figure 26A:
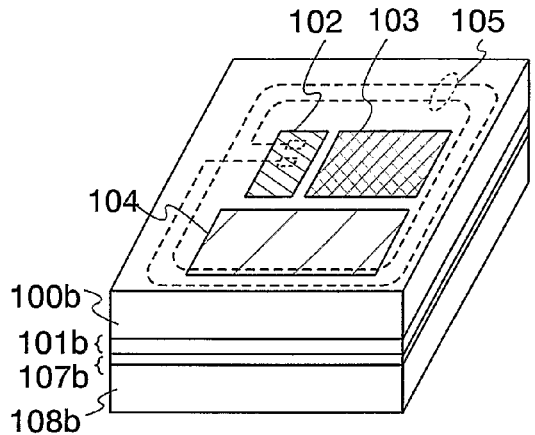
FIGS. 26A to 26E are views each of which shows a semiconductor device of the invention.
Figure 27A:
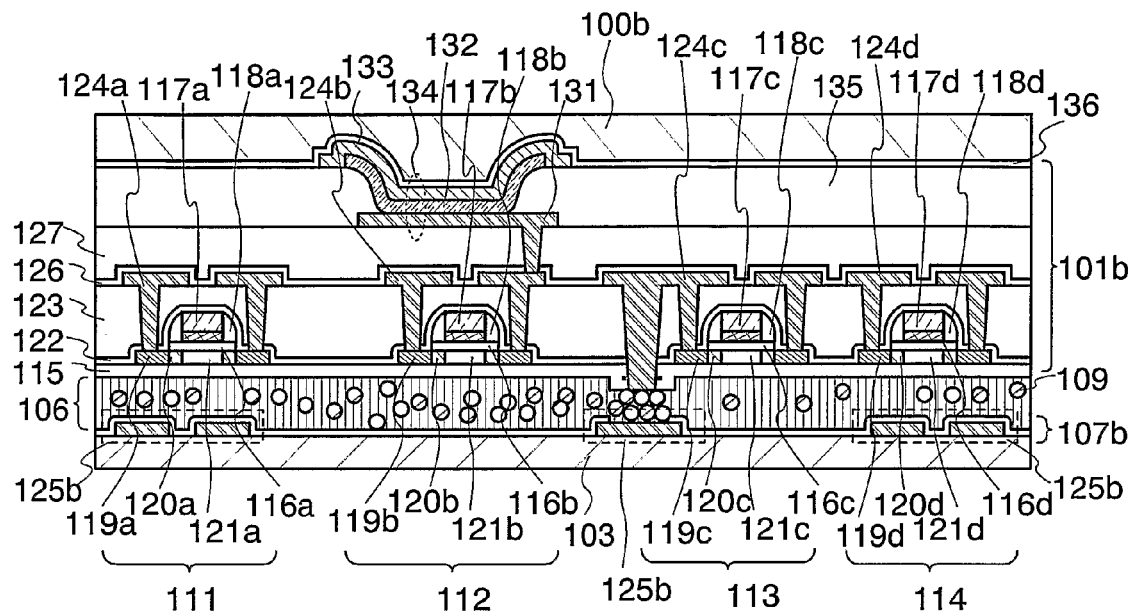
FIGS. 27A and 27B are views each of which shows a semiconductor device of the invention.
Figure 27B:
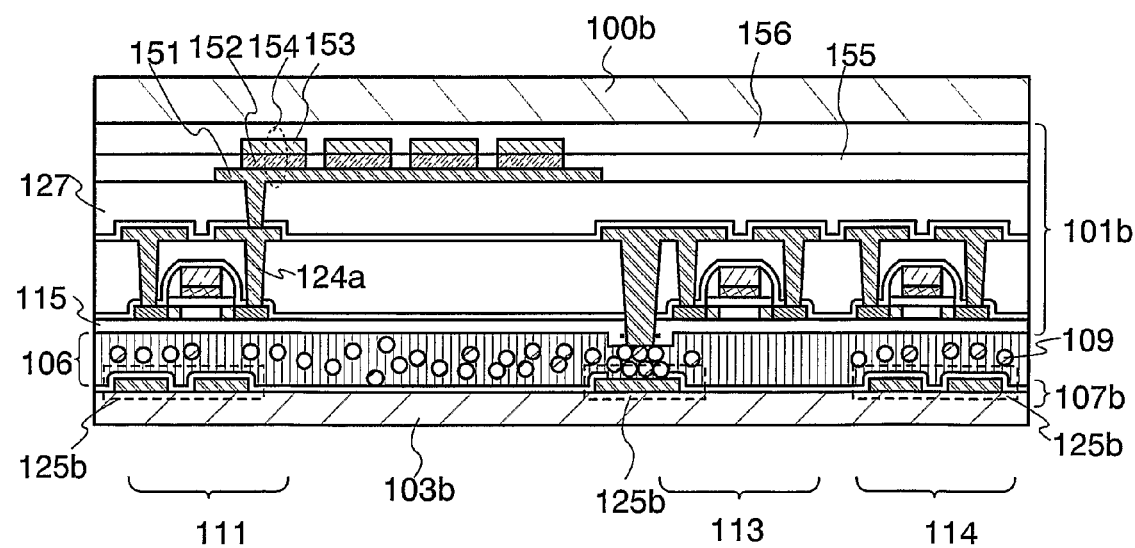

Description is made with reference to FIGS. 26A, 27A and 27B on a structure of a semiconductor device of this embodiment mode.

Description is made with reference to FIG. 26A on a perpendicular view of a semiconductor device of this embodiment mode. The semiconductor device of this embodiment mode has a structure in which a plurality of transistors and a memory element are integrated over a substrate as shown in FIG. 26A. Here, an element forming layer 101b including a plurality of transistors and a memory and an element forming layer 107b including an antenna provided over a substrate 108b are formed. The element forming layer 101b including the plurality of transistors and the memory is typically formed of the regions 102 and 103 each of which includes the plurality of TFTs, and the region 104 including the memory element. Further, the element forming layer 107b including the conductive layer 105 which functions as the antenna is formed over the substrate 108b. The conductive layer 105 is attached to a back surface of the element forming layer 101b including the plurality of transistors and the memory by an adhesive layer. Here, the back surface of the element forming layer 101b including the plurality of transistors and the memory is a surface where the insulating layer is exposed.

Next, description is made with reference to FIG. 27A on a sectional structure of a semiconductor device having the structure shown in FIG. 26A. A substrate 100b is provided over the element forming layer 101b including a plurality of transistors and a memory. Here, shown as the element forming layer 101b including a plurality of circuits are the TFT 111 (a portion of the region 104 including a memory element shown in FIG. 26A) which forms a circuit to operate the memory element, the switching TFT 112 (a portion of the region 104 including a memory element shown in FIG. 26A) of the memory element, the TFT 113 (a portion of the region 102 including a plurality of TFTs shown in FIG. 26A) which forms a circuit to process signals received by the antenna such as a power source circuit, a clock generating circuit, and a data demodulation/modulation circuit, and the TFT 114 (a portion of the region 103 including a plurality of TFTs shown in FIG. 26A) which forms a circuit such as a control circuit and an interface.

The element forming layer 101b including the plurality of transistors and the memory and the element forming layer 107b including an antenna are attached by an adhesive layer 106. In specific, the insulating layer 115 and the element forming layer 107b including the antenna are attached by the adhesive layer 106. Further, the conductive layer 124c which functions as a source wiring or a drain wiring of the TFT 113 in the element forming layer 101b and a conductive layer 125b which functions as an antenna of the element forming layer 107b are electrically connected through conductive particles 109 of the adhesive layer 106.

The TFTs 111 to 114 are provided between the substrate 100b and the insulating layer 115. Further, the insulating layer 122 covering the TFTs 111 to 114 is formed.

Further, the insulating layer 123 is provided so as to cover the TFTs 111 to 114 and the insulating layer 122 which functions as a passivation film. The insulating layer 123 is formed to achieve a planarized the surface. The conductive layers 124a to 124d each of which functions as a source wiring or a drain wiring are in contact with the source regions and drain regions 119a to 119d and fill the contact holes provided in the insulating layer 123. One of the conductive layer 124c which functions as a source wiring or a drain wiring of the TFT 113 passes through the insulating layers 115, 122, and 123 and exposed on a back surface of the element forming layer 101b.

The insulating layers 126 and 127 are provided so as to cover the conductive layers 124a to 124d and 125b. These insulating layers 126 and 127 are provided to achieve a planarized surface and to protect the TFTs 111 to 114 and the conductive layers 124a to 124d and 125b.

The memory element 134 is provided over the insulating layer 127.

The first conductive layer 131, the organic compound layer or a phase change layer 132, and the second conductive layer 133 are stacked in this order over the insulating layer 127. This stack corresponds to the memory element 134. The insulating layer 135 is provided between the adjacent organic compound layers or the phase change layers 132. The first conductive layer 131 is connected to the conductive layer 124b which functions as the source wiring or the drain wiring of the TFT 112. The insulating layer 136 is provided over the conductive layer 133. The TFT 112 functions as a switching TFT of the memory element which is also provided with a switching TFT. With this structure, a semiconductor device provided with an active matrix memory circuit is provided.

The substrate 100b is provided over the insulating layer 136.

Next, description is made with reference to FIG. 27B on a sectional structure of a semiconductor device including a memory element which is not provided with a switching transistor instead of a memory element having a transistor, that is a semiconductor device including a passive matrix memory circuit. More specifically, description is made on a sectional structure of a semiconductor device having the memory element 154 with a different structure when compared to the semiconductor device shown in FIG. 27A.

Over the insulating layer 127, a first conductive layer 151 is provided to be connected to the conductive layer 124a which functions as the source wiring or the drain wiring of the TFT 111, an organic compound layer or the phase change layer 152 is provided to be connected to the first conductive layer 151, and a second conductive layer 153 is provided to be connected to the organic compound layer or the phase change layer 152. A stack of the first conductive layer 151, the organic compound layer or the phase change layer 152, and the second conductive layer 153 corresponds to the memory element 154. The insulating layer 155 is provided between adjacent the organic compound layers or the phase change layers 152. The insulating layer 156 is provided over the memory element 154.

According to the semiconductor device of the invention, a step of forming an element forming layer including a plurality of transistors and a memory and a step of forming a conductive element forming layer which functions as an antenna can be independently performed in parallel. Therefore, a semiconductor device can be manufactured efficiently in a short time. When an antenna and an element forming layer including a plurality of transistors and are formed, a performance of each circuit is checked and sorted, thereby the element forming layer including the plurality of transistors and the antenna can be electrically connected to complete the semiconductor device. Therefore, a ratio that a defective is manufactured can be suppressed, leading to improve the yield.

Embodiment Mode 8

In this embodiment mode, description is made on a sectional structure of a semiconductor device of the invention with a different structure from the aforementioned embodiment mode. More specifically, description is made on a sectional structure of a semiconductor device with a structure in which a substrate 200b over which an element forming layer 202b including a memory element is formed instead of the conductive layer including an antenna is attached when compared to the semiconductor device shown in FIGS. 27A and 27B.

The semiconductor device of this embodiment mode has a structure in which the element forming layer 201b including a plurality of transistors provided over the first substrate 100b and the element forming layer 202b including a memory element formed over the second substrate 200b are attached by a resin layer.

Here, the element forming layer 201b including the plurality of transistors typically includes the regions 102 and 103 each of which includes a plurality of TFTs and the conductive layer 105 which functions as an antenna. The element forming layer 202a including the memory element is formed of the region 104 including the memory element. The region 104 including the memory element is connected to the region 103 including the plurality of TFTs which form a control circuit, an interface and the like through conductive particles although not shown.

Figure 26B:
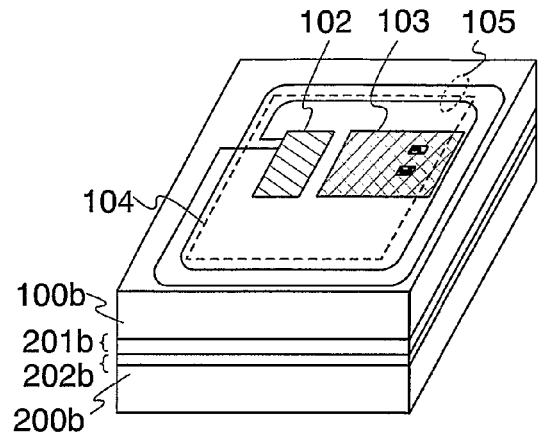
Figure 28A:
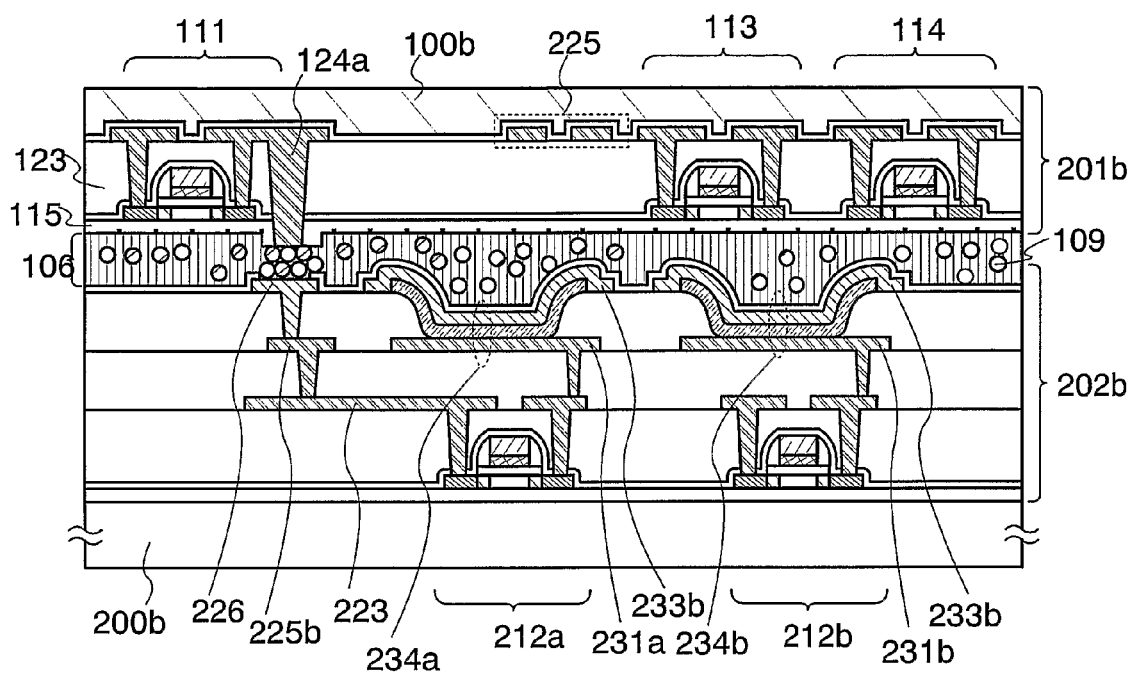
FIGS. 28A and 28B are views each of which shows a semiconductor device of the invention.
Figure 28B:
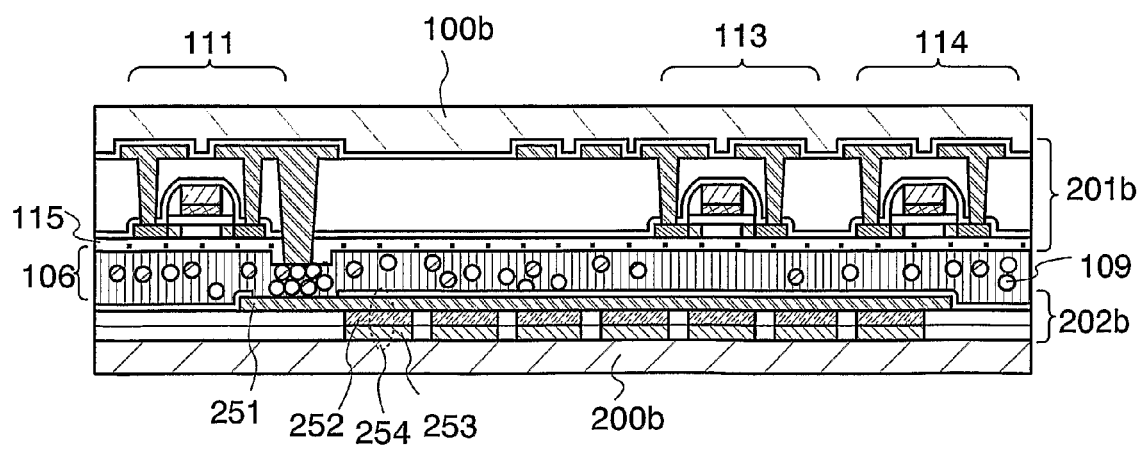

Description is made with reference to FIGS. 28A and 28B on a sectional structure of a semiconductor device of the invention with the structure shown in FIG. 26B.

As shown in FIG. 28A, the element forming layer 201b including the plurality of transistors is provided over the substrate 100b. The element forming layer 201b includes TFTs 111, 113, and 114 of which structures are as described above. The conductive layer 124a which functions as a source wiring or a drain wiring of the TFT 111 is exposed on a back surface.

Further, the element forming layer 202b including the memory element is formed over the substrate 200b. The element forming layer 201b including the plurality of transistors and the element forming layer 202b including the memory element are attached by the adhesive layer 106. In specific, the insulating layer 115 and the element forming layer 202b including the memory element are attached by the adhesive layer 106. In FIG. 28A, each of memory elements 234a and 234b is connected to switching TFTs 212a and 212b respectively. That is, one side of a source wiring or a drain wiring of the switching TFTs 212a and 212b is connected to first conductive layers 231a and 231b respectively. The other side of the source wiring or drain wiring of the switching TFTs 212a and 212b is connected to a conductive layer which is formed at the same time as the first or second conductive layer of the memory element. Here, the other side of a conductive layer 223 which functions as the source wiring or the drain wiring is connected to a conductive layer 226 through a conductive layer 225b. A conductive layer 225b is at the same time as the first conductive layers 231a and 231b of the memory elements 234a and 234b. The conductive layer 226 is at the same time as second conductive layers 233a and 233b of the memory elements 234a and 234b.

The conductive layer 223 which functions as the source wiring or the drain wiring of the switching TFT 212a of the memory element and the conductive layer 124a which functions as the source wiring or the drain wiring of the TFT 111 which forms a circuit to operate the memory element are electrically connected through the conductive particles in the adhesive layer 106.

There is a case where data is written to the element forming layer 202b including the memory element by an optical effect using laser light, depending on a structure of the memory element. In such a case, it is required to layout the switching TFTs 212a, 212b, the memory elements 234a, and 234b so as not to overlap each other in the element forming layer 202b including the memory element.

The memory elements 234a and 234b shown in FIG. 28A are provided with the switching TFTs 212a and 212b respectively. With this structure, a semiconductor device including an active matrix memory circuit is provided. As shown in FIG. 28B, a substrate being provided with a memory element 254 formed of the first conductive layer 251, the organic compound layer or the phase change layer 252, and the second conductive layer 253 may be attached as well. In FIG. 28B, a passive matrix memory circuit in which each memory element is not provided with a switching TFT is shown. The first conductive layer 251, the organic compound layer or the phase change layer 252, and the second conductive layer 253 may have similar structures to those of the first conductive layer 151, the organic compound layer or the phase change layer 152, and the second conductive layer 153 shown in Embodiment Mode 1.

Figure 31A:
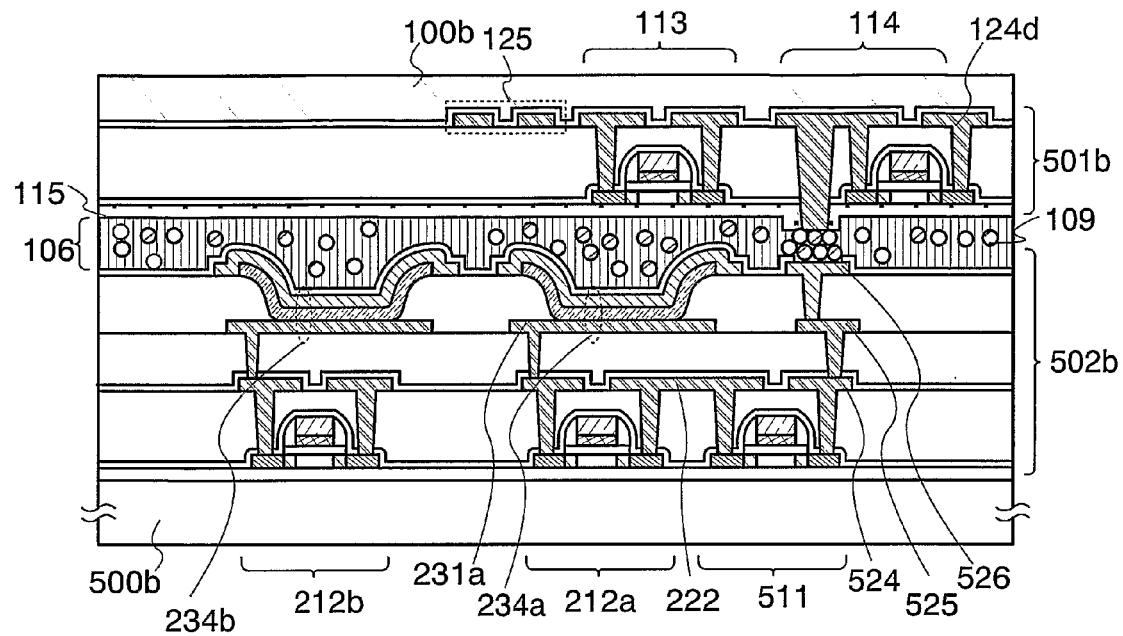
FIGS. 31A and 31B are views each of which shows a semiconductor device of the invention.

In the aforementioned structure, a circuit to operate the memory element is formed in the element forming layer 201b including a plurality of transistors, however, the invention is not limited to this. For example, the TFT 111 which forms a circuit to operate the memory element may be formed in an element forming layer 202b including a memory element. In specific, as shown in FIG. 31A, after forming a TFT 511 which forms a circuit to operate the memory element together with the memory elements 234a and 234b over a substrate 500b, an element forming layer 502b including a memory element and an element forming layer 501b including a plurality of transistors and an antenna may be attached thereto by the adhesive layer 106. At this time, a conductive layer 526 connected to one of a source wiring or a drain wiring 524 of the TFT 511 which forms the circuit to operate the memory element and one of the source wiring or drain wiring 124d of the TFT 114 are electrically connected through conductive particles 109. The conductive layer 526 is connected to one of the source wiring or the drain wiring 524 of the TFT 511 through the conductive layer 525. The conductive layer 526 is at the same time as a second conductive layer of the memory element. The conductive layer 525 is at the same time as a first conductive layer of the memory element.

Figure 31B:
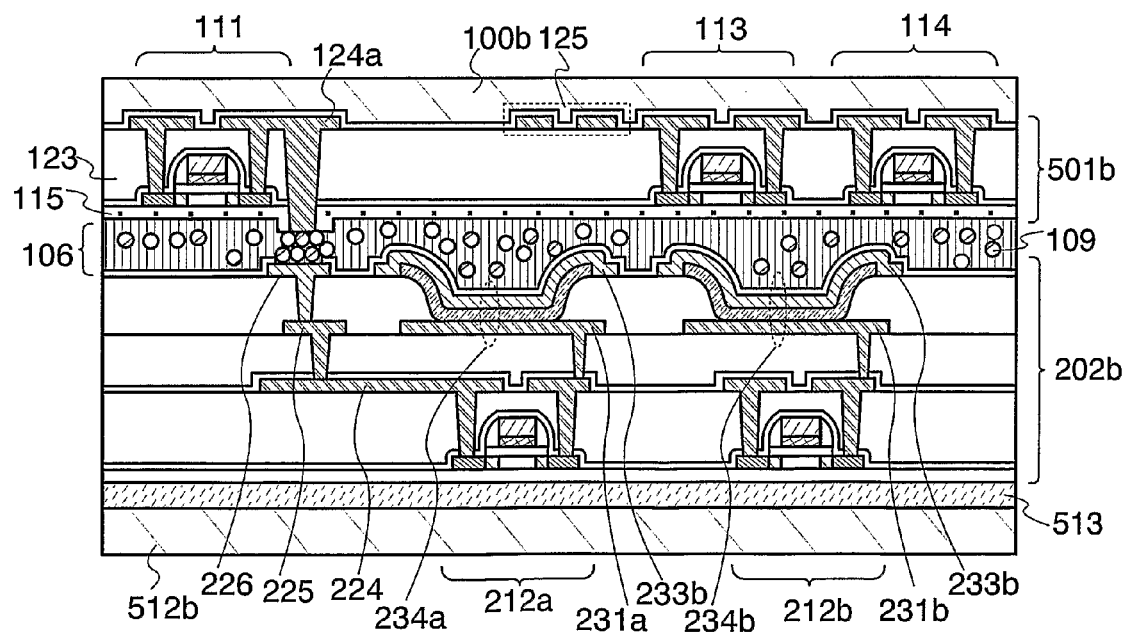

In FIG. 28A, the element forming layer 202b including the memory element is formed over the substrate 200b, however, the element forming layer 202b including a memory element may be attached to a substrate 512b with an adhesive layer 513 interposed therebetween as shown in FIG. 31B. In specific, after providing a peeling layer over a substrate and forming the element forming layer 202b including the plurality of transistors over the peeling layer, the element forming layer 202b including the plurality of transistors is peeled off the peeling layer and the element forming layer 202b including the plurality of transistors may be attached to the substrate 512b with the adhesive layer 513 interposed therebetween. The peeling method described in Embodiment Mode 1 can be used at discretion.

Further, as the substrate 512b, a similar material to the substrate 200a can be used. A heat curable resin, an ultraviolet curable resin, an epoxy resin-based adhesive, and a resin additive can be used as the adhesive layer 513.

As described above, by attaching the peeled element forming layer including a plurality of transistors to a flexible, thin, and lightweight plastic substrate, a semiconductor device which is thin, lightweight, and not easily broken when dropped can be provided. Further, the flexibility enables the semiconductor device to be attached to a curved surface or an irregular shaped surface, leading to various applications. For example, a semiconductor device of the invention can be attached closely to a curved surface such as a medicine bottle. If the substrate is reused, cost for the semiconductor device can be reduced.

According to the semiconductor device of the invention, a step of forming an element forming layer including a plurality of transistors and a step of forming an element forming layer including a memory element can be independently performed in parallel. Therefore, a semiconductor device can be manufactured efficiently in a short time. When element forming layers each including a plurality of transistors or a memory element are formed, a performance of each circuit is checked and sorted, thereby the element forming layer including the plurality of transistors can be electrically connected to complete the semiconductor device. Therefore, a ratio that a defective is manufactured can be suppressed, leading to improve the yield.

Embodiment Mode 9

In this embodiment mode, description is made on a sectional structure of a semiconductor device of the invention with a different structure than in the aforementioned embodiment mode. More specifically, description is made on a sectional structure of a semiconductor device with a structure in which a substrate being provided with a layer over which a memory element and an antenna are formed is attached to a back surface of an element forming layer including a plurality of transistors.

Figure 26C:
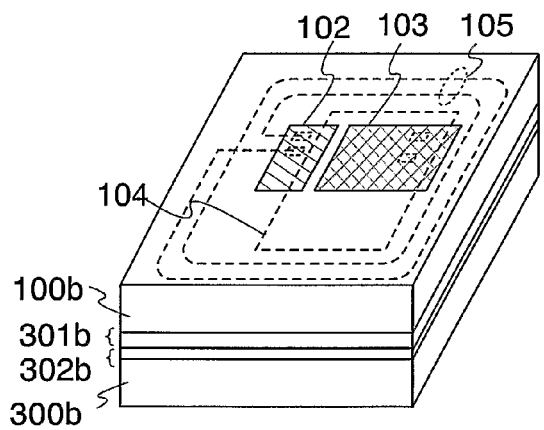

As Shown in FIG. 26C, a semiconductor device of this embodiment mode has a structure in which an element forming layer 301*b* including a plurality of transistors provided over the substrate 100*b* and an element forming layer 302*b* including a memory element and an antenna provided over the second substrate 300*b* are attached by an adhesive layer.

Here, the element forming layer 301*b* including the plurality of transistors typically includes the regions 102 and 103 each of which includes a plurality of TFTs. The element forming layer 302*b* including the memory element and the antenna is formed of the region 104 including the memory element and the conductive layer 105 which functions as the antenna. The region 104 including the memory element is connected to the region 103 including the plurality of TFTs which form a control circuit, an interface and the like through conductive particles although not shown. Further, the conductive layer 105 which functions as the antenna is connected to the region 102 including the plurality of TFTs which form a communication circuit through conductive particles in an adhesive layer although not shown.

Figure 29A:
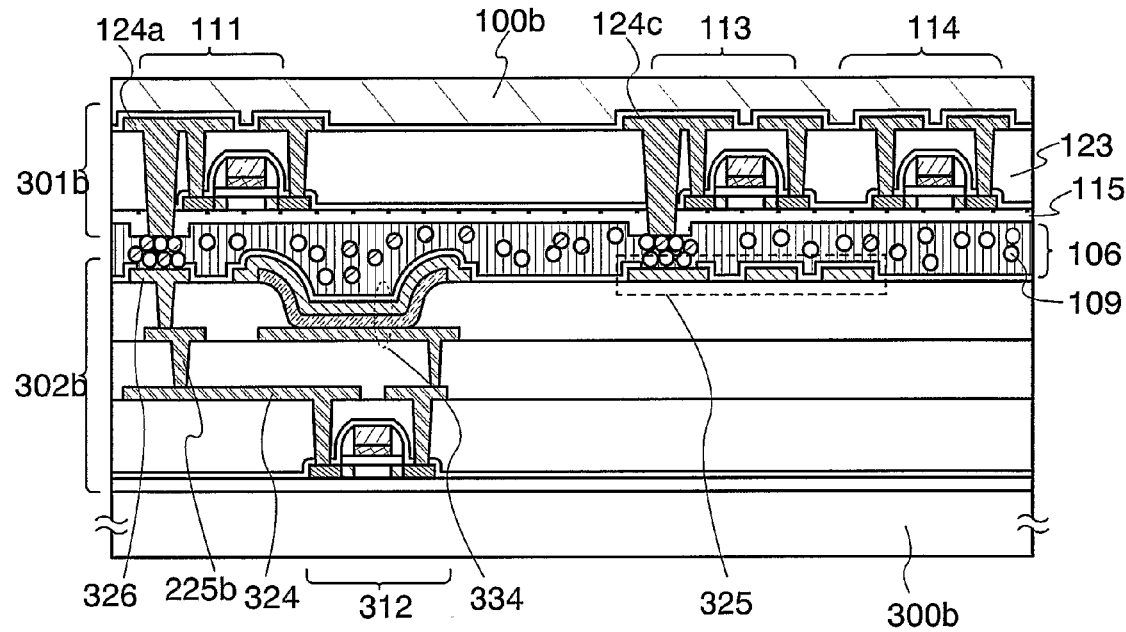
FIGS. 29A and 29B are views each of which shows a semiconductor device of the invention.
Figure 29B:
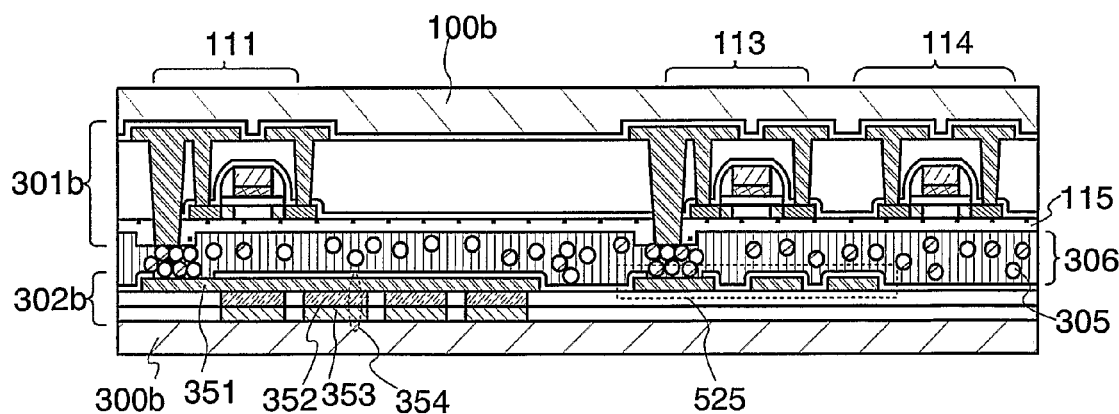

Description is made with reference to FIGS. 29A and 29B on a sectional structure of a semiconductor device of the invention with the structure shown in FIG. 26C.

As shown in FIG. 29A, the element forming layer 301*b* including a plurality of TFTs includes the TFTs 111, 113, and 114 of which structures are as described above. The element forming layer 302*b* including a conductive layer 325 which functions as an antenna and a memory element 334 is formed over the substrate 300*b*. In FIG. 29A, a switching TFT 312 is connected to a memory element 334. That is, one of the conductive layer 324 which functions as a source wiring or a drain wiring of the switching TFT 312 is connected to the first conductive layer of the memory element 334, thereby an active matrix memory circuit is formed.

Further, the other of the conductive layer 324 which functions as the source wiring or the drain wiring of the switching TFT 312 is connected to a conductive layer formed at the same time as the first or second conductive layer of the memory element. Here, the other of the conductive layer 324 which functions as the source wiring or the drain wiring is connected to a conductive layer 326 through the conductive layer 225*b*. The conductive layer 225*b* is at the same time as the first conductive layer of the memory element. The conductive layer 326 is at the same time as the second conductive layer of the memory element and functions as a connecting terminal.

Further, a back surface of the element forming layer 301*b* including a plurality of TFTs and the element forming layer 302*b* including the memory element and the antenna are attached by the adhesive layer 106 including the conductive particles 109. That is, the insulating layer 115 and the element forming layer 302*b* including a memory element and an antenna are attached by the adhesive layer 106 including the conductive particles 109. The conductive layer 124*c* which functions as the source wiring or the drain wiring of the TFT 113 is exposed on a back surface. Therefore, the conductive layer 124*a* which functions as the source wiring or the drain wiring of the TFT 111 is electrically connected to the conductive layer 325 which functions as the antenna through the conductive particle 109.

Further, the conductive layer 325 which functions as the antenna is formed at the same time as a first conductive layer or a second conductive layer of the memory element 334. The conductive layer 325 is electrically connected to the conductive layer 124*c* which functions as the source wiring or the drain wiring of the TFT 113 through the conductive particles 109. The conductive layer 325 is formed at the same time as the conductive layer 326.

There is a case where data is written to the memory element 334 by an optical effect using laser light depending on a structure thereof. In such a case, it is required to layout the conductive layer 325 and the switching TFT 312 *t*, so as not to overlap the memory element in the element forming layer 302*b* including the memory element.

The memory element 334 shown in FIG. 29A is a memory element provided with the switching TFT 312. As shown in FIG. 29B, the substrate 300*b* being provided with a conductive layer 525 which functions as an antenna and a memory element 354 formed of a first conductive layer 351, an organic compound layer or a phase change layer 352, and a second conductive layer 353 may be attached as well.

The TFT 111 which forms a circuit to operate the memory element is formed in the element forming layer 301*b* including a plurality of transistors, however, the invention is not limited to this. The TFT which forms a circuit to operate the memory element may be formed in the element forming layer 302*b* including a memory element. In FIG. 29A, the element forming layer 302*b* including the memory element and the antenna is formed over the substrate 300*b*, however, the element forming layer 302*b* including the memory element and the antenna may be attached to the substrate 300*b* through an adhesive layer.

According to the semiconductor device of the invention, a step of forming an element forming layer including a plurality of transistors and a step of forming an element forming layer including a memory element and an antenna can be independently performed in parallel. Therefore, a semiconductor device can be manufactured efficiently in a short time. When an element forming layer including a plurality of transistors, an element forming layer including a memory element, and an antenna are formed, a performance of each circuit is checked and sorted, thereby the element forming layer including the plurality of transistors, the memory element and an element forming layer including the antenna can be electrically connected to complete the semiconductor device. Therefore, a ratio that a defective is manufactured can be suppressed, leading to improve the yield.

Embodiment Mode 10

In this embodiment mode, description is made on a sectional structure of a semiconductor device of the invention with a different structure from the aforementioned embodiment mode. More specifically, description is made with reference to FIGS. 26D, 30A and 30B on a sectional structure of a semiconductor device with a structure in which an element forming layer 401b including a plurality of transistors is sandwiched by a substrate being provided with an antenna and a substrate being provided with a memory element.

A semiconductor device of this embodiment mode has a structure in which the element forming layer 401b including a plurality of transistors is sandwiched by the element forming layer 107b including a conductive layer which functions as an antenna formed over the substrate 108b and the element forming layer 202b including a memory element formed over the substrate 200b. The element forming layer 401b including a plurality of transistors and the element forming layer 202b including a conductive layer which functions as an antenna are attached by an adhesive layer. The element forming layer 401b including the plurality of transistors and the element forming layer 107b including the conductive layer which functions as the antenna are attached by an adhesive layer as well.

Here, the element forming layer 401b including a plurality of transistors typically includes the regions 102 and 103 each of which includes the plurality of TFTs. The element forming layer 202b including the memory element is formed of the region 104 including the memory element. The region 104 including the memory element is connected to the region 103 including the plurality of TFTs which form a control circuit, an interface and the like through conductive particles in the adhesive layer although not shown.

The conductive layer 105 which functions as the antenna is connected to the region 107b including the plurality of TFTs which form a communication circuit through conductive particles in the adhesive layer although not shown.

Figure 26D:
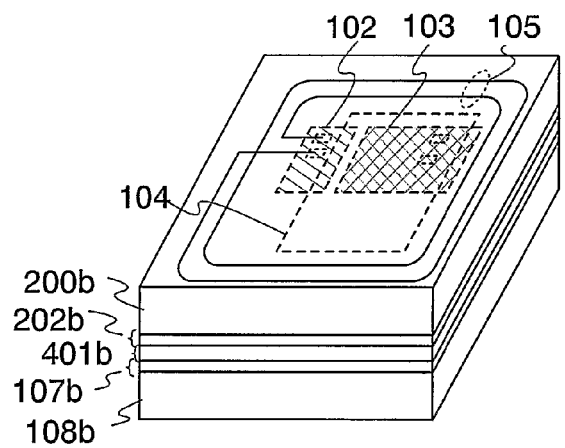
Figure 30A:
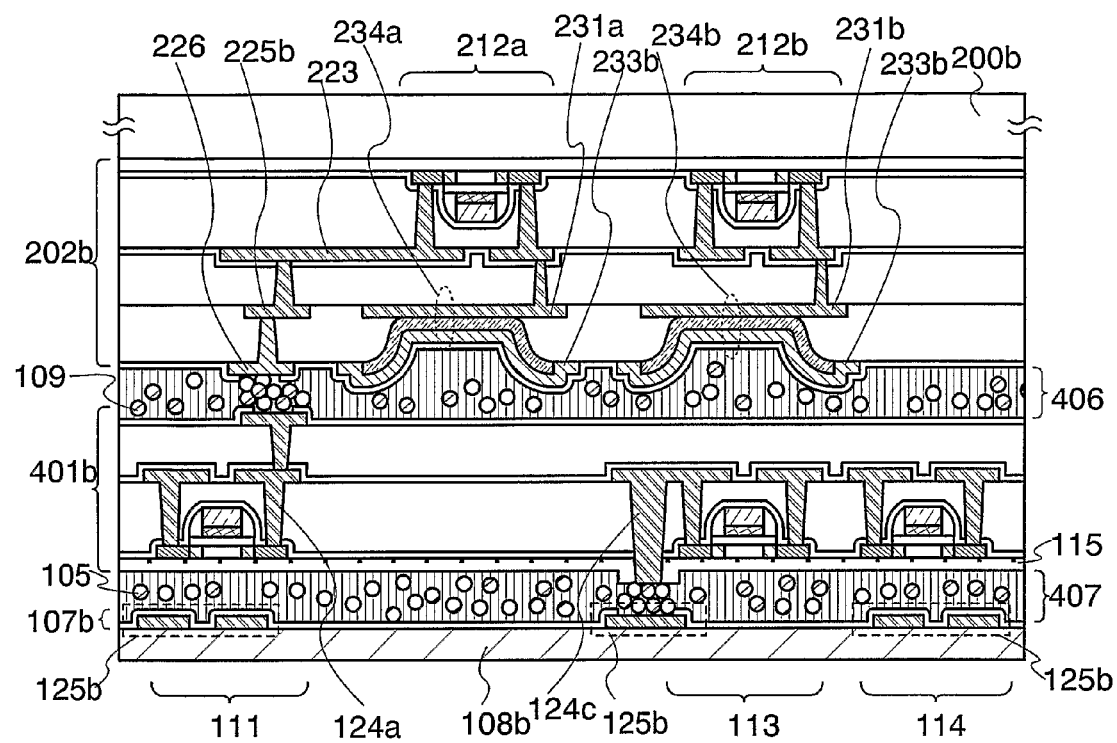
FIGS. 30A and 30B are views each of which shows a semiconductor device of the invention.
Figure 30B:
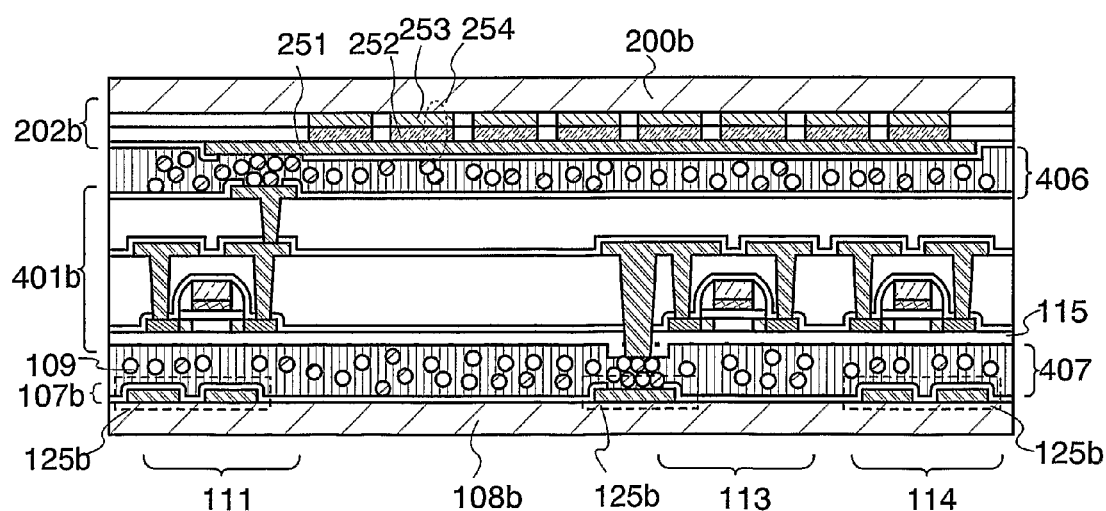

Description is made with reference to FIGS. 30A and 30B on a sectional structure of a semiconductor device of the invention with a structure shown in FIG. 26D.

As shown in FIG. 30A, the element forming layer 202b including the memory element is formed over the substrate 200b. The element forming layer 401b including the plurality of transistors and the element forming layer 202b including the memory element are attached through an adhesive layer 406 including the conductive particles 109. The element forming layer 401b including a plurality of transistors includes the TFTs 111, 113, and 114 of which structures are as described above. The connecting terminal connected to the conductive layer 124a which functions as the source wiring or drain wiring of the TFT 111 is exposed on a surface. The conductive layer 124c which functions as the source wiring or drain wiring of the TFT 111 is exposed on a back surface.

In FIG. 30A, the switching TFTs 212a and 212b are connected to the memory elements 234a and 234b respectively. That is, one of the source wiring or drain wiring of the switching TFTs 212a and 212b is connected to the first conductive layers 231a and 231b respectively. The other of the source wiring or drain wiring of the switching TFTs 212a and 212b is connected to conductive layers 225b and 226 formed at the same time as the first or second conductive layer of the memory element. Here, the other of the conductive layer 223 which functions as a source wiring or a drain wiring is connected to the conductive layer 226 through the conductive layer 225b.

The conductive layer 223 which functions as a source wiring or a drain wiring of the switching TFT 212a of the memory element and the conductive layer 124a which functions as the source wiring or the drain wiring of the TFT 111 which forms a circuit to operate the memory element are electrically connected through the conducive particles 105 and conductive layers.

The element forming layer 401b including the plurality of transistors and the element forming layer 107b including the conductive layer 125b formed over the substrate 108b are attached by an adhesive layer 407 containing the conductive particles 105. The conductive layer 124c which functions as the source wiring or drain wiring of the TFT 113 is electrically connected to the conductive layer 125b which functions as an antenna through the conductive particles 105 in the adhesive layer 407.

The memory elements 234a and 234b shown in FIG. 30A are provided with the switching TFTs 212a and 212b respectively. That is, an active matrix memory circuit is provided. As shown in FIG. 30B, a substrate being provided with the memory element 254 formed of the first conductive layer 251, the organic compound layer or phase change layer 252, and the second conductive layer 253 may be attached as well. Such a memory element forms a passive matrix memory circuit.

In the aforementioned embodiment mode, a circuit to operate the memory element is formed in the element forming layer 401b including a plurality of transistors, however, the invention is not limited to this. For example, the circuit to operate the memory element may be formed in the element forming layer 202b including the memory element.

In FIG. 30A, the element forming layer 202b including the memory element is formed over the substrate 200b, however, the element forming layer 202b including the memory element may be attached to a substrate through the adhesive layer.

According to the semiconductor device of the invention, a step of forming an element forming layer including a plurality of transistors, a step of forming an element forming layer including a memory circuit, and a step of forming a conductive layer which function as an antenna can be independently performed in parallel. Therefore, a semiconductor device can be manufactured efficiently in a short time. When an element forming layer including a plurality of transistors, a memory element, and a conductive layer which function as an antenna are formed, a performance of each circuit is checked and sorted, thereby the element forming layers each including the plurality of transistors, the memory element or the like can be electrically connected to complete the semiconductor device.

Therefore, a ratio that a defective is manufactured can be suppressed, leading to improve the yield.

Embodiment Mode 11

In this embodiment mode, description is made on a sectional structure of a semiconductor device of the invention with a different structure from in the aforementioned embodiment mode. More specifically, description is made with reference to FIGS. 26E and 32 on a sectional structure of a semiconductor device with a structure in which an element forming layer 602b including a memory element is formed over an element forming layer 601b including a plurality of transistors, and the element forming layers 601b and 602b are formed over substrate 108b being provided with an antenna.

A semiconductor device of this embodiment mode has a structure in which the element forming layer 601b including the plurality of transistors and the substrate 108b over which an antenna is formed are attached by an adhesive layer. Further, a semiconductor device of this embodiment mode has a structure in which an element forming layer 602b including a memory element is attached to the element forming layer 601b including the plurality of transistors by an adhesive layer.

Here, the element forming layer 601b including a plurality of transistors is typically formed of the regions 102 and 103 each of which includes the plurality of TFTs and the conductive layer 105 which functions as the antenna. The element forming layer 602b including a memory element is formed of the region 104 including the memory element. The region 104 including the memory element is electrically connected to the region 103 including the plurality of TFTs which form a control circuit, an interface, and the like.

Figure 26E:
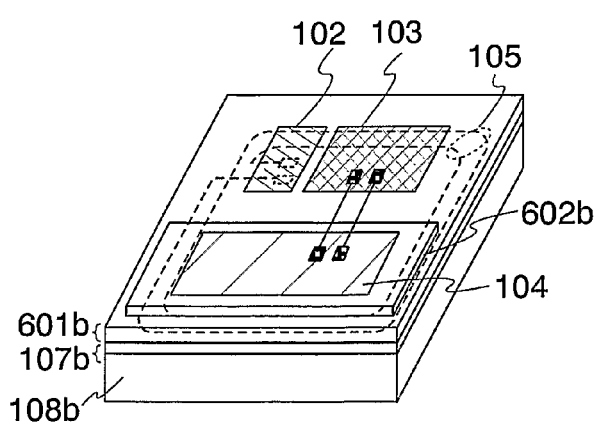
Figure 32:
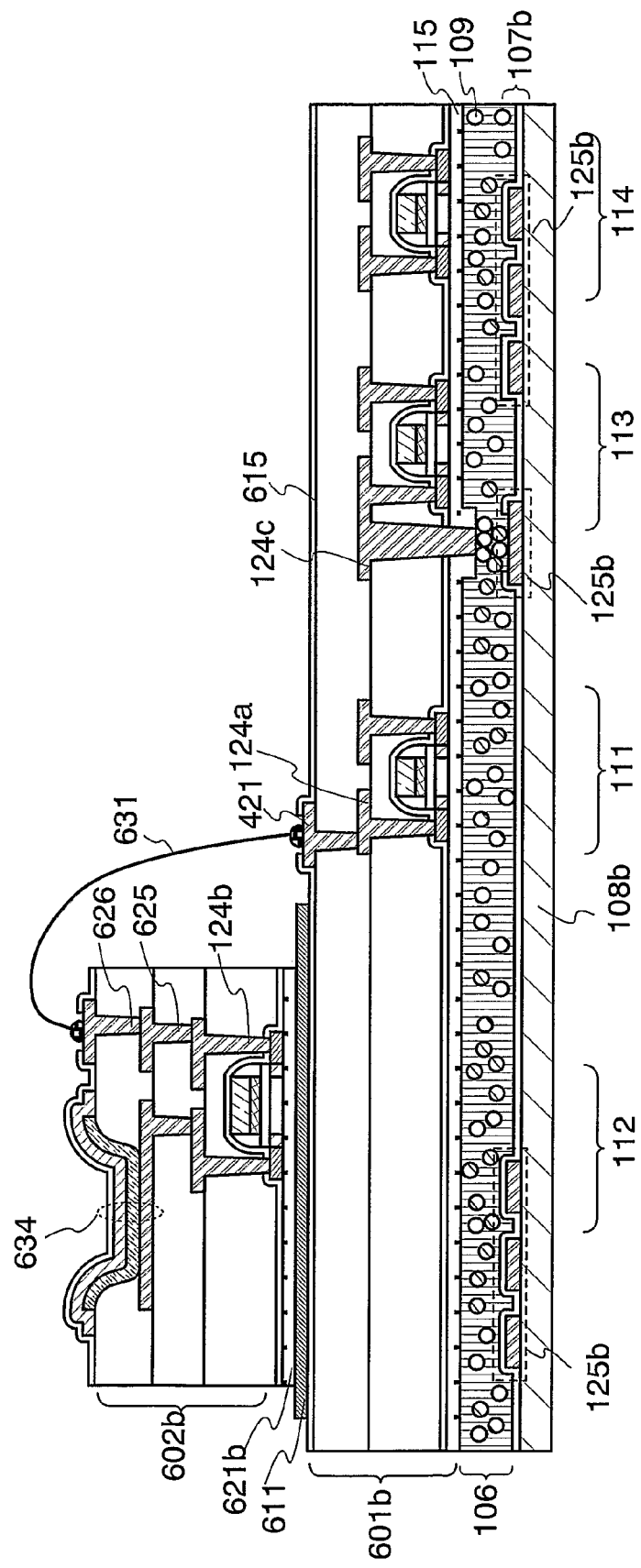
FIG. 32 is a view showing a semiconductor device of the invention.

Description is made with reference to FIG. 32 on a sectional structure of a semiconductor device of the invention with a structure shown in FIG. 26E.

As shown in FIG. 32, the element forming layer 601b including the plurality of TFTs includes TFTs 111, 113, and 114 of which structures are as described above. Further, an insulating layer 621b over which the element forming layer 602b including a memory element is formed is mounted over an insulating layer 615 by an adhesive layer 611.

The element forming layer 601b including the plurality of transistors and the element forming layer 107b including the antenna are attached by the adhesive layer 106. In specific, the insulating layer 115 and the element forming layer 107b including the antenna are attached by the adhesive layer 106. The conductive layer 124c which functions as the source wiring or the drain wiring of the TFT 113 in the element forming layer 601b including the plurality of transistors is electrically connected to the conductive layer 125b which functions as the antenna in the element forming layer 107b through the conductive particle 109 of the adhesive layer 106.

In FIG. 32, the switching TFT 112 is connected to the memory element 634. That is, one of the source wiring or the drain wiring of the switching TFT 112 is connected to a first conductive layer of the memory element 634. The other of the source wiring or drain wiring of the switching TFT 112 is connected to a conductive layer formed at the same time as a first or second conductive layer of the memory element. Here, the other of the conductive layers 124b which functions as the source wiring or the drain wiring is connected to the conductive layer 626 through the conductive layer 625. The conductive layer 625 is at the same time as the first conductive layer of the memory element. The conductive layer 626 is at the same time as the second conductive layer of the memory element and functions as a connecting terminal.

The switching TFT 112 of the memory element 634 formed in the element forming layer 602b including the memory element and the TFT 111 which forms a circuit to operate the memory element formed in the element forming layer 601b including a plurality of TFTs are electrically connected through the conductive material 631.

Figure 33:
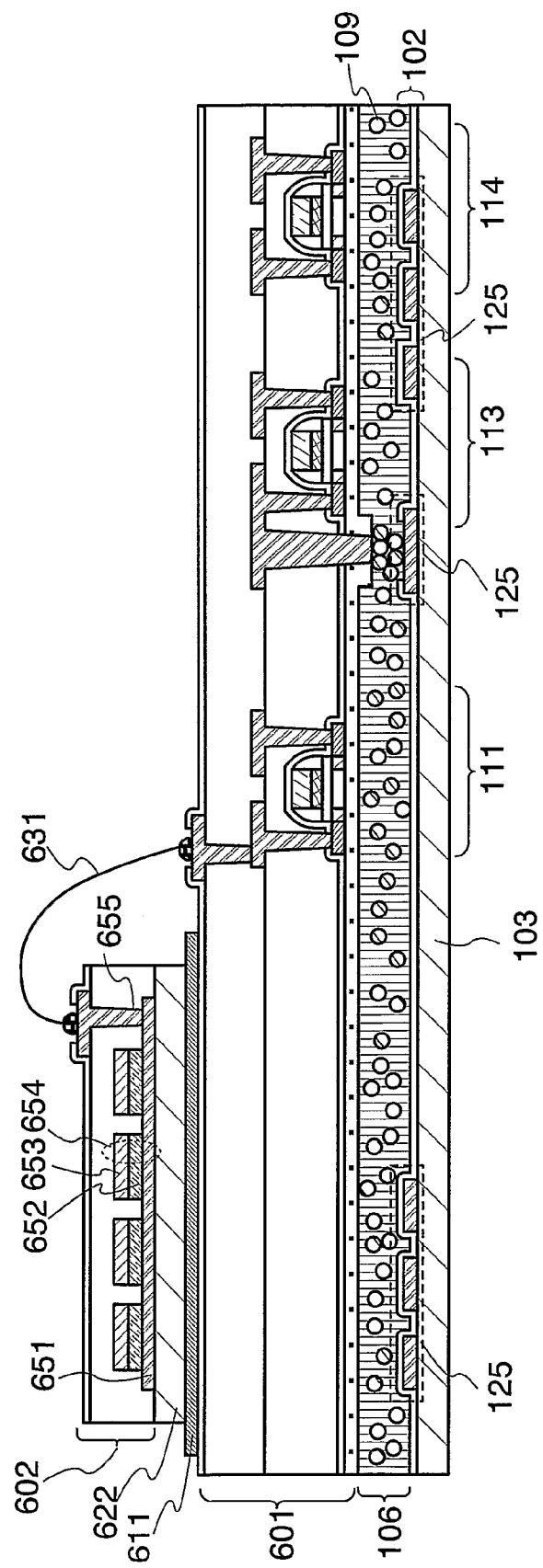
FIG. 33 is a view showing a semiconductor device of the invention.

The memory element 634 shown in FIG. 32 is provided with the switching TFT 112. As show in FIG. 33, a substrate 622 being provided with a memory element 654 formed of the first conductive layer 651, the organic compound layer or phase change layer 652, and the second conductive layer 653 instead of a memory element with a TFT may be mounted over the substrate 103 by the adhesive layer 611.

In this embodiment mode, the element forming layer 602 including a memory element is mounted over the element forming layer 601, however, the invention is not limited to this. An element forming layer including a memory element and an antenna or an element forming layer including an antenna may be mounted over the element forming layer 601 as well.

According to the semiconductor device of the invention, a layer including a memory element is stacked over an element forming layer including a plurality of TFTs. Accordingly, a compact semiconductor device can be provided. Further, a step of forming an element forming layer including a plurality of transistors, a step of forming an element forming layer including a memory element, and a step of forming a conductive layer which functions as an antenna can be independently performed in parallel. Therefore, a semiconductor device can be manufactured efficiently in a short time. When an element forming layer including a plurality of transistors and a memory element are formed, a performance of each circuit is checked and sorted, thereby the element forming layer including the plurality of transistors and the memory element can be electrically connected to complete the semiconductor device. Therefore, a ratio that a defective is manufactured can be suppressed, leading to improve the yield.

Embodiment Mode 12

In this embodiment mode, description is made with reference to the drawings on a manufacturing method of a semiconductor device. Here, a manufacturing method of a semiconductor device shown in FIG. 27A of Embodiment Mode 7 is described, however, this embodiment mode can be applied to the semiconductor device described in each embodiment mode.

Figure 34A:
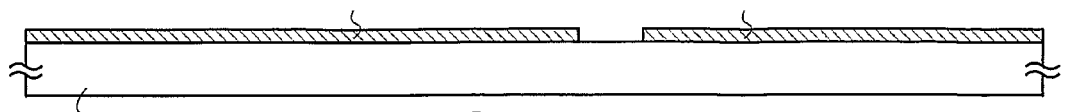
FIGS. 34A to 34E are views showing a manufacturing method of a semiconductor device of the invention.

As shown in FIG. 34A, the peeling layers 1101 and 1102 are formed over one surface of the substrate 1100 similarly to Embodiment Mode 6.

Figure 34B:
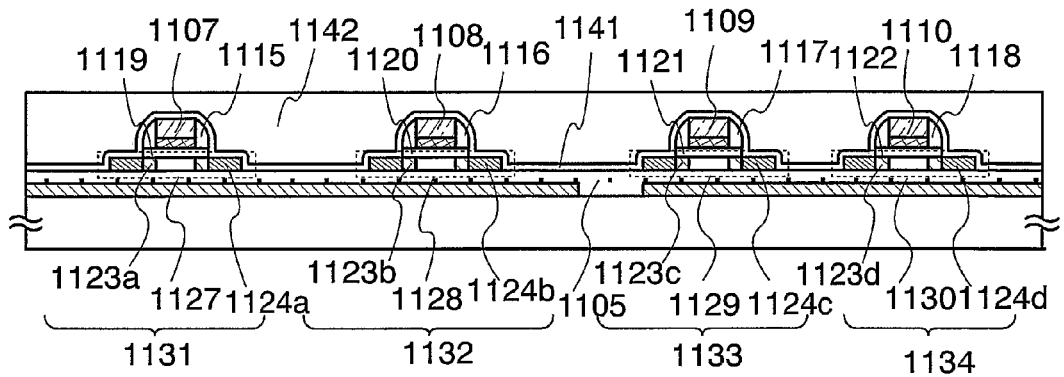

Subsequently, as shown in FIG. 34B, an insulating layer 1105 as a base is formed so as to cover the peeling layers 1101 and 1102 similarly to Embodiment Mode 6. After forming an amorphous semiconductor layer over the insulating layer 1105, the amorphous semiconductor layer is crystallized by a known crystallization method to form a crystalline semiconductor layer. After that, the crystalline semiconductor layer is etched into a desired shape to form the crystalline semiconductor layers 1127 to 1130. Then, a gate insulating layer is formed so as to cover the crystalline semiconductor layers 1127 to 1130. Then, first and second conductive layers are stacked over a gate insulating layer. A mask of resist is formed by the photolithography method and etching treatment is applied thereto for forming a gate electrode, thereby the conductive layers 1107 to 1110 are formed. Subsequently, impurity elements which impart n-type conductivity are added to the crystalline semiconductor layers 1127 to 1130 at a low concentration by the ion doping method or ion implanting method, thereby n-type impurity regions are formed. Subsequently, an insulating layer 1141 is formed so as to cover the insulating layer and the conductive layers 1107 to 1110.

Subsequently, the insulating layer is selectively etched by anisotropic etching mainly in a perpendicular direction similarly to Embodiment Mode 6, thereby the sidewall insulating layers 1115 to 1118 in contact with sides of the conductive layers 1107 to 1110 are formed. By the etching step for forming the sidewall insulating layers 1115 to 1118, the insulating layer is also etched, thereby the gate insulating layers 1119 to 1122 are formed. Subsequently, impurity elements which impart n-type conductivity are added to the crystalline semiconductor layers 1127 to 1130 with the sidewall insulating layers 1115 to 1118 as masks, thereby the first n-type impurity regions (also referred to as LDD region) 1123a to 1123d and the second n-type impurity regions (also referred to as source regions and drain regions) 1124a to 1124d are formed. The first n-type impurity regions 1123a to 1123d contain lower concentration of impurity elements than the second n-type impurity regions 1124a to 1124d.

Through the aforementioned steps, the n-type TFTs 1131 to 1134 are formed.

Subsequently, an insulating layer 1142 is formed in a single layer or stacked layers so as to cover the TFTs 1131 to 1134.

Figure 34C:
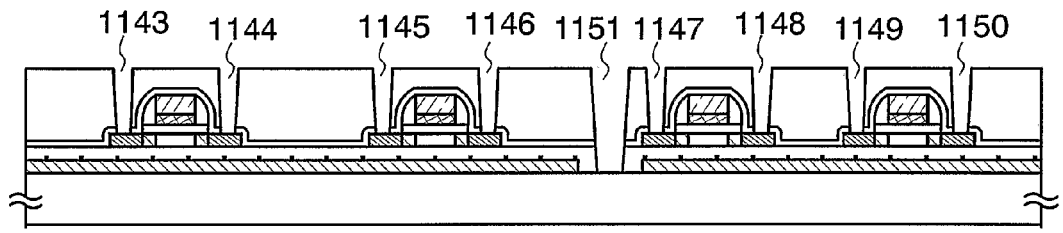

Subsequently, the insulating layers 1141 to 1142 are etched by the photolithography method, thereby contact holes 1143 to 1150 which expose the n-type impurity regions 1124a to 1124d are formed similarly to Embodiment Mode 6 as shown in FIG. 34C. At this time, the contact hole 1151 exposes a portion of the substrate 1101 as the insulating layer 1105 is etched as well as the insulating layers 1141 and 1142.

Figure 34D:
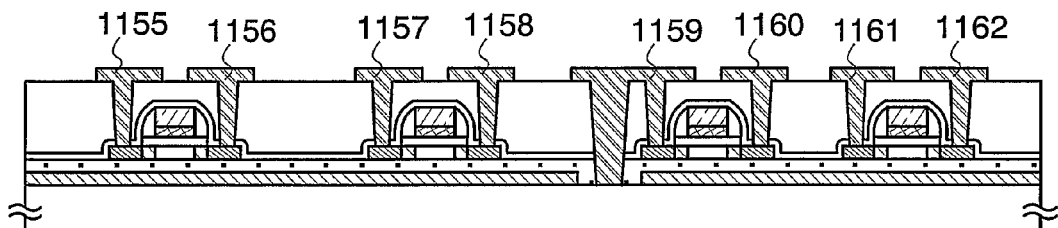

Subsequently, as shown in FIG. 34D, a conductive layer is formed so as to fill the contact holes 1143 to 1151 and the conductive layer is patterned to form the conductive layers 1155 to 1162. The conductive layers 1155 to 1162 function as a source wiring or a drain wiring of TFTs. The conductive layer 1159 reaches a surface of the substrate. The conductive layer 1159 does not contact the peeling layers 1101 and 1102 but contact the insulating layers 1105, 1141, and 1142. Accordingly, the conductive layer 1159 is not removed by an etchant when removing the peeling layers 1101 and 1102 by the etchant.

Figure 34E:
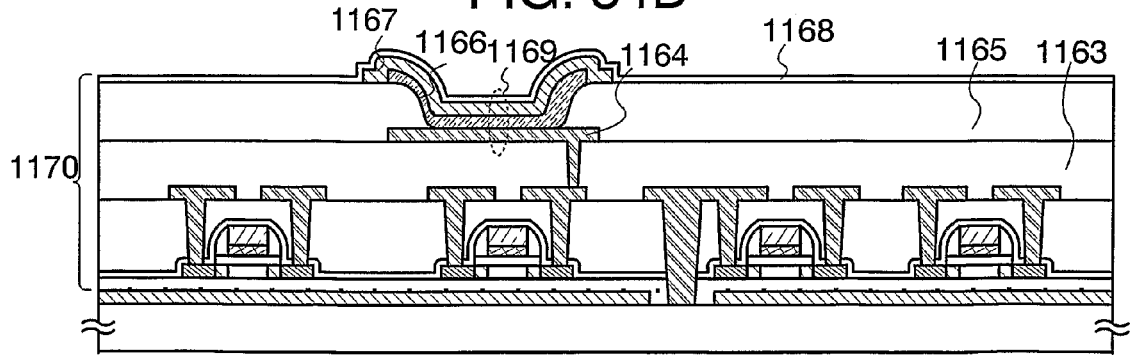

Subsequently, the insulating layer 1163 is formed in a single layer or stacked layers so as to cover the conductive layers 1155 to 1162 similarly to Embodiment Mode 6 as shown in FIG. 34E. The insulating layer 1163 which covers the conductive layers 1154 to 1162 can be formed by using similar method and material to the insulating layer 1142 covering the thin film transistor. Subsequently, a contact hole is formed in the insulating layer 1163 covering the conductive layers 1154 to 1162, and then the conductive layer 1164 is formed. The conductive layer 1164 functions as a first conductive layer of a memory element to be formed later.

Subsequently, after forming the insulating layer 1165 so as to cover an edge portion of the conductive layer 1164 the organic compound layer or phase change layer 1166 and the conductive layer 1167 are formed. The conductive layer 1164, the organic compound layer or phase change layer 1166 and the conductive layer 1167 form the memory element 1169. The conductive layer 1164 functions as a second conductive layer of the memory element 1169. After that, the insulating layer 1168 may be formed.

Figure 35A:
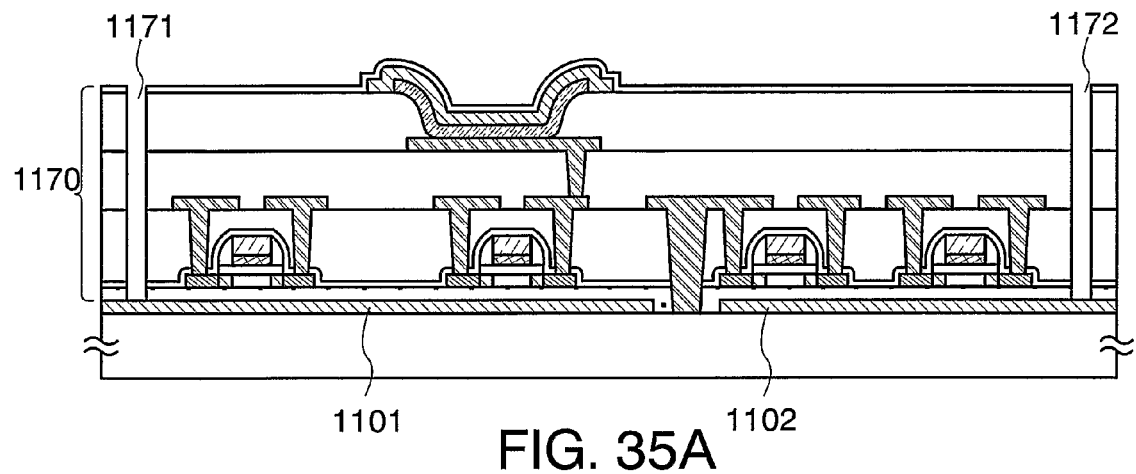
FIGS. 35A to 35C are views showing a manufacturing method of the semiconductor device of the invention.

Subsequently, as shown in FIG. 35A, the insulating layers 1105, 1141, 1142, 1163, and 1168 are etched by using the photolithography method to expose the peeling layers 1101 and 1102, thereby the opening portions 1171 and 1172 are formed similarly to Embodiment Mode 6.

Figure 35B:
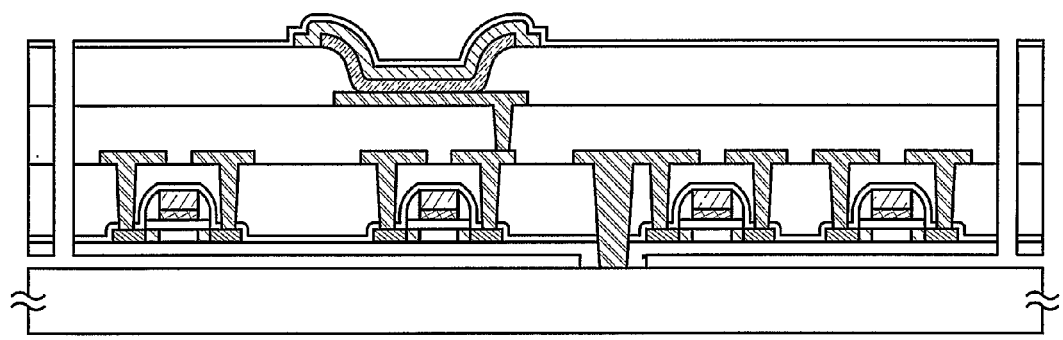

Subsequently, as shown in FIG. 35B, an etchant is put in the opening portions 1171 and 1172, thereby the peeling layers 1101 and 1102 are removed similarly to Embodiment Mode 6.

Figure 35C:
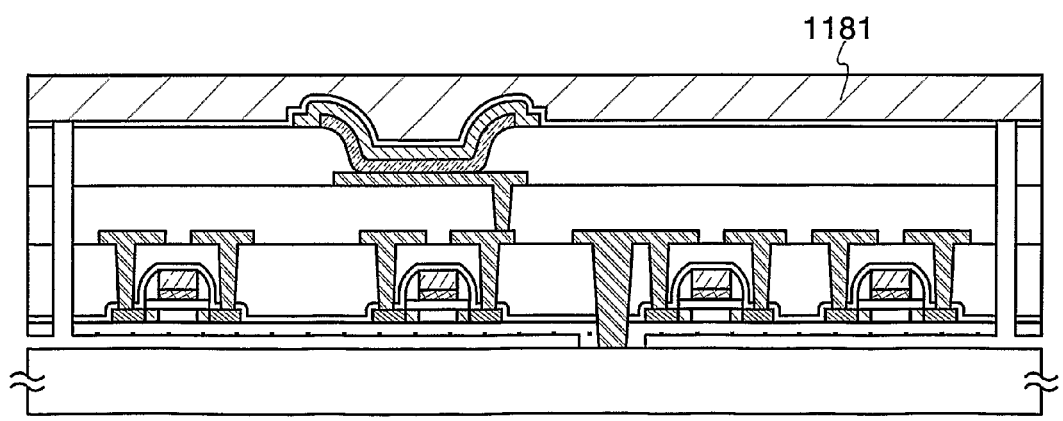
Figure 36A:
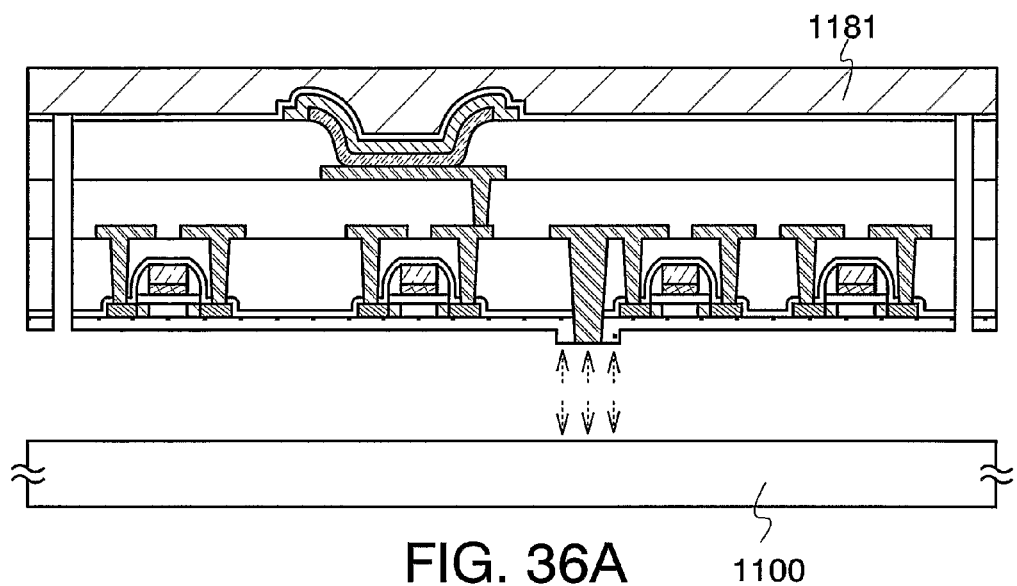
FIGS. 36A and 36B are views showing a manufacturing method of the semiconductor device of the invention.

Subsequently, as shown in FIG. 35C, a surface having a memory element of the element forming layer 1170 including the plurality of transistors is adhered to the substrate 1181, and then the element forming layer 1170 including the plurality of transistors is completely peeled off the substrate 1100 (see a sectional view of FIG. 36A) similarly to Embodiment Mode 6.

Figure 36B:
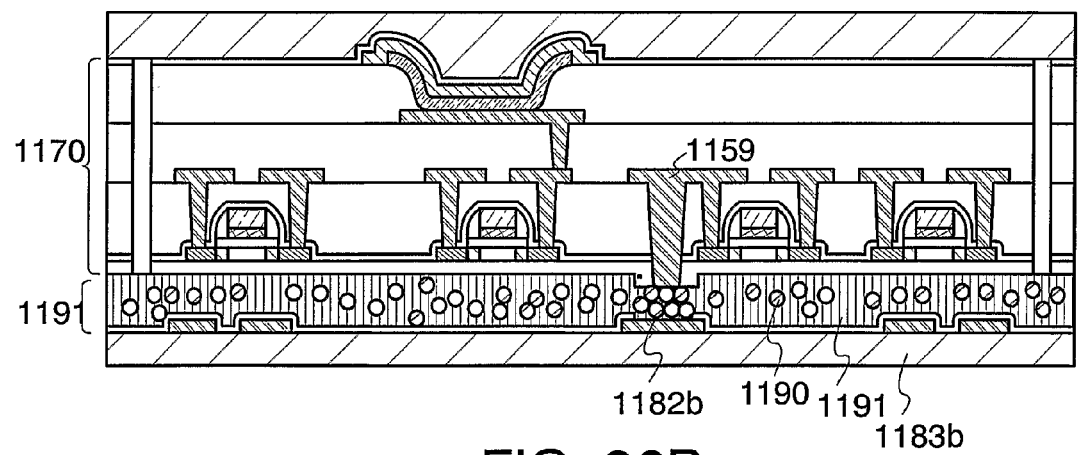

Subsequently, as shown in FIG. 36B, the other surface of the element forming layer 1170 including the plurality of transistors is adhered to the substrate 1183b provided with a conductive layer 1182b. At this time, an adhesive layer 1191 containing conductive particles 1900 is used. Further, the element forming layer 1170 including the plurality of transistors and the substrate 1183b are adhered so that the conductive layer 1159 which functions as a source wiring or a drain wiring of a TFT 1133 and a conductive layer 1182b over a substrate 1183b contact through conductive particles 1190.

Subsequently, the element forming layer 1170 including the plurality of transistors, the substrates 1181 and 1183b adhered to each other are cut by a slicing device, a laser irradiation apparatus or the like.

Through the aforementioned steps, a semiconductor device having a function to communicate data without contact can be provided.

Further, the element forming layer 1170 including the plurality of transistors and the substrate 1183 are cut after being adhered to complete a semiconductor device, however, the invention is not limited to this. After the element forming layer 1170 including the plurality of transistors and the substrate 1181 are adhered and cut, the substrate 1183 including the conductive layer 1182b may be adhered to the element forming layer 1170 including the plurality of transistors.

In this manner, a semiconductor device of the invention being compact, thin, lightweight, and flexible can realize various applications and does not disturb the design of the object even when attached thereto.

Embodiment Mode 13

Next, description is made with reference to the drawings on the configuration and operation of a memory circuit included in a semiconductor device of the invention. A memory circuit of the invention includes a memory cell array 22 in which memory cells 21 are arranged in matrix, decoders 23 and 24, a selector 25, and a reader/writer circuit 26. The memory cell 21 includes a memory element 30 (see FIG. 12A).

Figure 13A:
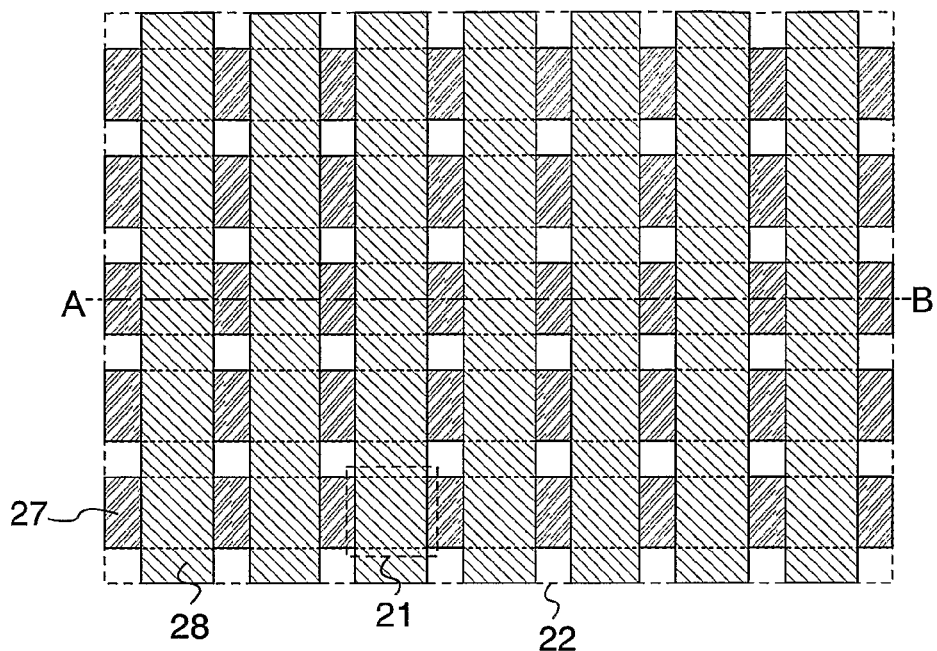
FIGS. 13A to 13C are diagrams each of which shows a memory element of the invention.
Figure 13B:
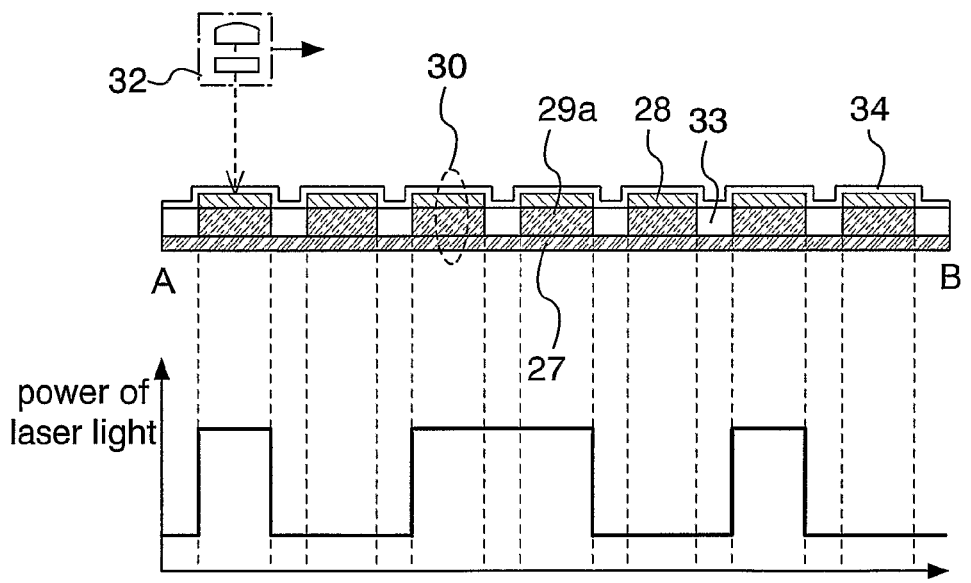

The memory element 30 includes a first conductive layer 27 which forms a word line Wy ($1 \leq y \leq n$), a second conductive layer 28 which forms a bit line Bx ($1 \leq x \leq m$), and an organic compound layer or a phase change layer provided between the first conductive layer 27 and the second conductive layer 28 (see FIG. 13A). As shown in FIG. 13B, an insulating layer 33 is provided between the adjacent organic compound layers or phase change layers 29. Further, an insulating layer 34 is provided over the memory element 30. The first conductive layer 27 which forms the word line Wy is provided so as to extend in a first direction while the second conductive layer 28 which forms the bit line Bx is provided so as to extend in a second direction which is perpendicular to the first direction. That is, the first conductive layer 27 and the second conductive layer 28 are provided in a stripe shape so as to cross each other.

There is a case where data is written to the memory element 30 by an optical effect depending on a structure of the organic compound layer or phase change layer 29. In such a case, it is required that one or both of the first conductive layer 27 and the second conductive layer 28 transmit light. The conductive layer which transmits light is formed of a conductive material which transmits light such as an indium tin oxide (ITO) or formed thin enough to transmit light when a conductive material which transmits light is not used.

Figure 12A:
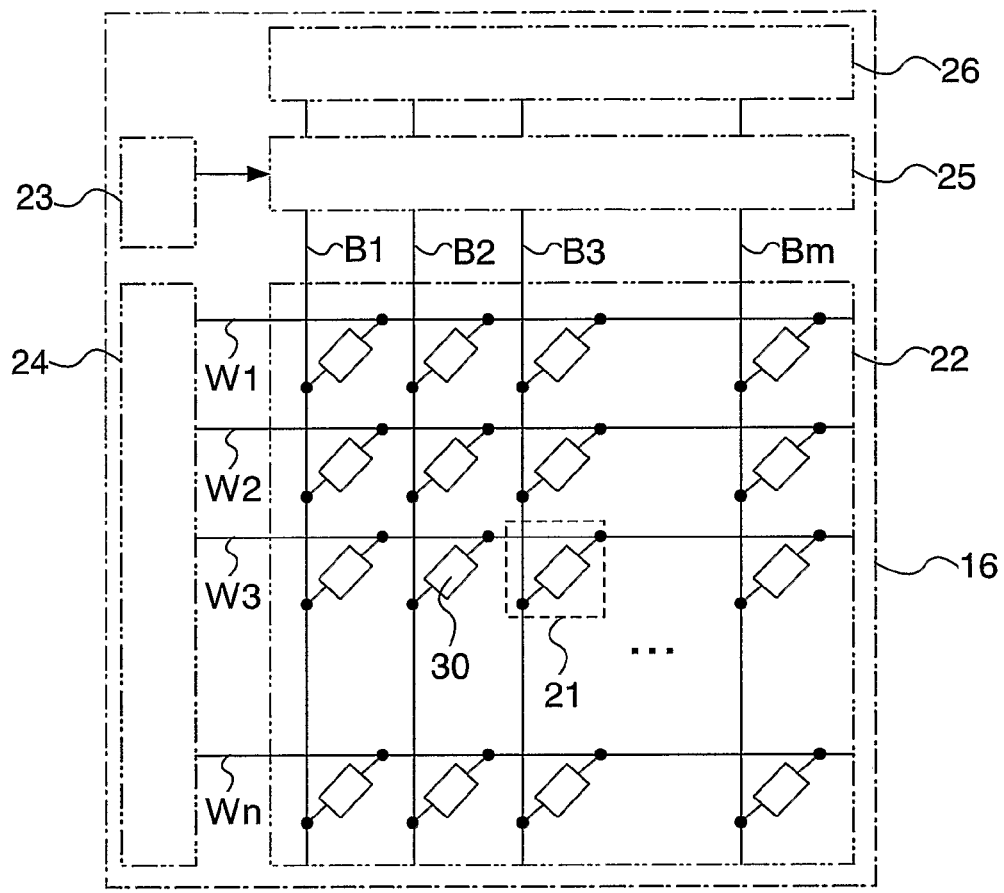
FIGS. 12A to 12C are diagrams each of which shows a memory circuit of the invention.
Figure 14A:
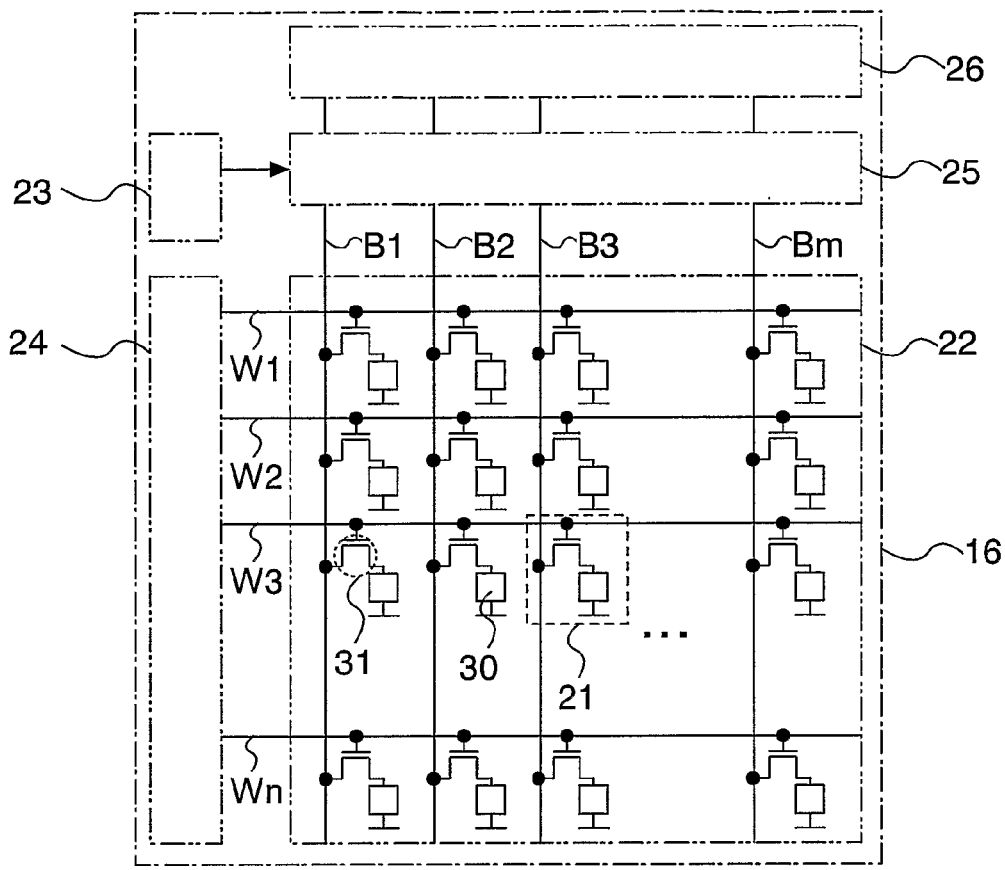
FIGS. 14A to 14C are diagrams each of which shows a memory circuit of the invention.

An equivalent circuit diagram shown in FIG. 12A is a passive matrix type, however, an active matrix type in which a transistor 31 is provided in the memory cell 21 may be employed as well (see FIG. 14A). In that case, a gate electrode of the switching transistor 31 is connected to the word line Wy ($1 \leq y \leq n$) and one of a source electrode and a drain electrode is connected to the bit line Bx ($1 \leq x \leq m$) while the other is connected to one conductive layer of the memory element 30.

An organic compound material is a typical example of the organic compound layer or the phase change layer 29a. Hereinafter, a layer formed of an organic compound material is referred to as an organic compound layer.

The organic compound layer can be formed of a substance having a high hole transporting property which are typically an aromatic amine-based (i.e., which has a benzene ring-nitrogen bond) compound such as 4,4'-bis(N-[1-naphthyl]-N-phenyl-amino)-biphenyl (abbreviation: α-NPD), 4,4'-bis(N-[3-methylphenyl]-N-phenyl-amino)biphenyl (abbreviation: TPD), 4,4',4"-tris(N,N-diphenyl-amino)-triphenylamine (abbreviation: TDATA), 4,4',4"-tris(N-[3-methylphenyl]-N-phenyl-amino)-triphenylamine (abbreviation: MTDATA), and 4,4'-bis(N-(4-[N,N-di-m-tolylamino]phenyl)-N-phenylamino)biphenyl (abbreviation: DNTPD), a phthalocyanine compound such as phthalocyanine (abbreviation: H2Pc), copper phthalocyanine (abbreviation: CuPc) and vanadyl phthalocyanine (abbreviation: VOPc).

Besides, as other organic compound materials, a material having a high electron transporting property can be used. For example, a metal complex having a quinoline skeleton or a benzoquinoline skeleton such as tris (8-quinolinolato) aluminum (abbreviation: $Alq_3$), tris (4-methyl-8-quinolinolato) aluminum (abbreviation: $Almq_3$), bis(10-hydroxybenzo[h] quinolinato) beryllium (abbreviation: $BeBq_2$), bis (2-methyl-8-quinolinolato)-4-phenylphenolato-aluminum (abbreviation: BAlq) can be used. Alternatively, a metal complex having an oxazole-based or thiazole-based ligand such as bis[2-(2-hydroxyphenyl)-benzooxazolate] zinc (abbreviation: $Zn(BOX)_2$), or bis[2-(2-hydroxyphenyl)-benzothiazolate] zinc (abbreviation: $Zn(BTZ)_2$) can be used. In addition to the metal complex, 2-(4-biphenyl)-5-(4-tert-butylphenyl)-1,3,4-oxadiazole (abbreviation: PBD), 1,3-bis[5-(p-tert-butylphenyl)-1,3,4-oxadiazole-2-yl] benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1, 2,4-triazole (abbreviation: p-EtTAZ); bathophenanthroline (abbreviation BPhen), bathocuproin (abbreviation: BCP); or the like can be used.

As other organic compound materials, 4-dicyanomethylene-2-methyl-6-[-2-(1,1,7,7-tetramethyl-9-julolidyl) ethenyl)-4H-pyran (abbreviation: DCJT); 4-dicyanomethylene-2-t-butyl-6-[2-(1,1,7,7-tetramethyl-julolidine-9-yl)ethenyl]-4H-pyran; periflanthene; 2,5-dicyano-1,4-bis[2-(10-methoxy-1,1,7,7-tetramethyl-julolidine-9-yl)ethenyl] benzene, N,N?-dimethylquinacridone (abbreviation: DMQd), coumarin 6, coumarin 545T, tris (8-quinolinolato) aluminum (abbreviation: $Alq_3$), 9,9'-bianthryl, 9,10-diphenylanthracene (abbreviation: DPA), 9,10-bis(2-naphthyl)anthracene (abbreviation: DNA), 2,5,8,11-tetra-t-butylperylene (abbreviation: TBP), or the like can be used. As the material to be a base material in the case of forming the layer in which the light-emitting material is diffused, the following can be used; an anthracene derivative such as 9,10-di(2-naphtyl)-2-tert-butylanthracene (abbreviation: t-BuDNA), a carbazole derivative such as 4,4'-bis(N-carbazolyl)biphenyl (abbreviation: CBP), or a metal complex such as tris(8-quinolinolato) aluminum (abbreviation: $Alq_3$), tris(4-methyl-8-quinolinolato)aluminum (abbreviation: $Almq_3$), bis(10-hydroxybenzo [h]-quinolinato)beryllium (abbreviation: $BeBq_2$), bis(2-methyl-8-quinolinolato)-4-phenylphenolato-aluminum (abbreviation: BAlq), bis[2-(2-hydroxyphenyl)pyridinato] zinc (abbreviation: $Znpp_2$), or bis[2-(2-hydroxyphenyl)benzoxazolate]zinc (abbreviation: ZnBOX). As the material which can constitute the light-emitting layer 104 singularly, tris(8-quinolinolato)aluminum (abbreviation: $Alq_3$), 9,10-bis (2-naphtyl)anthracene (abbreviation: DNA), or bis(2-methyl-8-quinolinolato)-4-phenylphenolato-aluminum (abbreviation: BAlq) or the like can be used.

Semiconductor oxide or a metal oxide may be added to the aforementioned organic compound. The semiconductor oxide or metal oxide are specifically a molybdenum oxide ($MoO_x$), vanadium oxide ($VO_x$), ruthenium oxide ($RuO_x$), tungsten oxide ($WO_x$), cobalt oxide ($Co_x$), nickel oxide ($Nio_x$), copper oxide ($CuO_x$), and the like. Besides, indium tin oxide (ITO), zinc oxide (ZnO) and the like can also be used.

For an organic compound layer, a material which changes electric resistance by an optical effect can be used. For example, a conjugated polymer doped with a compound (photoacid generator) which generates acid by absorbing light can be used. As a conjugated polymer, polyacetylene, poly(phenylene vinylene), polythiophene, polyaniline, poly (phenylene ethynylene), and the like can be used. As a photoacid generator, aryl sulfonium salts, aryl iodonium salts, o-nitrobenzyl tosylate, aryl sulfonic acid p-nitrobenzyl ester, sulfonyl acetophenone, Fe-allene complex $PF_6$ salt and the like can be used.

Next, description is made on an operation to write data to a memory circuit with the aforementioned structure. Data is written by an optical effect or an electrical effect. The optical effect is obtained by external light irradiation and the electrical effect is obtained by applying voltage which is higher than the predetermined to the first conductive layer and the second conductive layer.

When writing data "1" to the memory cell 21, the memory cell 21 is selected by the decoders 23 and 24 and the selector 25. In specific, a predetermined voltage V2 is applied to a word line W3 connected to the memory cell 21 by the decoder 24. By the decoder 23 and the selector 25, a bit line B3 connected to the memory cell 21 is connected to the reader/writer circuit 26. Then, a write voltage V1 is output to the bit line B3 from the reader/writer circuit 26. In this manner, voltage Vw=V1−V2 is applied between the first conductive layer and the second conductive layer which form the memory cell 21. By selecting the voltage Vw appropriately, the organic compound layer or the phase change layer 29 provided between the conductive layers is physically or electrically changed, thereby the data "1" is written. In specific, it is preferable that electric resistance between the first and second conductive layers when the data "1" is written become far smaller than that when data "0" is written. For example, (V1, V2) may be selected from the range (0 V, 5 to 15 V) or (3 to 5 V, −12 to −2 V). The voltage Vw may be 5 to 15 V or −5 to −15 V.

The word line and bit line which are not selected are controlled so that the data "1" is not written to the memory cell connected thereto. For example, the word line and bit line which are not selected may be set in floating states. The first conductive layer and the second conductive layer are required to have diode characteristics and the like by which lines can be accurately selected.

On the other hand, when writing data "0" to the memory cell 21, an electric effect has not to be applied to the memory cell 21. In the circuit operation, the memory cell 21 is selected by the decoders 23 and 24, and the selector 25 similarly to the case where data "1" is written. An output potential from the reader/writer circuit 26 to the bit line B3 is set at an equivalent level to a potential of the selected word line W3 or the non-selected word line and a voltage (for example, −5 to 5 V) which does not change electric characteristics of the memory cell 21 may be applied between the first conductive layer and the second conductive layer which form the memory cell 21.

Next, description is made on the case of writing data by an optical effect (see FIG. 13B). In this case, data is written by irradiating an organic compound layer with laser light by a laser irradiation apparatus 32 from the conductive layer side which transmits light (the second conductive layer 28 here). More specifically, the organic compound layer of the selected memory element 30 is irradiated with laser light to destroy the organic compound layer. The destroyed organic compound layer is insulated and has higher resistance as compared to other memory elements 30. In this manner, data is written by utilizing the phenomenon that electric resistance of the memory element 30 changes by the laser light irradiation. For example, in the case where the memory element 30 irradiated with no laser light has data "0", data "1" can be written by irradiating the memory element 30 with laser light to destroy and increase electric resistance thereof.

The invention is not limited to the mode where data is written by insulating the organic compound layer by irradiating the memory element 30 with laser light, but data may be written by changing resistance of the memory element 30 by insulating and destroying the organic compound layer by laser light irradiation to the memory element 30 by controlling the element structure of the memory element 30 and the intensity of the laser light. In this case, the memory element 30 of which pair of conductive layers are short-circuited has drastically lower resistance than the other memory elements 30. In this manner, data may be written by utilizing the phenomenon that resistance of the memory element 30 changes by an optical effect.

In the case of using a conjugated polymer doped with a compound (photoacid generator) which generates acid by absorbing light as the organic compound layer, electric resistance of a portion irradiated with laser light changes but resistance of a portion irradiated with no laser light does not change. In this case also, data is written by utilizing the phenomenon that resistance of the memory element 30 changes by irradiating the selected organic compound layer with laser light. For example, provided that the memory element 30 irradiated with no laser light has data "0", data "1" can be written thereto by irradiating the selected memory element 30 with laser light to change electric resistance thereof.

Figure 12B:
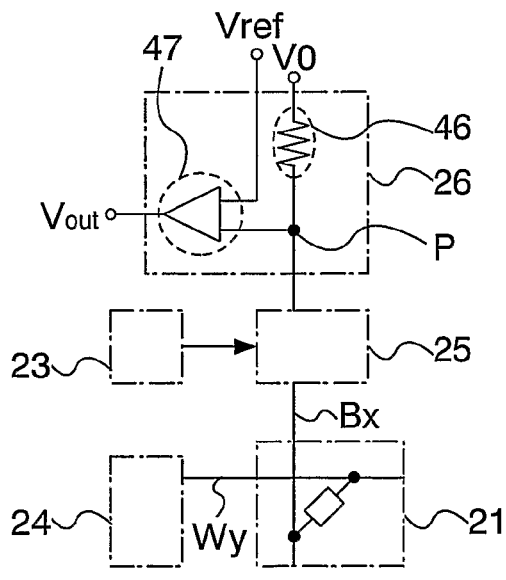
Figure 12C:
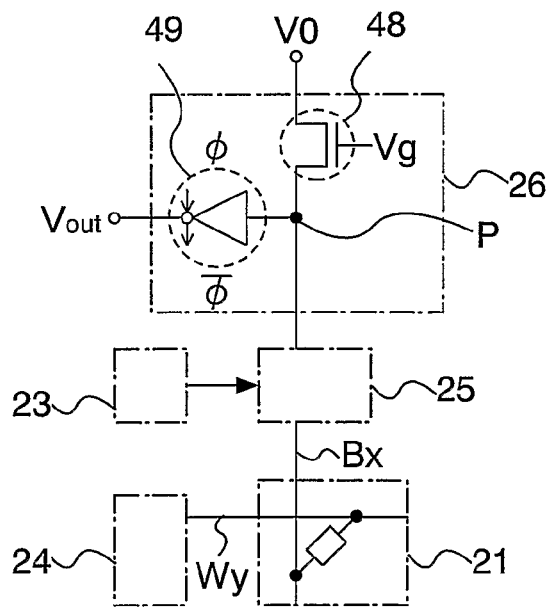

Next, description is made on an operation in the case of reading data (see FIGS. 12B and 12C). Data is read by utilizing the phenomenon that electric characteristics of the first and second conductive layers which form a memory cell differ between a memory cell having data "0" and a memory cell having data "1". For example, description is made on a method for reading data by utilizing a difference in electric resistance when effective electric resistance between the first and second conductive layers (hereinafter simply referred to as electric resistance of a memory cell) which form the memory cell having data "0" is R0 with a read voltage and electric resistance of the memory cell having data "1" is R1 with a read voltage. It is to be noted that R1<<R0 is satisfied. The reader/writer circuit has a reader portion with a structure such as the circuit 26 shown in FIG. 12B using a resistor 46 and a differential amplifier 47. The resistor 46 has resistance Rr and R1<Rr<R0 is satisfied. A transistor 48 may be used instead of the resistor 46 and a clocked inverter 49 may be used instead of the differential amplifier (FIG. 12C). The clocked inverter 49 is input with a signal or an inverted signal which becomes Hi when reading data and Lo when reading no data. It is needless to say that the circuit configuration is not limited to FIGS. 12B and 12C.

In the case of reading data from the memory cell 21, the memory cell 21 is selected by the decoders 23, 24, and the selector 25. In specific, a predetermined voltage Vy is applied by the decoder 24 to the word line Wy connected to the memory cell 21. Further, the bit line Bx connected to the memory cell 21 is connected to a terminal P of the reader/writer circuit 26 by the decoder 23 and the selector 25. As a result, a potential Vp at the terminal P is determined by resistive division caused by the resistor 46 (resistance Rr) and the memory cell 21 (resistance R0 or R1). Therefore, in the case where the memory cell 21 has data "0", Vp0=Vy+(V0−Vy)×R0/(R0+Rr) is satisfied. In the case where the memory cell 21 has data "1", Vp1=Vy+(V0−Vy)×R1/(R1+Rr) is satisfied. As a result, if Vref is selected so as to be between Vp0 and Vp1 in FIG. 12B and a change of the clocked inverter is selected so as to be between Vp0 and Vp1 in FIG. 12C, thereby Lo/Hi (or Hi/Lo) is output as an output voltage Vout in accordance with the data "0"/"1", thereby data can be read.

For example, the differential amplifier is operated with Vdd=3 V and thus Vy=0 V, V0=3 V, Vref=1.5 V are satisfied. Provided that R0/Rr=Rr/R1=9, when the memory cell has data "0", Vp0=2.7 V is satisfied and Hi is output as Vout. When the memory cell has data "1", Vp1=0.3 V is satisfied and Lo is output as Vout. In this manner, data can be read from the memory cell.

According to the aforementioned method, a state of electric resistance of the organic compound layer or the phase change layer 29 is read by a voltage level by utilizing a difference and resistive division of resistance. It is needless to say that a reading method is not limited to this method. For example, a difference in a current value may be utilized for reading data instead of utilizing a difference in electric resistance. Further, in the case where electric characteristics of the memory cell have diode characteristics that a threshold voltage is different between data "0" and "1", the difference in the threshold voltage may be utilized for reading data as well.

The aforementioned description can be similarly applied to the case of writing data by irradiating the organic compound layer with laser light. Data is read by electrically reading a difference between resistance of the memory element 30 to which no optical effect is applied and resistance of the memory element 30 to which an optical effect is applied.

The aforementioned description can also be similarly applied to the case of using a conjugated polymer doped with a compound (photoacid generator) which generates acid by absorbing light. Data is read by electrically reading a difference between resistance of the memory element 30 to which no optical effect is applied and resistance of the memory element 30 to which an optical effect is applied.

Further, as a typical example of the organic compound layer or the phase change layer 29, a phase change layer may be used. Here, the phase change layer is a layer formed of a material which changes reversibly between a crystalline state and an amorphous state, a material which changes reversibly between a first crystalline state and a second crystalline state, or a material which changes only from an amorphous state to a crystalline state.

In the case of using a reversible material, data can be read and written. In the case of using an irreversible material, on the other hand, data can only be read. In this manner, the phase change memory can be a read-only-memory or a readable/writable memory depending on the kind of materials. A material for the phase change layer is to be appropriately selected in accordance with the application of the semiconductor device.

A material which reversibly changes between a crystalline state and an amorphous state in the phase change layer is a material containing a plurality of elements selected from germanium (Ge), tellurium (Te), antimony (Sb), sulphur (S), tellurium oxide (TeOx), tin (Sn), gold (Au), gallium (Ga), selenium (Se), indium (In), thallium (Tl), cobalt (Co), and silver (Ag). For example, a material based on Ge—Te—Sb—S, Te—TeO$_2$—Ge—Sn, Te—Ge—Sn—Au, Ge—Te—Sn, Sn—Se—Te, Sb—Se—Te, Sb—Se, Ga—Se—Te, Ga—Se—Te—Ge, In—Se, In—Se—Tl—Co, Ge—Sb—Te, In—Se—Te, or Ag—In—Sb—Te may be used.

A material which reversibly changes between the first crystalline state and the second crystalline state is a material containing a plurality selected from silver (Ag), zinc (Zn), copper (Cu), aluminum (Al), nickel (Ni), indium (In), antimony (Sb), selenium (Se), and tellurium (Te), for example, Te—TeO$_2$, Te—TeO$_2$—Pd, and Sb$_2$Se$_3$/B$_{12}$Te$_3$. When using this material, a phase change is carried out between two different crystalline states.

In the phase change layer, a material which changes only from an amorphous state to a crystalline state is a material containing a plurality selected from tellurium (Te), tellurium oxide (TeOx), antimony (Sb), selenium (Se), and bismuth (Bi), for example, Ag—Zn, Cu—Al—Ni, In—Sb, In—Sb—Se, and In—Sb—Te.

A memory element in which a phase change layer is sandwiched between a pair of conductive layers is manufactured through simple steps, thus and inexpensive semiconductor device can be provided. A battery for holding data is not required to be provided as the phase change memory is a nonvolatile memory element. Thus, a compact, thin, and lightweight semiconductor device can be provided. By using an irreversible material for the phase change layer, data cannot be rewritten. Therefore, a high-security semiconductor device of which forgery is prevented can be provided.

Next, description is made on an operation in the case of writing data to a memory element having a phase change layer. Similarly to the memory element having an organic compound layer, a voltage is applied between the first conductive layer 27 and the second conductive layer 28 to change a phase of a phase change material, thereby data is written.

Next, description is made on the case of writing data by light (see FIG. 13B). In this case, the phase change layer is irradiated with laser light from a conductive layer side which transmits light (the second conductive layer 28 here). When the phase change layer is irradiated with laser light, a crystallographic phase change occurs in the structure. In this manner, data is written by utilizing the phenomenon that a phase of a phase change layer changes by laser light irradiation.

For example, in the case of writing data "1", the phase change layer is irradiated with laser light and heated so as to be a crystalline temperature or higher, and then cooled, thereby the phase change layer is crystallized. When writing data "0", on the other hand, the phase change layer is irradiated with laser light and heated at its fusing point or higher so as to be fused and then rapidly cooled down, thereby the phase change layer becomes an amorphous state.

The phase change of the phase change layer 29 is achieved by irradiation of laser light of which diameter is in an order of μm, depending on the size of the memory cell 21. For example, when a laser beam of which diameter is 1 μm passes through at a speed of 10 m/sec, a phase change layer included in one memory cell 21 is irradiated with laser light for 100 nsec. In order to change the phase in a time as short as 100 nsec, a laser power is preferably set 10 mW and a power density is preferably set 10 kW/mm$^2$, for example.

Irradiation of laser light to the phase change layer may be performed selectively or to all the memory cells 21. In the case where the phase change layer that is formed shortly before is in an amorphous state, for example, it is not irradiated with laser light to keep the amorphous state while it is irradiated with laser light to change into the crystalline state. That is to say, data may be written by selective irradiation of laser light as well. In this manner, when selectively irradiating laser light, it is preferable to use a pulsed oscillation laser irradiation apparatus.

As described above, according to the structure of the invention that data is written by laser light irradiation, a semiconductor device can be easily manufactured at a large quantity. Therefore, an inexpensive semiconductor device can be provided.

An operation to read data from the memory element having a phase change layer is similar to that of the memory element having an organic compound layer. A change in voltage or current can be read from a change in resistance caused by a phase state of the phase change layer.

Figure 13C:
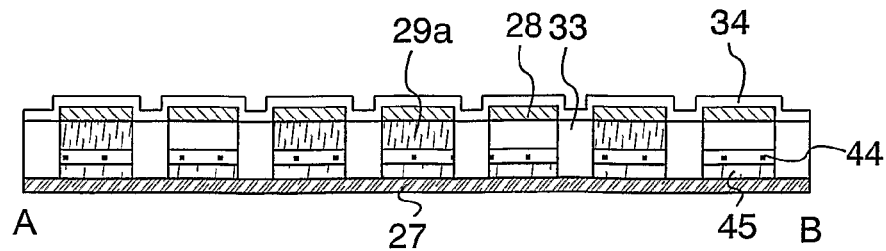

Further, as a different structure than the aforementioned, an element having a rectifying property may be provided between the first conductive layer 27 and the organic compound layer or the phase change layer 29a or between the second conductive layer 28 and the organic compound layer or the phase change layer 29 (see FIG. 13C). An element which has a rectifying property is typically a Schottky diode, a PN junction diode, a PIN junction diode, or a transistor of which a gate electrode and a drain electrode are connected. It is needless to say that a diode with another structure may be used. Here, a PN junction diode including semiconductor layers 44 and 45 is provided between the first conductive layer and a layer containing an organic compound. One of the semiconductor layers 44 and 45 is an n-type semiconductor layer while the other is a p-type semiconductor layer. In this manner, by providing an element which has a rectifying property, selectivity of a memory cell and a margin of each of reading and writing operations can be improved.

As described above, a memory circuit included in a semiconductor device of the invention includes a memory element with a simple structure in which an organic compound layer or a phase change layer is sandwiched between a pair of conductive layers. Accordingly, an inexpensive semiconductor device which can easily be manufactured and a manufacturing method thereof can be provided. Further, as high integration can be easily realized, a semiconductor device having a large capacitance memory circuit and a manufacturing method thereof can be provided.

Data is written to a memory circuit included in the semiconductor device of the invention by an optical effect or an electrical effect. That is, the memory element is a nonvolatile memory element to which data can be additionally written. Accordingly, security can be secured as forgery by rewriting data can be prevented while new data can be additionally written. Therefore, a semiconductor device in which high function and high added value are realized and a manufacturing method thereof can be provided.

Embodiment Mode 14

Next, description is made with reference to the drawings on the configuration and operation of a memory circuit included in a semiconductor device of the invention. A memory cell 21 includes a first conductive layer which forms a bit line Bx ($1 \leq x \leq m$), a second conductive layer which forms a word line Wy ($1 \leq y \leq n$), a transistor 31 and a memory cell 30. The memory cell is formed of an organic compound layer provided between a pair of conductive layers. A gate electrode of the transistor is connected to the word line, one of source or drain electrodes is connected to the bit line, and the other is connected to one terminal of the memory element. The other terminal of the memory element is connected to a common electrode (electrical potential: Vcom).

Figures 14B, 14C:
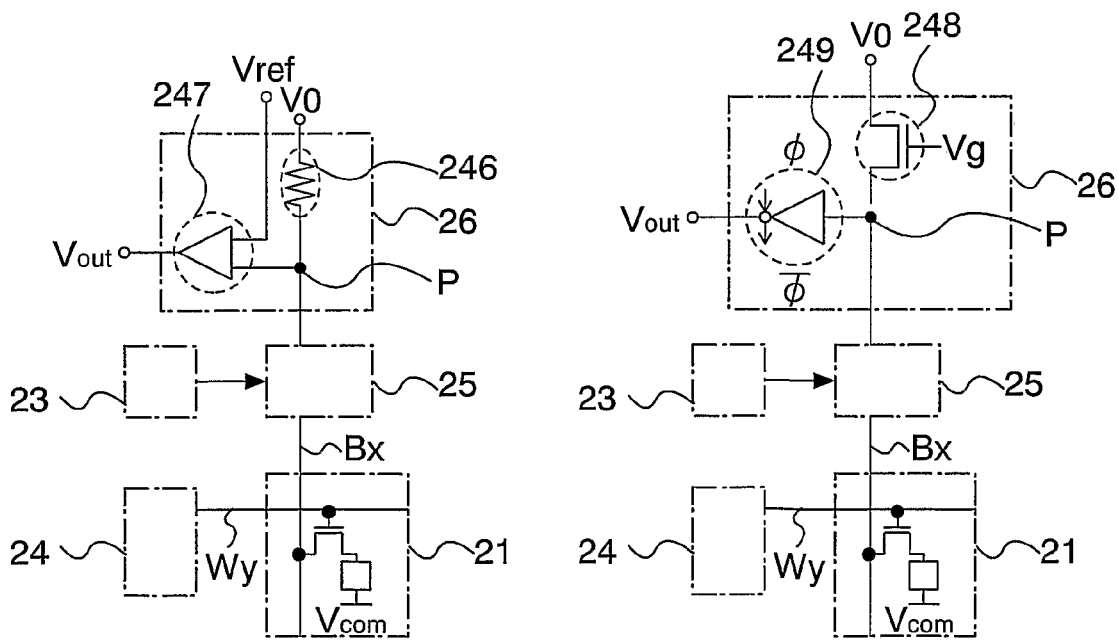

Next, description is made on the operation when data is written to the memory cell 21 (FIGS. 14B and 14C).

Firstly, description is made on the operation when data is written by an electrical effect. Note that data is written by changing the electric characteristics of the memory cell, and the initial state of the memory cell (the electric effect is not yet applied) is defined as data "0" and the state after the electric characteristics being changed is defined as data "1".

Here, description is made on the case where data is written to the y-th row and x-th column memory cell 21. When writing data "1" to the memory cell 21, the memory cell 21 is selected by the decoders 23 and 24 and the selector 25. In specific, a predetermined voltage V22 is applied by the decoder 24 to a word line Wy connected to the memory cell 21. A bit line Bx connected to the memory cell 21 is connected to the reader/writer circuit 26 by the decoder 23 and the selector 25. Then, a write voltage V21 is output to the bit line Bx from the reader/writer circuit 26.

Then, the transistor 31 constituting the memory cell 21 is turned on, the bit line is connected to the memory element 30, and a voltage Vw, which is an equivalent level to Vcom−V21, is applied to the transistor 31. Note that one of the terminals the memory element 30 is connected to the common electrode having the electrical potential of Vcom. By selecting the voltage Vw appropriately, the organic compound layer provided between the conductive layers is physically or electrically changed, thereby the data "1" is written. In specific, it is preferable that the electric resistance value between the first and second conductive layers when the data "1" is written become far smaller, for example short-circuited, than the electric resistance value when data "0" is written. The potentials (V21, V22, Vcom) may be selected from the range (5 to 15 V, 5 to 15 V, 0V) or (−12 to 0 V, −12 to 0 V, 3 to 5 V). The voltage Vw may be 5 to 15 V or −5 to −15 V.

The word line and bit line which are not selected are controlled so that the data "1" is not written to a memory cell connected thereto. Specifically, the word line which is not selected may be applied a voltage which turns off the transistor of the memory cell connected to the word line (0 V, for example), the bit line which are not selected may be set in floating states or applied the voltage at an equivalent level to a potential of Vcom.

On the other hand, when writing data "0" to the memory cell 21, an electric effect has not to be applied to the memory cell 21. In the circuit operation, the memory cell 21 is selected by the decoders 23 and 24, and the selector 25 similarly to the case where data "1" is written. An output potential from the reader/writer circuit 26 to the bit line Bx is set at an equivalent level to a potential of Vcom or the bit line Bx is set in a floating state. Accordingly, a low voltage (for example, −5 to 5 V) or no voltage is applied to the memory element 30, therefore, the electric characteristics of the memory cell do not change and data "0" is written to the memory cell.

Note that the operation is similar to the operation described in Embodiment Mode 13 in the case of writing data by optical effect.

Next, description is made on an operation in the case of reading data by an electrical effect. Data is read by utilizing the phenomenon that electric characteristics of the memory element 30 are different between a memory cell having data "0" and a memory cell having data "1". As an example, description is made on a method for reading data by utilizing a difference in electric resistance value where the electric resistance value of the memory cell having data "0" is R0 with a read voltage and that of the memory cell having data "1" is R1 with a read voltage. It is to be noted that R1<<R0 is satisfied. The reader/writer circuit has a reader portion with a structure such as the circuit 26 shown in FIG. 14B using a resistor 246 and a differential amplifier 247. The resistor 246 has resistance value Rr, and R1<Rr<R0 is satisfied. A transistor 248 may be used instead of the resistor 246 and a clocked inverter 249 may be used instead of the differential amplifier 247 (FIG. 14C). It is needless to say that the circuit configuration is not limited to FIGS. 14B and 14C.

In the case of reading data from the y-th row and x-th column memory cell 21, the memory cell 21 is selected by the decoders 23, 24, and the selector 25. In specific, a predetermined voltage V24 is applied to the word line Wy connected to the memory cell 21 by the decoder 24, and the transistor 31 is turned on. Further, the bit line Bx connected to the memory cell 21 is connected to a terminal P of the reader/writer circuit 26 by the decoder 23 and the selector 25. As a result, a potential Vp at the terminal P is determined by resistive division caused by the resistor 246 (resistance value Rr) and the memory cell 30 (resistance value R0 or R1). Therefore, in the case where the memory cell 21 has data "0", Vp0=Vcom+(V0−Vcom)×R0/(R0+Rr) is satisfied. In the case where the memory cell 21 has data "1", Vp1=Vcom+(V0−Vcom)×R1/(R1+Rr) is satisfied. Vref is selected so as to be between Vp0 and Vp1 in FIG. 14B and a changing point of the clocked inverter is selected so as to be between Vp0 and Vp1 in FIG. 14C, as a result, Lo/Hi (or Hi/Lo) is output as an output voltage Vout in accordance with the data "0"/"1", thereby data can be read.

For example, the differential amplifier is operated with Vdd=3 V and thus Vcom=0 V, V0=3 V, and Vref=1.5 V are satisfied. Provided that R0/Rr=Rr/R1=9 is satisfied and the on state resistance value of the transistor 31 is negligibly small, when the memory cell has data "0", Vp0=2.7 V is satisfied and Hi is output as Vout. When the memory cell has data "1", Vp1=0.3 V is satisfied and Lo is output as Vout. In this manner, data can be read from the memory cell.

According to the aforementioned method, output is read by a voltage level by utilizing a resistance value difference of the memory element 30 and resistive division of resistance. It is needless to say that a reading method is not limited to this method. For example, a difference in a current value may be utilized for reading data instead of utilizing a difference in electric resistance. Further, in the case where electric characteristics of the memory cell have diode characteristics that a threshold voltage is different between data "0" and "1", the difference in the threshold voltage may be utilized for reading data as well.

Embodiment 1

In this embodiment, description is made on a result of an experiment to check I-V characteristics of a memory element formed over a substrate to which data is written by an electrical effect. The memory element is formed by stacking a first conductive layer, a first organic compound layer, a second organic compound layer, and a second conductive layer in this order. The first conductive layer is formed of a compound of silicon oxide and indium tin oxide (sometimes abbreviated as ITSO), the first organic compound layer is formed of 4,4'-bis(N-[3-methylphenyl]-N-phenyl-amino)biphenyl (sometimes abbreviated as TPD), the second organic compound layer is formed of 4,4'-bis(N-[1-naphthyl]-N-phenyl-amino)-biphenyl (sometimes abbreviated as α-NPD), and the second conductive layer is formed of aluminum. The first organic compound layer is formed with a thickness of 10 nm and the second organic compound layer is formed with a thickness of 50 nm.

Figure 16:
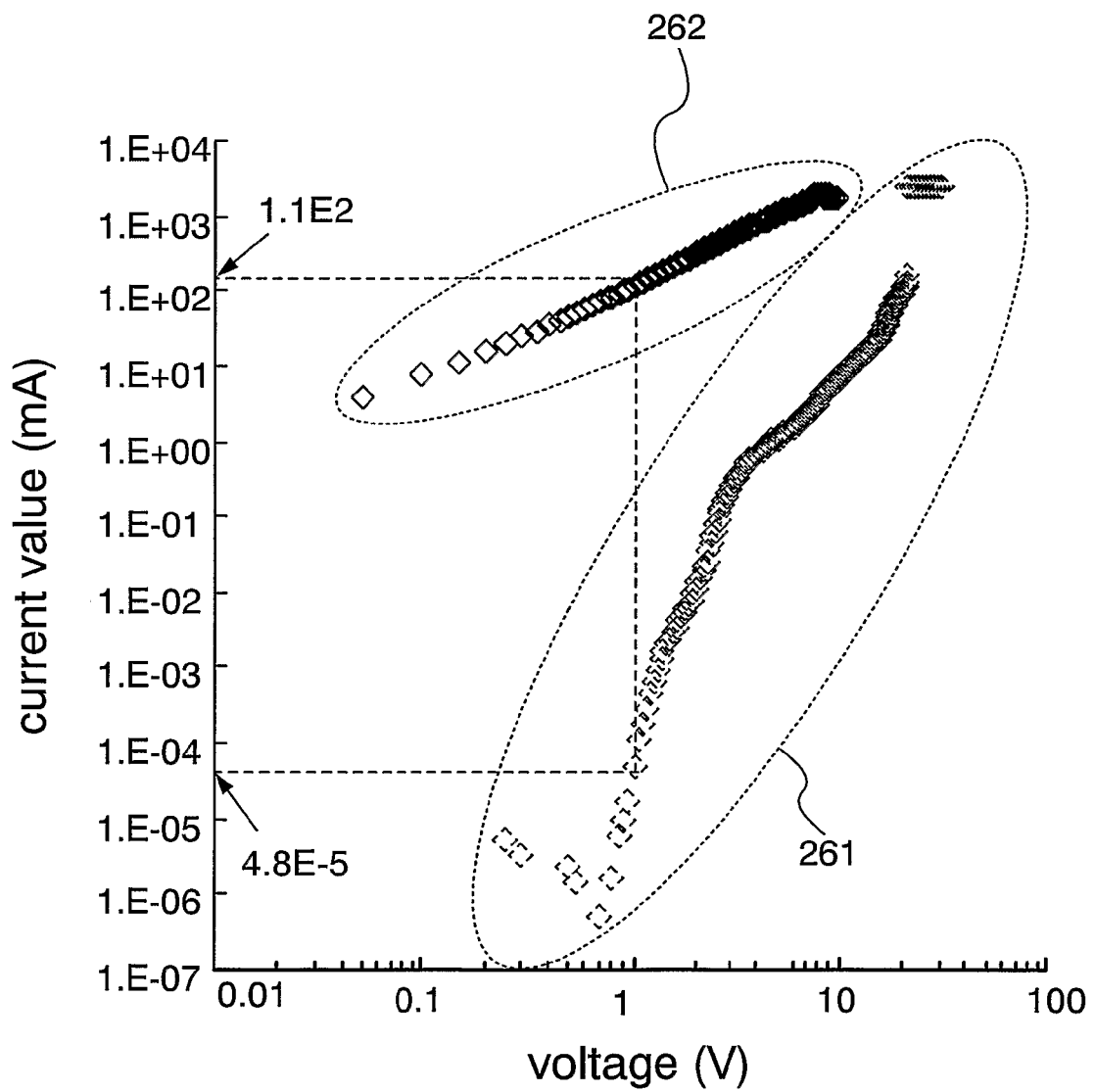
FIG. 16 is a diagram showing I-V characteristics of a memory element.

First, description is made with reference to FIG. 16 on a measurement result of I-V characteristics of the memory element before and after writing data thereto by an electrical effect. In FIG. 16, the abscissa shows a voltage level and the ordinate shows a current value. A plot 261 shows I-V characteristics of the memory element before writing data thereto by an electrical effect and a plot 262 shows I-V characteristics of the same after writing data thereto by an electrical effect. As shown in FIG. 16, there is a large change in the I-V characteristics of the memory element between before and after writing data. When applying a voltage of 1 V, for example, a current value before writing data is $4.8 \times 10^{-5}$ mA while a current value after writing data is $1.1 \times 10^2$ mA, and thus there is a 7-order change in the current value between before and after writing data. In this manner, there is a change in resistance of the memory element between before and after writing data. The memory element can function as a memory circuit by reading this change in resistance from a voltage level or a current value.

Next, description is made with reference to FIGS. 22A to 24B on results of an experiment to check I-V characteristics of a memory element when data is written by an electrical effect in samples 1 to 6 each of which has a memory element formed over a substrate. Here, data is written by applying a voltage to an organic memory element so as to be short-circuited. In FIGS. 22A to 24B, the abscissa shows a voltage level, the ordinate shows a current density value, a plot shown by circles shows I-V characteristics of the memory element before writing data thereto by an electrical effect, and a plot shown by squares shows I-V characteristics of the memory element after writing data thereto by an electrical effect. Further, a size of each of the samples 1 to 6 is 2×2 mm.

Figure 22A:
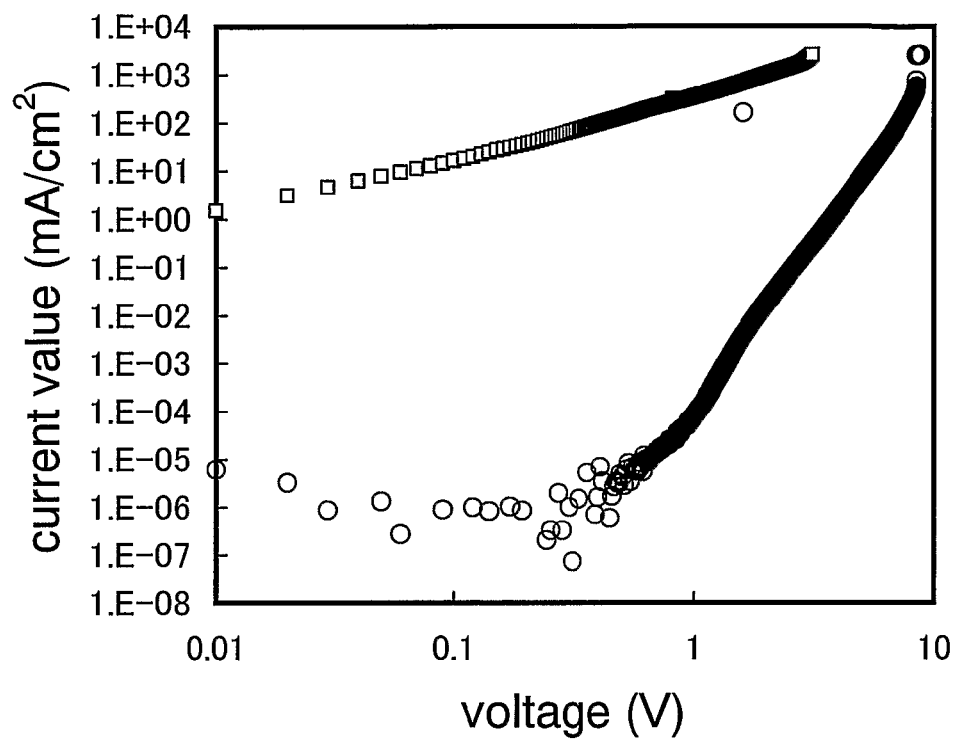
FIGS. 22A and 22B are diagrams each of which shows I-V characteristics of a memory element.
Figure 25A:
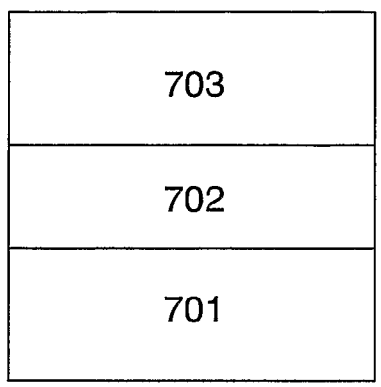
FIGS. 25A to 25F are diagrams each of which shows a structure of a memory element.

As the sample 1, an element formed by stacking a first conductive layer 701, a first organic compound layer 702, and a second conductive layer 703 in this order is shown in FIG. 25A. The first conductive layer 701 is formed of ITSO, the first organic compound layer 702 is formed of TPD, and the second conductive layer 703 is formed of aluminum. The first organic compound layer is formed with a thickness of 50 nm. The I-V characteristics of the sample 1 are shown in FIG. 22A.

Figure 22B:
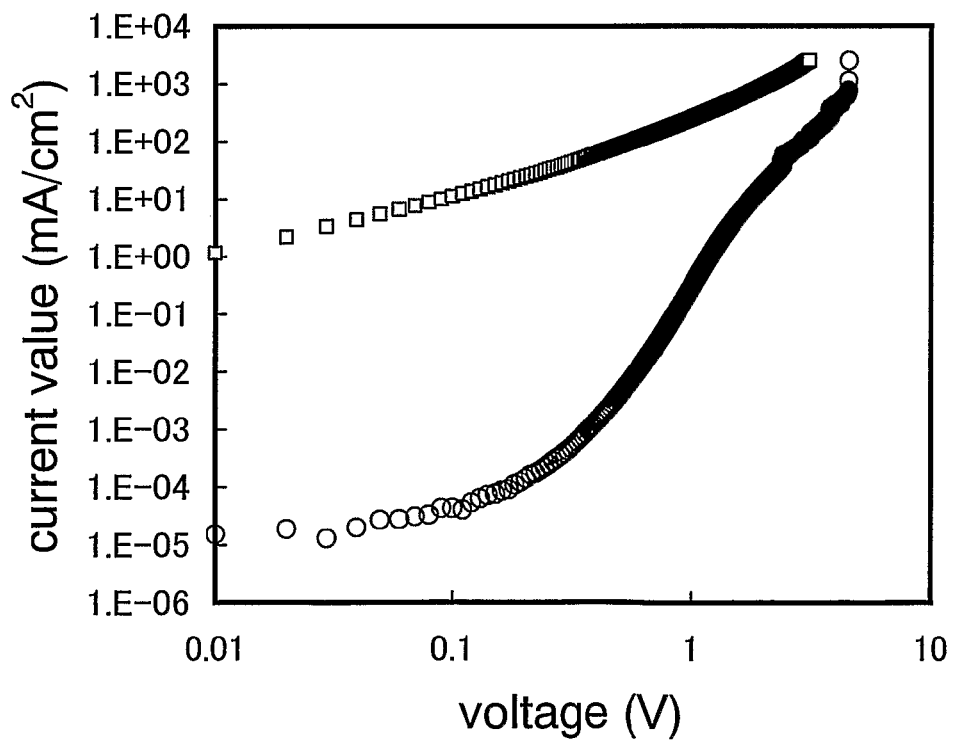
Figure 25B:
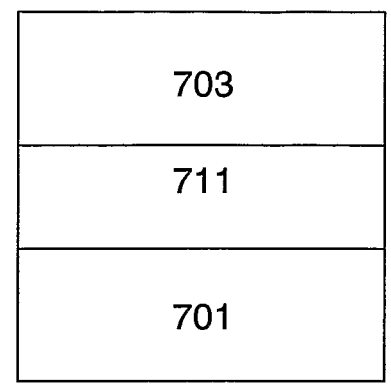

As the sample 2, an element formed by stacking the first conductive layer 701, a first organic compound layer 711, and the second conductive layer 703 in this order is shown in FIG. 25B. The first conductive layer is formed of ITSO, the first organic compound layer is formed of TPD to which 2,3,5,6-tetrafluoro-7,7,8,8-tetracyanoquinodimethane (sometimes abbreviated as F4-TCNQ) is added, and the second conductive layer is formed of aluminum. The first organic compound layer is formed with a thickness of 50 nm by adding 0.01 wt % of F4-TCNQ. The I-V characteristics of the sample 2 are shown in FIG. 22B.

Figure 23A:
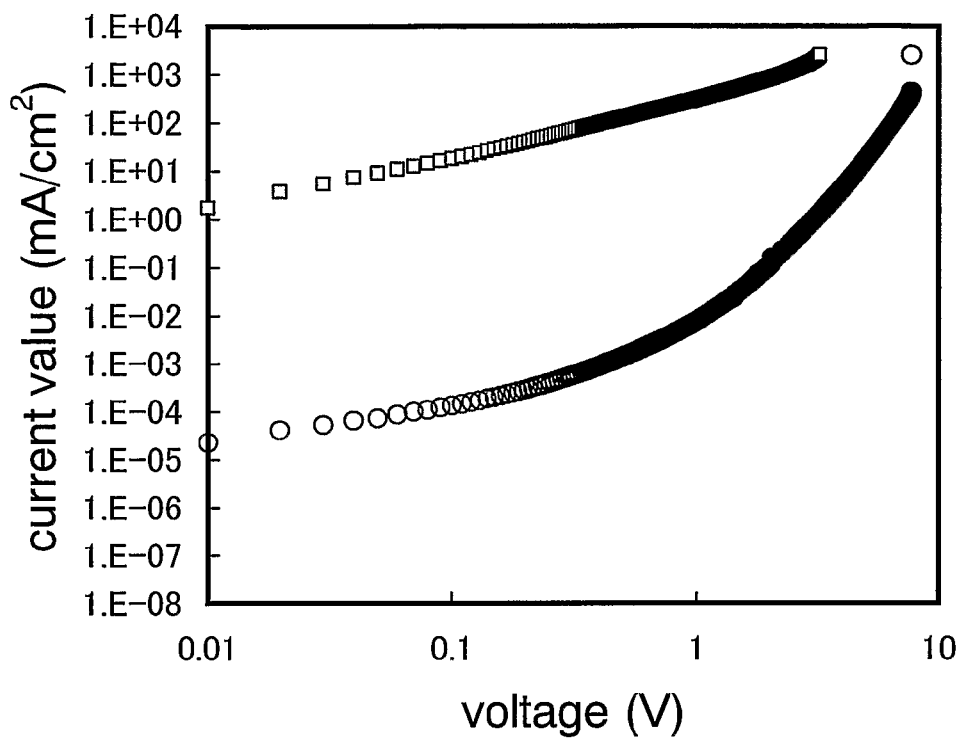
FIGS. 23A and 23B are diagrams each of which shows I-V characteristics of a memory element.
Figure 25C:
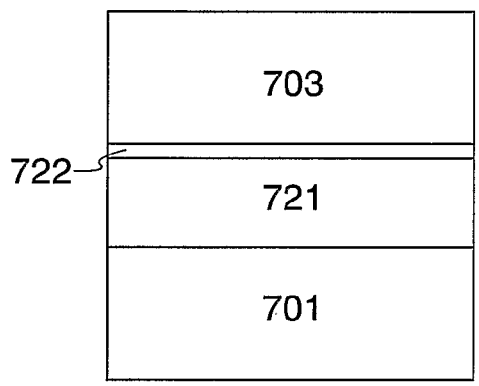

As the sample 3, an element formed by stacking the first conductive layer 701, a first organic compound layer 721, a second organic compound layer 722, and the second conductive layer 703 in this order is shown in FIG. 25C. The first conductive layer is formed of ITSO, the first organic compound layer is formed of TPD, the second organic compound layer is formed of F4-TCNQ, and the second conductive layer is formed of aluminum. TPD as the first organic compound layer is formed with a thickness of 50 nm and F4-TCNQ as the second organic compound layer is formed with a thickness of 1 nm. The I-V characteristics of the sample 3 are shown in FIG. 23A.

Figure 23B:
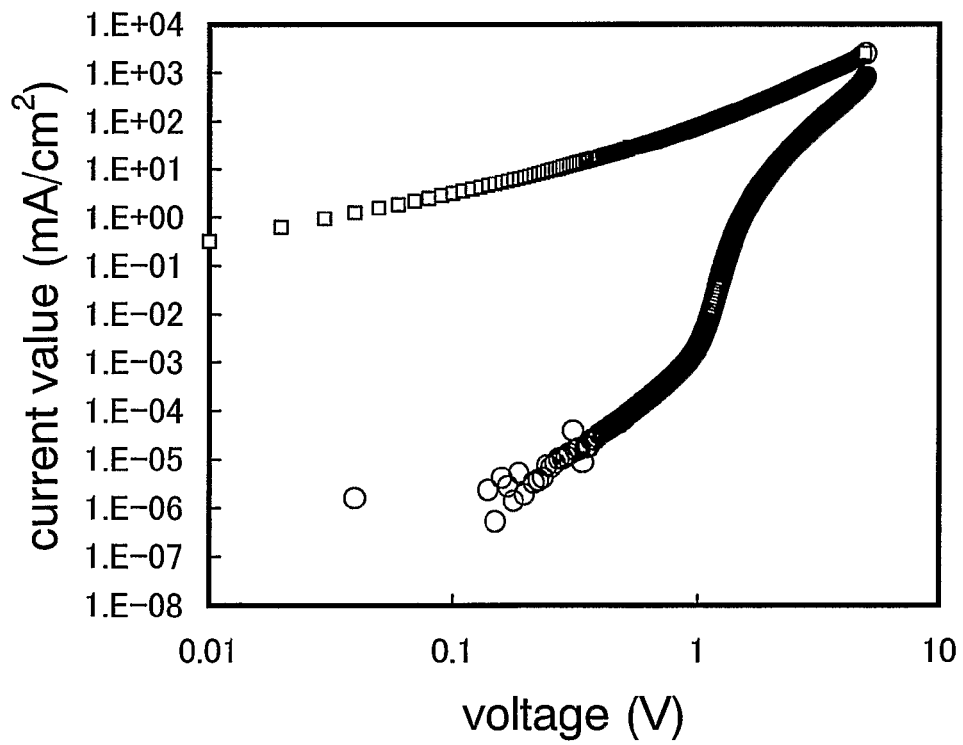
Figure 25D:
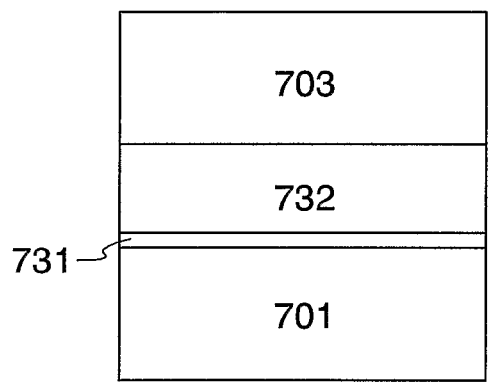

As the sample 4, an element formed by stacking the first conductive layer 701, a first organic compound layer 731, a second organic compound layer 732, and the second conductive layer 703 in this order is shown in FIG. 25D. The first conductive layer is formed of ITSO, the first organic compound layer is formed of F4-TCNQ, the second organic compound layer is formed of TPD, and the second conductive layer is formed of aluminum. F4-TCNQ as the first organic compound layer is formed with a thickness of 1 nm and TPD as the second organic compound layer is formed with a thickness of 50 nm. The I-V characteristics of the sample 4 are shown in FIG. 23B.

Figure 24A:
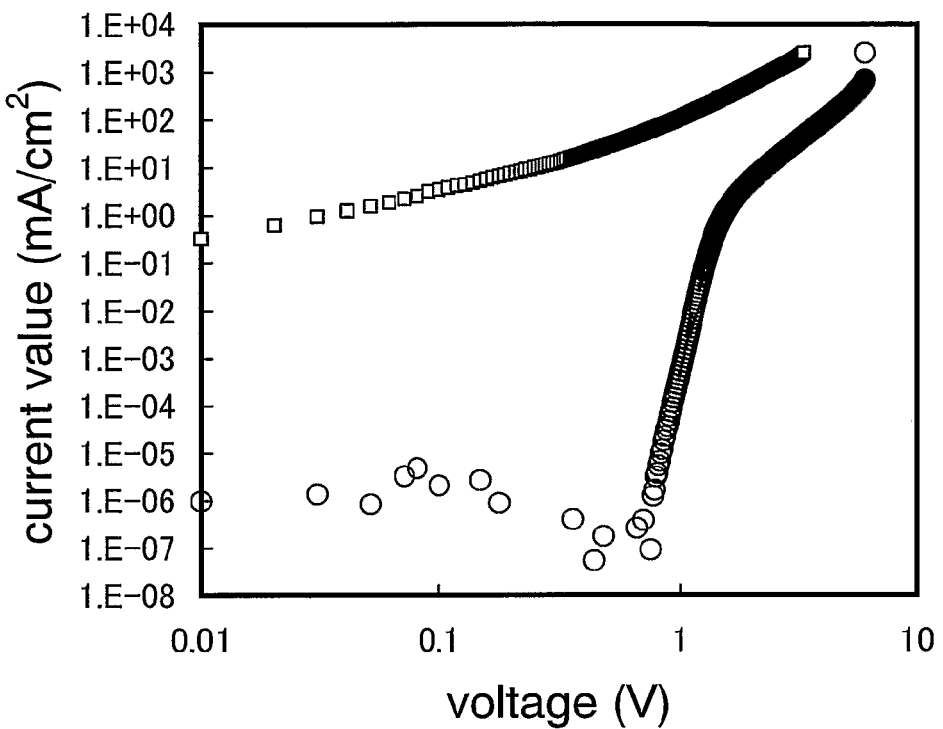
FIGS. 24A and 24B are diagrams each of which shows I-V characteristics of a memory element.
Figure 25E:
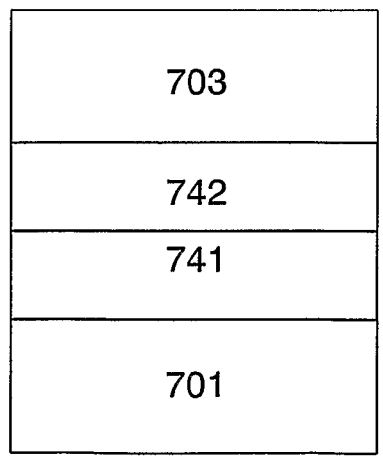

As the sample 5, an element formed by stacking the first conductive layer 701, a first organic compound layer 741, a second organic compound layer 742, and the second conductive layer 703 in this order is shown in FIG. 25E. The first conductive layer is formed of ITSO, the first organic compound layer is formed of TPD to which F4-TCNQ is added, the second organic compound layer is formed of TPD, and the second conductive layer is formed of aluminum. The first organic compound layer is formed with a thickness of 40 nm by adding 0.01 wt % of F4-TCNQ. The second organic compound layer is formed with a thickness of 40 nm. The I-V characteristics of the sample 5 are shown in FIG. 24A.

Figure 24B:
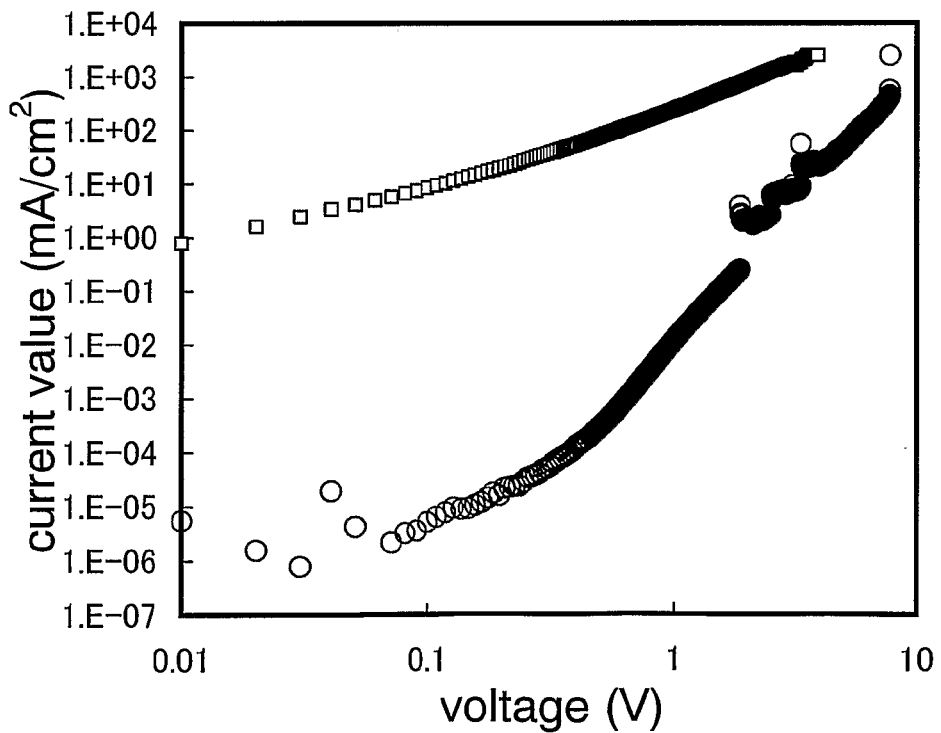
Figure 25F:
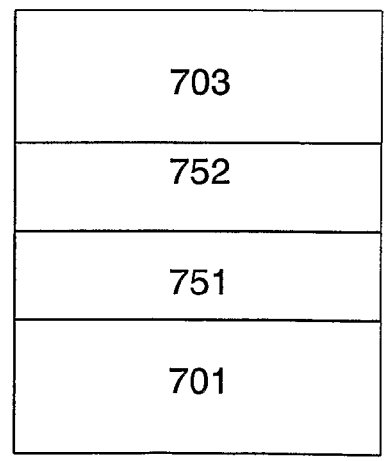

As the sample 6, an element formed by stacking the first conductive layer 701, an organic compound layer 751, a second organic compound layer 752, and the second conductive layer 703 in this order is shown in FIG. 25F. The first conductive layer is formed of ITSO, the first organic compound layer is formed of TPD, the second organic compound layer is formed of TPD to which F4-TCNQ is added, and the second conductive layer is formed of aluminum. The first organic compound layer is formed with a thickness of 40 nm. The second organic compound layer is formed with a thickness of 10 nm by adding 0.01 wt % of F4-TCNQ. The I-V characteristics of the sample 6 are shown in FIG. 24B.

As shown in the results of FIGS. 22A to 24B, there is a large change in the I-V characteristics of the memory element between before and after writing data thereto in the samples 1 to 6. In these sample memory elements, there is a repeatability in a voltage to short-circuit each memory element in an error by 0.1 V or less.

Next, write voltages of the samples 1 to 6 and characteristics before and after writing data are shown in Chart 1.

Chart 1

|  | write voltage (V) | R(1 V) | R(3 V) |
|---|---|---|---|
| sample 1 | 8.4 | 1.9E+07 | 8.4E+03 |
| sample 2 | 4.4 | 8.0E+08 | 2.1E+02 |
| sample 3 | 3.2 | 8.7E+04 | 2.0E+02 |
| sample 4 | 5.0 | 3.7E+04 | 1.0E+01 |
| sample 5 | 6.1 | 2.0E+05 | 5.9E+01 |
| sample 6 | 7.8 | 2.0E+04 | 2.5E+02 |

In Chart 1, a write voltage (V) shows applied voltage levels at which each memory element is short-circuited. The column R(1V) shows a value obtained by dividing a current density of the memory element after writing data by a current density before writing data with an applied voltage at 1 V. Similarly, R(3V) shows a value obtained by dividing a current density of the memory element after writing data by a current density before writing data with an applied voltage at 3 V. That is, changes in the current density of the memory elements after writing data are shown. As compared to the case of applying a voltage at 3 V, in the case of applying a voltage at 1 V, there is a difference as large as $10^4$ or more in the current density of the organic memory element.

In the case of using the aforementioned memory element as a memory circuit, a predetermined voltage level (a voltage level which does not cause a short-circuit) is applied to the memory element every time data is read, thereby resistance is read. Therefore, I-V characteristics of the aforementioned memory element are required not to change even when a read operation is repeated, that is when a predetermined voltage level is repeatedly applied. In view of this, description is made with reference to FIG. 17 on a measurement result of I-V characteristics of the memory element after reading out data. In this experiment, the I-V characteristics of the memory element are measured every time data is read. As data was read five times in total, the measurement of the I-V characteristics of the memory element was carried out five times. The I-V characteristics were measured of a memory element of which resistance changed when data is written by an electrical effect and a memory element of which resistance did not change.

Figure 17:
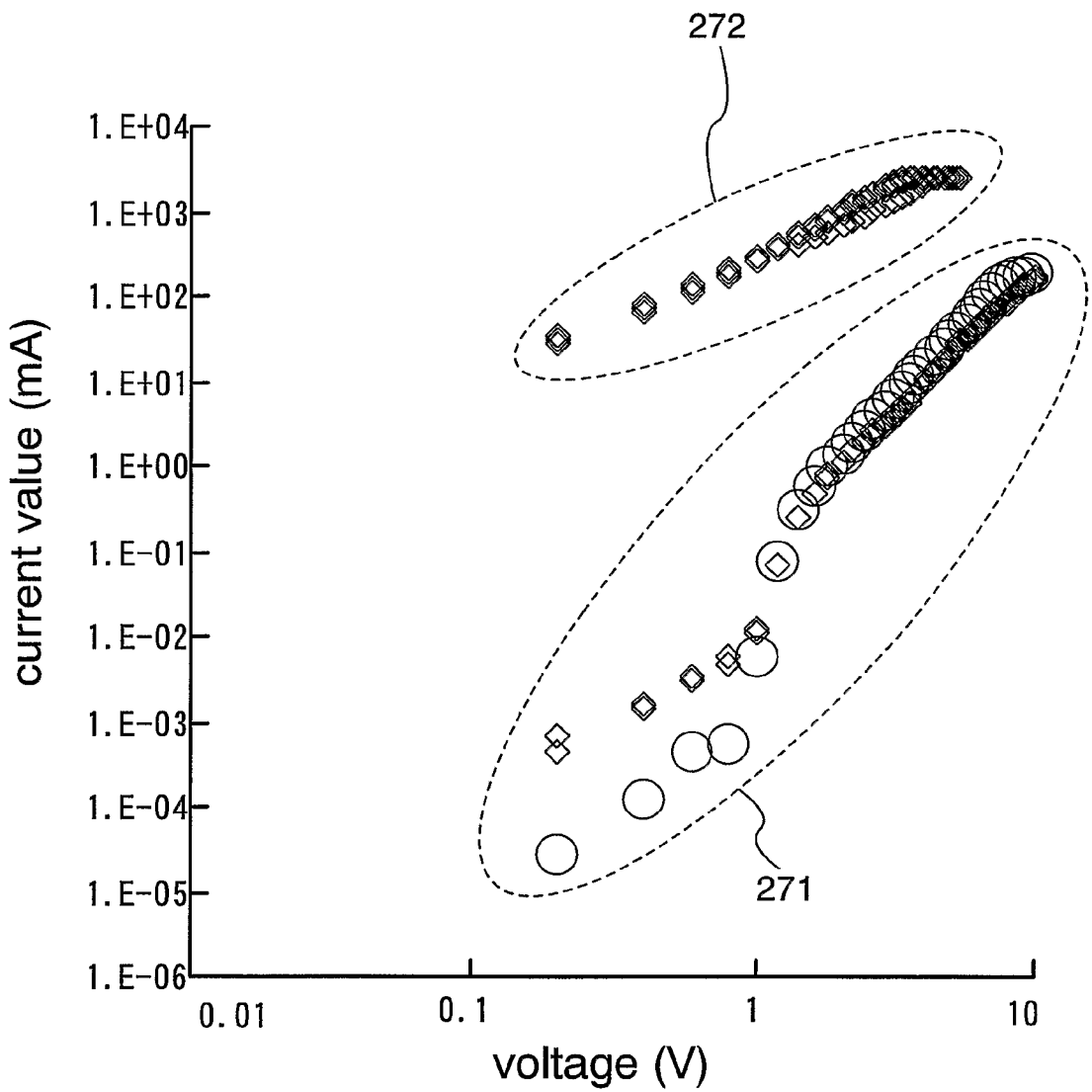
FIG. 17 is a diagram showing I-V characteristics of a memory element.

In FIG. 17, the abscissa shows a voltage level, the ordinate shows a current value, a plot 271 shows I-V characteristics of the memory element of which resistance changed when data is written by an electrical effect and a plot 272 shows I-V characteristics of the memory element of which resistance did not change. As shown by the plot 271, the I-V characteristics of the memory element of which resistance did not change shows favorable repeatability when the voltage level is 1 V or higher. Similarly, as shown by the plot 272, the I-V characteristics of the memory element of which resistance changed show favorable repeatability when the voltage is 1 V or higher. In view of the aforementioned, even when data is repeatedly read a plurality of times, the I-V characteristics of the memory element do not change much, thus providing favorable repeatability. The aforementioned memory element can be used as a memory circuit.

Embodiment 2

Figure 18:
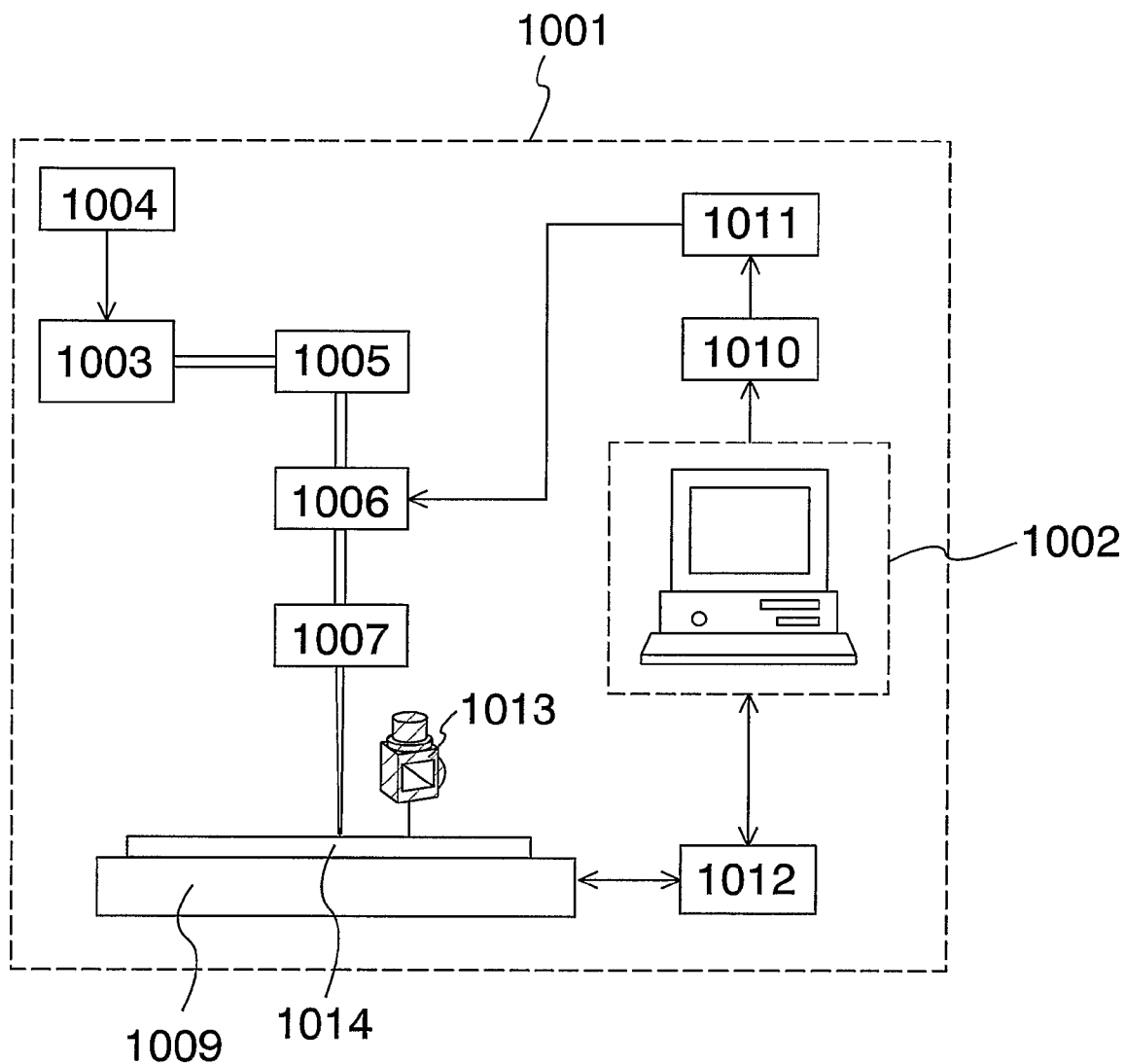
FIG. 18 is a diagram showing a laser irradiation apparatus.

In this embodiment, description is made with reference to FIG. 18 on a laser irradiation apparatus used when writing data to a memory circuit by an optical effect.

A laser irradiation apparatus 1001 includes a computer 1002 which executes various controls of laser irradiation, a laser oscillator 1003 which outputs laser beam, a power source 1004, an optical system 1005 for attenuating the laser beam, an acousto-optic modulator 1006 for modulating the intensity of the laser beam, an optical system 1007 including a lens for reducing the cross section of the laser beam, a mirror for changing the optical path of the laser beam, and the like, a substrate-moving mechanism 1009 including an X-axis stage and a Y-axis stage, a D/A converter 1010 which converts the control data output from the computer 1002, a driver 1011 which controls the acousto-optic modulator 1006 in accordance with the analog voltage output from the D/A converter 1010, and a driver 1012 which outputs a signal to drive the substrate-moving mechanism 1009. An auto-focusing mechanism 1013 for focusing laser light on the irradiated object is also provided (see FIG. 18). The laser oscillator 1003 may be a laser oscillator capable of emitting an ultraviolet, visible, or infrared beam. In specific, the laser oscillator 1003 may be, for example, an Ar excimer laser, a KrF excimer laser, a XeCl excimer laser, or a Xe excimer laser. Moreover, a gas laser oscillator such as a He laser, a He—Cd laser, an ArF laser, a He—Ne laser, or a HF laser can be used. In addition, a solid-state laser oscillator using a crystal such as YAG, $GdVO_4$, $YVO_4$, YLF, or $YAlO_3$ each of which is doped with Cr, Nd, Er, Ho, Ce, Co, Ti, or Tm can be used. Furthermore, a semiconductor laser oscillator such as a GaN laser, a GaAs laser, a GaAlAs laser, or an InGaAsP laser can be used.

Next, operations of the laser irradiation device 1001 having the aforementioned structure are described. When a substrate 1014 is mounted over the substrate-moving mechanism 1009, the computer 1002 detects a position of a memory element to be irradiated with laser light using a camera (not shown). Subsequently, the computer 1002 produces motion data for moving the substrate-moving mechanism 1009 based on the detected positional data. Then, after the optical system 1005 attenuates the laser beam emitted from the laser oscillator 1003, the acousto-optic modulator 1006 controls the amount of the light emission so as to be the predetermined amount. Meanwhile, the laser beam emitted from the acousto-optic modulator 1006 passes through the optical system 1007 so that the optical path and the beam spot shape of the laser beam are changed. After the laser beam is condensed by the lens, the substrate 1014 is irradiated with the laser beam. Here, the substrate-moving mechanism 1009 is controlled so as to move in the X-direction and the Y-direction based on the motion data produced by the computer 1002. As a result, a predetermined region is irradiated with the laser beam, and the energy density of the laser beam is converted into heat energy and the memory element provided over the substrate 1014 is selectively irradiated with the laser beam. In the aforementioned description, laser light irradiation is carried out by moving the substrate-moving mechanism 1009, however, the laser beam may be moved in the X-direction and the Y-direction by controlling the optical system 1007.

In the case where the invention to which data is written by laser light irradiation using a laser irradiation apparatus as described above is incorporated in a reader/writer, data can be easily written. Accordingly, a large amount of data can be written in a short time.

Embodiment 3

Figure 19A:
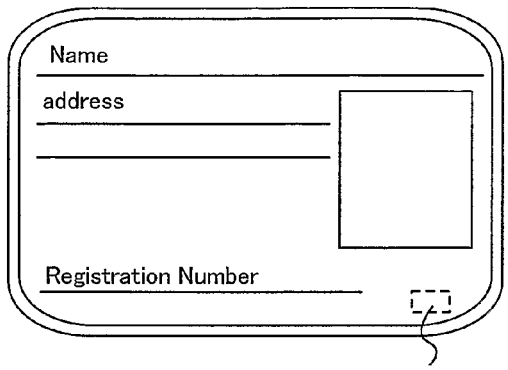
FIGS. 19A to 19E are views each of which shows an application of a semiconductor device of the invention.
Figure 19B:
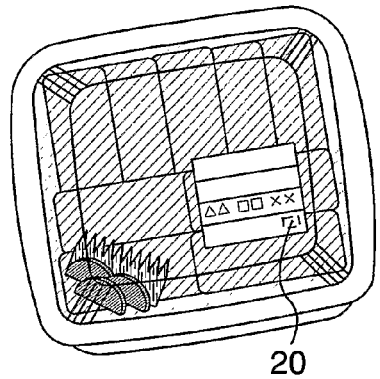
Figure 19C:
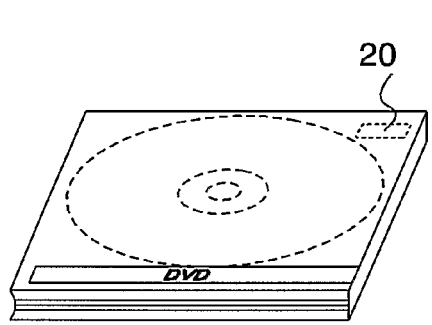
Figure 19D:
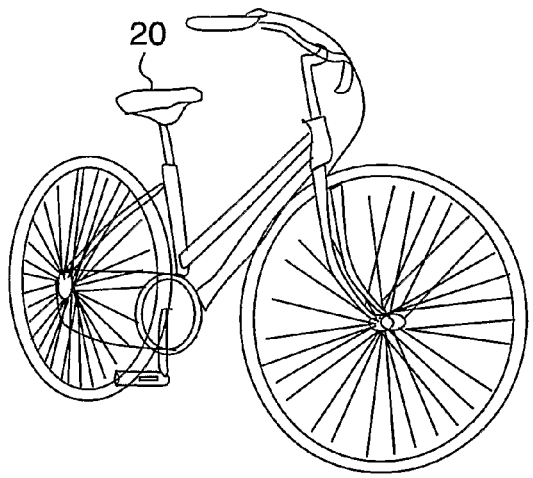
Figure 19E:
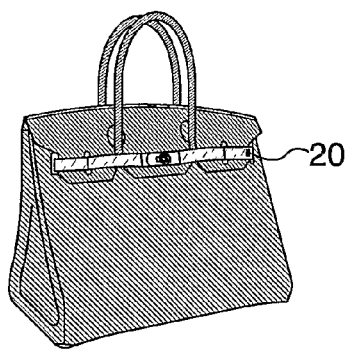

The application of the semiconductor device is quite wide. Specific examples of the application are described below. The semiconductor device 20 of the invention can be applied to paper money, coins, securities, certificates, bearer bonds (such as a driver's license and a residence card, FIG. 19A), packages (such as a wrapping paper and a plastic bottle, FIG. 19B), recording media (such as DVD software and a video tape, FIG. 19C), vehicles (such as a bicycle, FIG. 19D), personal items (such as a bag and glasses, FIG. 19E), food products, clothes, commodities, electronic devices and the like. Electronic devices mean a liquid crystal display device, an EL display device, a TV set (also simply referred to as a TV, a TV receiver, a television receiver), a mobile phone and the like.

The semiconductor device 20 of the invention is fixed to an object by mounting the device onto a printed substrate, attaching the device to the surface, or implanting the device inside the object. For example, if the object is a book, the device is fixed to the book by implanting the device inside the paper, and if the object is a package made of an organic resin, the device is fixed to the package by implanting the device inside the organic resin. Since the semiconductor device 20 of the invention is small, thin, and lightweight, the design quality is not degraded even after the device is fixed to an object. By providing the semiconductor device 20 of the invention to a paper money, coins, securities, certificates, bearer bonds, and the like, an identification function can be provided, thereby preventing the forgery. Moreover, when the semiconductor device 20 of the invention is provided in packages, recording media, personal items, food products, clothes, commodities, electronic devices, and the like, a system such as an inspection system becomes more efficient.

Figure 20:
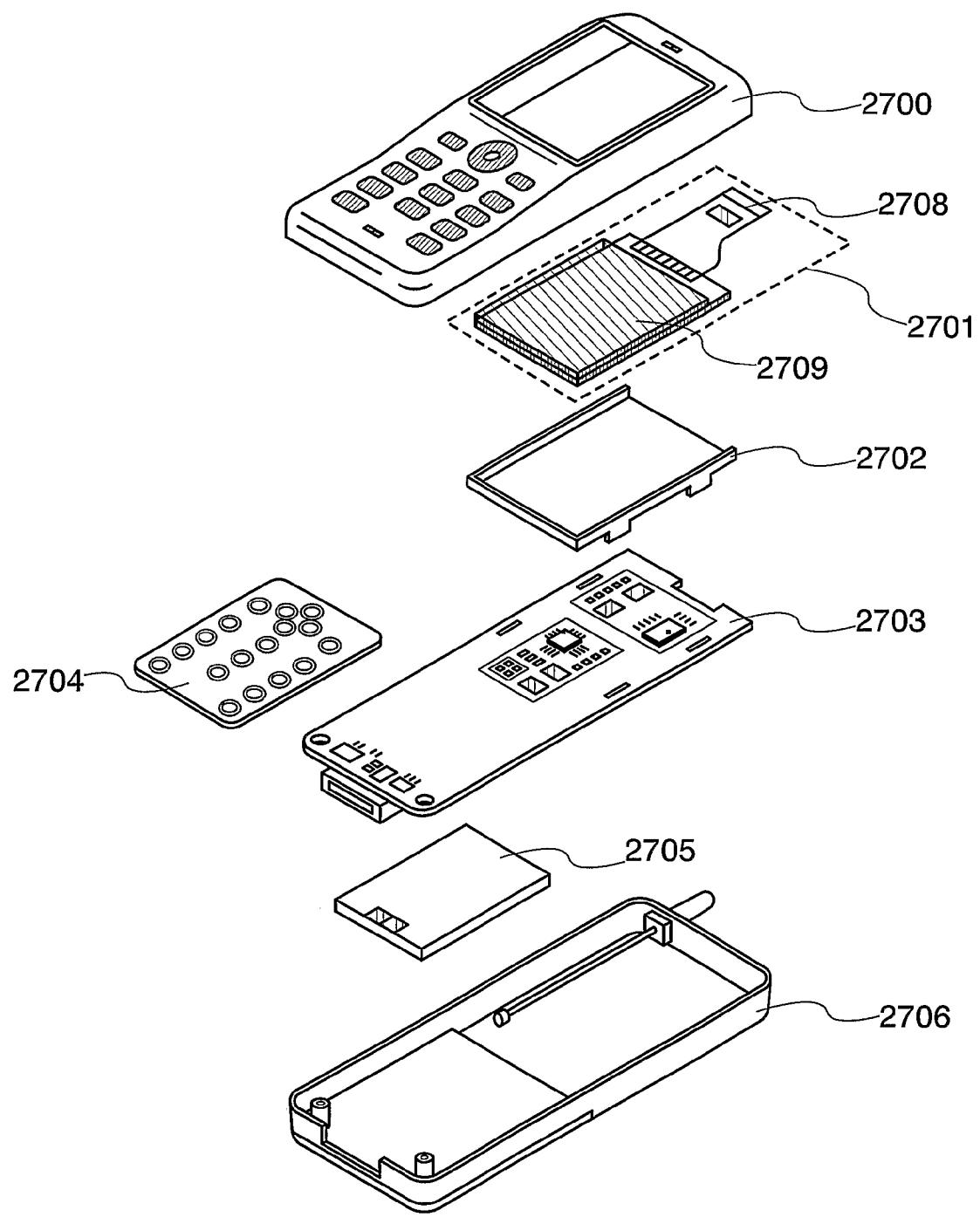
FIG. 20 is a view showing an electronic device using a semiconductor device of the invention.

Next, a mode of the electronic device where the semiconductor device of the invention is mounted is described with reference to the drawing. The electronic device shown here is a mobile phone including cases 2700 and 2706, a panel 2701, a housing 2702, a printed wiring substrate 2703, operating buttons 2704, a battery 2705, and the like (see FIG. 20). The panel 2701 is detachably incorporated in the housing 2702. The housing 2702 is fitted into the printed wiring substrate 2703. The shape and dimension of the housing 2702 are appropriately changed in accordance with the electronic device where the panel 2701 is to be incorporated. Over the printed wiring substrate 2703, a plurality of packaged semiconductor devices are mounted and the semiconductor device of the invention can be used as one of the plurality of packaged semiconductor devices. Each of the plurality of semiconductor devices mounted over the printed wiring substrate 2703 has any one of functions of a controller, a central processing unit (CPU), a memory, a power source circuit, an audio processing circuit, a transmission/reception circuit, and the like.

The panel 2701 is adhered to the printed wiring substrate 2703 through a connection film 2708. The above panel 2701, the housing 2702, and the printed wiring substrate 2703 are stored in the cases 2700 and 2706 together with the operating buttons 2704 and the battery 2705. A pixel region 2709 in the panel 2701 is provided so as to be observed through an opening window provided in the case 2700.

As described above, the semiconductor device of the invention is small, thin, and lightweight, whereby the limited space in the cases 2700 and 2706 of the electric device can be effectively used.

As the semiconductor device of the invention has a structure in which a layer including a memory element is stacked over a layer including a TFT, a electronic device using a compact semiconductor device can be provided.

A memory circuit included in a semiconductor device of the invention includes a memory element with a simple structure in which an organic compound layer or phase change layer is sandwiched between a pair of conductive layers. Accordingly, an electronic apparatus using an inexpensive semiconductor device can be provided. Further, as high integration can be easily realized, an electronic apparatus using a semiconductor device having a large capacitance memory circuit can be provided.

Data is written to a memory circuit included in the semiconductor device of the invention by an optical effect or an electrical effect. That is, the memory element is a nonvolatile memory element to which data can be additionally written. Accordingly, security can be secured as forgery by rewriting data can be prevented while new data can be additionally written. Therefore, an electronic apparatus using a semiconductor device in which high function and high added value are realized can be provided.

Each of the cases 2700 and 2706 is shown as an example of an exterior shape of the mobile phone. The electronic device of this embodiment can be changed variously in accordance with the function or the application thereof.

Figure 21A:
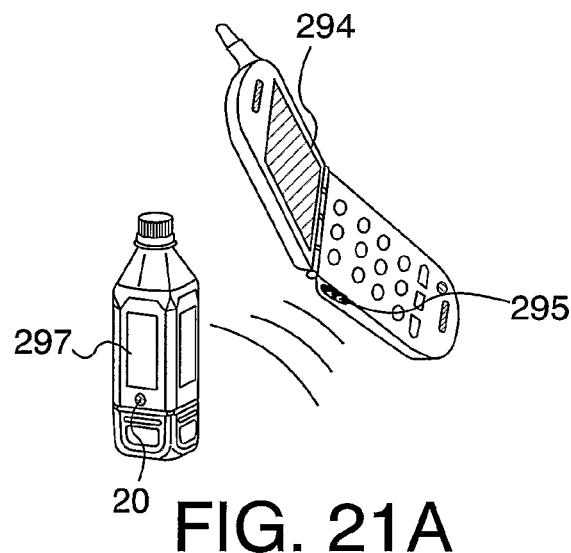
FIGS. 21A and 21B are views each of which shows an application of a semiconductor device of the invention.
Figure 21B:
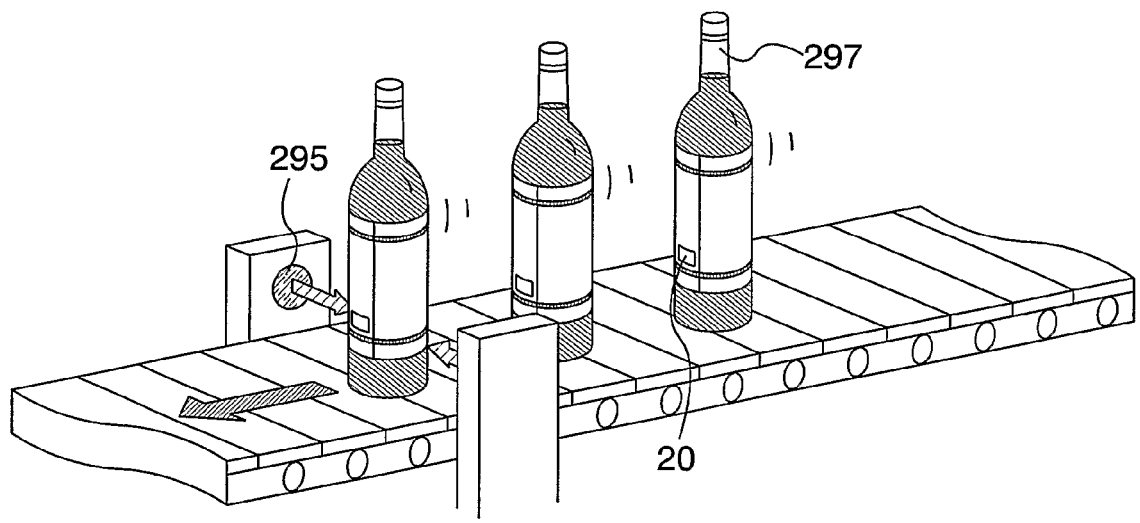

Next, description is made on an example of a system using the semiconductor device of the invention. First, a reader/writer 295 is provided at a side surface of a mobile terminal including a display portion 294 and the semiconductor device 20 of the invention is provided at a side surface of an object 297 (see FIG. 21A). In addition, information on the object 297 such as a material, a production area, or a history of a circulation process is stored in the semiconductor device 20 in advance. Then, the information in the semiconductor device 20 is displayed in the display portion 294 when the semiconductor device 20 is held over the reader/writer 295. Thus, a useful system can be provided. As another example, the reader/writer 295 is provided beside a belt conveyer (see FIG. 21B). Then, a system which can inspect the object 297 quite easily can be provided. In this way, by using the semiconductor device of the invention for management or a circulation system of objects, high functionality and usefulness of the system can be realized.

This application is based on Japanese Patent Applications Ser. No. 2004-328295 and No. 2004-328298 filed in Japan Patent Office on 11th, Nov. 2004., the contents of which are hereby incorporated by reference.

EXPLANATION OF REFERENCE

11: power source circuit, 12: clock generating circuit, 13: data demodulation/modulation circuit, 14: control circuit, 15: interface circuit, 16: memory circuit, 17: data bus, 18: antenna, 19: reader/writer, 20: semiconductor device, 21: memory cell, 22: memory cell array, 23: decoder, 24: decoder, 25: selector, 26: circuit, 27: conductive layer, 28: conductive layer, 29: phase change layer, 30: memory element, 31: transistor, 32: laser irradiation apparatus, 33: insulating layer, 34: insulating layer, 44: semiconductor layer, 46: resistor, 47: differential amplifier, 48: transistor, 49: clocked inverter, 100: substrate, 102: region, 103: region, 104: region, 105: conductive layer, 106: adhesive layer, 109: conductive particle, 111: TFT, 112: TFT, 113: TFT, 114: TFT, 115: insulating layer, 122: insulating layer, 123: insulating layer, 126: insulating layer, 127: insulating layer, 131: conductive layer, 132: phase change layer, 133: conductive layer, 134: memory element, 135: insulating layer, 136: insulating layer, 151: conductive layer, 152: phase change layer, 153: conductive layer, 154: memory element, 155: insulating layer, 156: insulating layer, 201: adhesive layer, 214: conductive layer, 223: conductive layer, 224: conductive layer, 225: conductive layer, 226: conductive layer, 251: conductive layer, 252: phase change layer, 253: conductive layer, 254: memory element, 261:

plot, 262: plot, 271: plot, 272: plot, 294: display portion, 295: reader/writer, 297: object, 301: element forming layer, 302: element forming layer, 303: conductive layer, 305: conductive particle, 306: adhesive layer, 307: insulating layer, 308: conductive particle, 309: conductive particle, 312: TFT, 324: the other, 325: conductive layer, 326: conductive layer, 334: memory element, 361: conductive layer, 352: phase change layer, 353: conductive layer, 354: memory element, 403: conductive layer, 406: adhesive layer, 407: adhesive layer, 412: TFT, 421: conductive layer, 424: conductive layer, 425: conductive layer, 426: conductive layer, 434: memory element, 451: conductive layer, 452: phase change layer, 453: conductive layer, 454: memory element, 511: TFT, 513: adhesive layer, 521: conductive layer, 524: drain wiring, 525: conductive layer, 526: conductive layer, 601: element forming layer, 602: element forming layer, 611: adhesive layer, 615: insulating layer, 622: substrate, 625: conductive layer, 626: conductive material 631: conductive layer, 634: memory element, 651: conductive layer, 652: phase change layer, 653: conductive layer, 654: memory element, 701: conductive layer, 702: organic compound layer, 703: conductive layer, 711: organic compound layer, 721: organic compound layer, 722: organic compound layer, 731: organic compound layer, 732: organic compound layer, 741: organic compound layer, 742: organic compound layer, 751: organic compound layer, 752: organic compound layer, 811: TFT, 825: conductive layer, 826: conductive layer, 834: adhesive layer, 1001: laser irradiation apparatus, 1002: computer, 1003: laser oscillator, 1004: power source, 1005: optical system, 1006: acousto-optic modulator, 1007: optical system, 1009: substrate-moving mechanism, 100a: substrate, 100b: substrate, 1010: D/A converter, 1011: driver, 1012: driver, 1013: auto-focusing mechanism, 1014: substrate, 101a: element forming layer, 101b: element forming layer, 107b: element forming layer, 108b: substrate, 1100: substrate, 1101: peeling layer, 1105: insulating layer, 1107: conductive layer, 1115: sidewall insulating layer, 1119: gate insulating layer, 1127: crystalline semiconductor layer, 1128: crystalline semiconductor layer, 1131: TFT, 1132: thin film transistor, 1133: TFT, 1141: insulating layer, 1142: insulating layer, 1143: contact hole, 1151: contact hole, 1154: conductive layer, 1155: conductive layer, 1159: conductive layer, 1163: insulating layer, 1164: conductive layer, 1165: insulating layer, 1166: phase change layer, 1167: conductive layer, 1168: insulating layer, 1169: memory element, 116a: gate insulating film, 1170: element forming layer, 1171: opening portion, 117a: gate electrode, 1181: substrate, 1182: conductive layer, 1183: substrate, 1189: substrate, 118a: sidewall, 1190: conductive particle, 1191: conductive layer, 119a: drain region, 120a: low concentration impurity region, 121a: channel forming region, 124a: conductive layer, 124b: conductive layer, 124c: conductive layer, 124d: drain wiring, 125a: conductive layer, 125b: conductive layer, 1900: conductive particle, 200a: substrate, 200b: substrate, 201b: element forming layer, 202b: element forming layer, 212a: TFT, 215a: conductive layer, 225a: conductive layer, 225b: conductive layer, 231a: conductive layer, 233a: conductive layer, 234a: memory element, 262b: element forming layer, 2700: housing, 2701: panel, 2702: housing, 2703: printed wiring substrate, 2704: operating buttons, 2705: battery, 2708: connecting film, 2709: pixel region, 3001: substrate, 300b: substrate, 301a: element forming layer, 301b: element forming layer, 302a: element forming layer, 302b: element forming layer, 400a: substrate, 401a: element forming layer, 401b: element forming layer, 402a: element forming layer, 412a: TFT, 431a: conductive layer, 432a: memory element, 433: conductive layer, 434a: memory element, 500a: substrate, 500b: substrate, 501a: element forming layer, 501b: element forming layer, 502a: element forming layer, 502b: element forming layer, 512b: substrate, 600a: substrate, 601a: element forming layer, 601b: element forming layer, 602a: element forming layer, 602b: element forming layer, 621a: substrate, 621b: insulating layer, 800a: substrate, 1123a: N-type impurity region, 1124a: N-type impurity region, 1182a: adhesive, 1182b: conductive layer, 1183a: substrate, 1183b: substrate

The invention claimed is:

1. A semiconductor device comprising:
an element forming layer;
a substrate provided with a memory element and a conductive layer which functions as an antenna; and
an adhesive layer which adheres the element forming layer and the substrate and contains a conductive particle,
wherein the element forming layer includes a first transistor and a second transistor provided over an insulating layer, a conductive layer which functions as a source wiring or a drain wiring of the first transistor,
wherein the memory element a includes a first conductive layer, an organic compound layer or a phase change layer, and a second conductive layer laminated in this order and the first conductive layer is electrically connected with the source wiring or the drain wiring of the second transistor through the conductive particle, and
wherein the conductive layer which functions as the antenna and the conductive layer which functions as the source wiring or the drain wiring of the first transistor are electrically connected through the conductive particle.

2. A semiconductor device comprising:
a first element forming layer;
a second element forming layer; and
an adhesive layer which adheres the first element forming layer and the second element forming layer and contains a conductive particle,
wherein the first element forming layer includes a first transistor and a second transistor provided over an insulating layer, a first conductive layer which functions as a source wiring or a drain wiring of the first transistor, and a second conductive layer which functions as a source wiring or a drain wiring of the second transistor;
wherein the second element forming layer includes a memory element comprising a third conductive layer, an organic compound layer or a phase change layer, and a fourth conductive layer laminated in this order, a fifth conductive layer which functions as an antenna, a third transistor which overlaps the memory element, a sixth conductive layer which functions as one of a source wiring or drain wiring of the third transistor, and a seventh conductive layer which functions as the other of the source wiring or drain wiring of the third transistor;
wherein the seventh conductive layer is electrically connected to the fourth conductive layer;
wherein the fifth conductive layer which functions as the antenna and the first conductive layer which functions as the source wiring or the drain wiring of the first transistor are electrically connected through the conductive particle, and
wherein the second conductive layer which functions as the source wiring or the drain wiring of the second transistor and the sixth conductive layer which functions as one of the source wiring or drain wiring of the third transistor are electrically connected through the conductive particle.

3. A semiconductor device comprising:
a first element forming layer;
a second element forming layer; and
a conductive layer by which the first element forming layer and the second element forming layer are adhered and which includes an adhesive layer containing a conductive particle,
wherein the first element forming layer includes:
a first transistor and a second transistor provided over an insulating layer;
an interlayer insulating layer which covers the first transistor and the second transistor; and
a first conductive layer which functions as a source wiring or a drain wiring of the first transistor and is connected to a source region or a drain region of the first transistor through a first opening portion provided in the interlayer insulating layer and is exposed on a back surface of the first element forming layer through a second opening portion provided in the insulating layer and the interlayer insulating layer;
a second conductive layer which functions as a source wiring or a drain wiring of the second transistor and is connected to a source region or a drain region of the second transistor through a third opening portion provided in the interlayer insulating layer and is exposed on the back surface of the first element forming layer through a fourth opening portion provided in the insulating layer and the interlayer insulating layer;
wherein the second element forming layer includes a third conductive layer which functions as an antenna and a memory element comprising a fourth conductive layer, an organic compound layer or a phase change layer, and a fifth conductive layer laminated in this order;
wherein the fourth conductive layer of the memory element and the exposed portion of the first conductive layer which functions as the source wiring or the drain wiring of the first transistor are electrically connected through at least one of the conductive particles of the adhesive layer; and
wherein the third conductive layer which functions as the antenna and the exposed portion of the second conductive layer which functions as the source wiring or the drain wiring of the second transistor are electrically connected through at least one of the conductive particles of the adhesive layer.

4. The semiconductor device according to any one of claims 1, 2, and 3,
wherein a transistor, the first transistor, or the second transistor is a thin film transistor.

5. The semiconductor device according to any one of claims 1, 2, and 3,
wherein a transistor, the first transistor, or the second transistor is an organic semiconductor transistor.

6. The semiconductor device according to any one of claims 1, 2, and 3,
wherein the insulating layer is a silicon oxide layer.

7. The semiconductor device according to any one of claims 1, 2, and 3,
wherein electrical resistance of the memory element changes by an optical effect.

8. The semiconductor device according to any one of claims 1, 2, and 3,
wherein electrical resistance of the memory element changes by an electrical effect.

9. The semiconductor device according to any one of claims 1, 2, and 3,
wherein the organic compound layer is formed of a conjugated polymer material doped with a photoacid generator.

10. The semiconductor device according to any one of claims 1, 2, and 3,
wherein the organic compound layer is formed of an electron transporting material or a hole transporting material.

11. The semiconductor device according to any one of claims 1, 2, and 3,
wherein the phase change layer includes a material which reversibly changes between a crystalline state and an amorphous state.

12. The semiconductor device according to any one of claims 1, 2, and 3,
wherein the phase change layer is formed of a material containing a plurality selected from germanium, tellurium, antimony, sulphur, tin, gold, gallium, selenium, indium, thallium, cobalt, or silver.

13. The semiconductor device according to any one of claims 1, 2, and 3,
wherein the phase change layer includes a material which reversibly changes between a first crystalline state and a second crystalline state.

14. The semiconductor device according to any one of claims 1, 2, and 3,
wherein the phase change layer is formed of a material containing a plurality selected from silver, zinc, copper, aluminum, nickel, indium, antimony, selenium, or tellurium.

15. The semiconductor device according to any one of claims 1, 2, and 3,
wherein the phase change layer includes a material which changes only from a crystalline state to an amorphous state.

16. The semiconductor device according to any one of claims 1, 2, and 3,
wherein the phase change layer is formed of a material containing a plurality selected from tellurium, tellurium oxide, antimony, selenium, or bismuth.

* * * * *

UNITED STATES PATENT AND TRADEMARK OFFICE
CERTIFICATE OF CORRECTION

PATENT NO.        : 7,816,721 B2                                              Page 1 of 1
APPLICATION NO.   : 11/632049
DATED             : October 19, 2010
INVENTOR(S)       : Shunpei Yamazaki et al.

It is certified that error appears in the above-identified patent and that said Letters Patent is hereby corrected as shown below:

On the face of the patent, at item (86), please change "PCT/JP2005/002983" to --PCT/JP2005/020983--; and at column 54, line 25, please change "memory element a includes" to --memory element includes--.

Signed and Sealed this
First Day of March, 2011

David J. Kappos
*Director of the United States Patent and Trademark Office*